(12) United States Patent
Goddard et al.

(10) Patent No.: US 8,670,476 B2
(45) Date of Patent: Mar. 11, 2014

(54) DISTRIBUTED REFLECTOR IN A MICRORING RESONATOR

(75) Inventors: Lynford L. Goddard, Champaign, IL (US); Young Mo Kang, Urbana, IL (US); Amir Arbabi, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 153 days.

(21) Appl. No.: 13/232,742

(22) Filed: Sep. 14, 2011

(65) Prior Publication Data

US 2012/0063484 A1 Mar. 15, 2012

Related U.S. Application Data

(60) Provisional application No. 61/382,537, filed on Sep. 14, 2010.

(51) Int. Cl.
*H01S 3/03* (2006.01)

(52) U.S. Cl.
USPC .................. 372/64; 372/92; 372/94; 372/102

(58) Field of Classification Search
USPC ............................................. 372/64, 92, 94
See application file for complete search history.

(56) References Cited

U.S. PATENT DOCUMENTS

| | | | |
|---|---|---|---|
| 2003/0021302 A1* | 1/2003 | Grudinin et al. ................... | 372/6 |
| 2009/0046748 A1* | 2/2009 | Kato .............................. | 372/20 |
| 2010/0159706 A1 | 6/2010 | Qiu et al. | |

OTHER PUBLICATIONS

Arbabi et al., "Realization of Small Footprint Microring Reflections"; OSA/CLEO 2011; University of Illinois at Urbana-Champaign, Illinois.
Arbabi et al., "Realization of a Narrowband Single Wavelength Microring Mirror"; American Institute of Physics; Aug. 30, 2011; University of Illinois at Urbana-Champaign, Illinois.
Arbabi et al., "Analysis and Design of a Microring Iniine Single Wavelength Reflector"; © 2010 OSA/FIO/LS 2010.
Arbabi et al., "Cylindrical Coordinates Coupled Mode Theory"; IEEE Journal of Quantum Electronics, vol. 46, No. 12, Dec. 2010.
Kang et al. "Engineering the spectral reflectance of microring resonators with integrated reflective elements"; Optics Express 16813, vol. 18, No. 16, Aug. 2, 2010.
Morichetti, et al., "Coherent backscattering in optical microring resonators"; Applied Physics Letter 96, 081112, 2010.
Young Mo Kang; "Semi-Analytic Simulations of Microring Resonators with Scattering Elements"; Thesis for Masters Degree, © 2010.
Young Mo Kang and Lynford L. Goddard; "Semi-Analytical Modeling of Microring Resonators with Distributed Bragg Reflectors"; University of Illinois at Urbana-Champaign, Illinois NUSOD 2009.
Zhu et al., "On-Chip single nonparticle detection and sizing by mode splitting in an ultrahigh-Q microresontor"; Nature Photonics, vol. 4, Jan. 2010 (Published online: Dec. 13, 2009).

(Continued)

*Primary Examiner* — Dung Nguyen
(74) *Attorney, Agent, or Firm* — Brinks Gilson Lione

(57) ABSTRACT

A component having a microring resonator and grating, coupled to a waveguide is described. By selection of the grating period, and other parameters such as the grating-waveguide coupling coefficient, an efficient filter may be designed and constructed. The component may be used in passive devices such as add-drop multiplexers or sensors, or in active devices such as lasers. Designs having essentially no response sidelobes, very narrow effective bandwidths, and fast filter roll-offs may permit compact devices to be produced, when compared with typical distributed sampled Bragg grating structures.

23 Claims, 49 Drawing Sheets

(56) References Cited

OTHER PUBLICATIONS

Kang et al., "A microring resonator with an integrated Bragg grating: a compact replacement for a sampled grating distributed Bragg reflector"; Opt Quant Electron, 2009, vol. 41 pp. 689-697.
Alexandropoulos et al., "Spectral Properties of Active Racetrack Semiconductor Structures With Intracavity Reflections"; IEEE Journal of Selected Topics in Quantum Electronics, vol. 15, No. 5, Sep./Oct. 2009.
Sun et al., "A Reflective Microring Notch Filter and Sensor"; Optics Express 10731, vol. 17, No. 13; Jun. 22, 2009.
Wang et al., "Modeling of quasi-gratin sidewall corrugation in SOI microring add-drop filters"; Optics Communications 282 pp. 3464-3467, 2009.
Xu et al., "Folded cavity SOI microring sensors for high sensitivity and real time measurement of biomolecular binding"; Optics Express 15137, vol. 16, No. 19, Sep. 15, 2008.
Prabhu et al., "Generalized parallel-cascaded microring networks for spectral engineering applications"; © Optical Society of America, vol. 25, No. 9, Sep. 2008.
Zhang et al., "Resonance-spitting and enhanced notch depth is SOI ring resonators with mutual mode coupling"; Optics Express 4621, vol. 16, No. 7, Mar. 31, 2008.
Vasquez et al., "Tunable, narrow-band, grating-assisted microring reflectors"; Universidad Carlos III, Legends 28911, Madrid, Spain and Concordia University, Montrel QC, Canada, Jun. 21, 2008.
Vien Van, "Dual-Mode Microring Reflection Filters"; Journal of Lightwave Technology, vol. 25, No. 10, Oct. 2007.
Mark Oxborrow, "Traceable 2-D Finite-Element simulation of the Whispering-Gallery Modes of Axisymmetric Electromagnetic Resonators"; IEEE Transactions on Microwave Theory and Techniques, vol. 55, No. 6, Jun. 2007.
Goldring et al., "Highly dispersive micro-ring resonator based on one dimensional photonic crystal waveguide design and analysis"; Optics Express 3156, vol. 15, No. 6, Mar. 19, 2007.
Chung et al., "Reflection Properties of Coupled-Ring Reflectors"; Journal of Lightwave Technology, vol. 24, No. 4, Apr. 4, 2006.
Scheuer et al., "All optically tunable wavelength-selective reflector consisting of coupled polymeric microring resonators"; American Institute of Physics.
Otto Schweib, "Band-Limited Optical Mirrors Based on Ring Resonators: Analysis and Design"; Journal of Lightwave Technology, vol. 23, No. 11, Nov. 2005.
Landobasa et al., "Matrix Analysis of 2-D Microresonator Lattice Optical Filters"; IEEE Journal of Quantum Electronics, vol. 41, No. 11, Nov. 11, 2005.
Chremmos et al., "Reflective Properties of Double-Ring Resonator System Coupled to a Waveguide"; IEEE Photonics Technology Letters, vol. 17, No. 10, Oct. 2005.
Xu et al., "Micrometre-scale silicon electro-optic modulator"; Nature Publishing Group, vol. 435, May 2005.
Paloczi et al., Compact Microring-Based Wavelength-Selective Inline Optical Reflector, IEEE Photonics Technology Letters, vol. 17, No. 2, Feb. 2005.
Hill et al., "A fast low-power optical memory based on coupled micro-ring lasers"; Nature Publishing Group, vol. 432, Nov. 11, 2004.
Almelda et al., "All-optical control of light on a silicon chip"; Nature, vol. 431, Oct. 28, 2004.
Poon et al., "Designing coupled-resonator optical waveguide delay lines"; Optical Society of America, vol. 21, No. 9, Sep. 2004.
Poon et al., "Wavelength-Selective Reflector Based on a Circular Array of Coupled Microring Resonators"; IEEE Photonics Technology Letters, vol. 16, No. 5, May 2004.

Ibrahim et al., "All-Optical AND/NAND Logic Gates Using Semiconductor Microresonators"; IEEE Photonics Technology Letters, vol. 15, No. 10, Oct. 2003.
Chao et al., "Biochemical sensors based on polymer microrings with sharp asymmetrical resonance"; Applied Physics Letters, vol. 83, No. 8, Aug. 25, 2003.
Kippenberg et al., "Modal coupling in traveling-wave resonators"; Optics Letters, vol. 27, No. 19, Oct. 1, 2002.
Heebner et al., "SCISSOR solitons and other novel propagation effects in microresonator-modified waveguides"; Optical Society of America, vol. 19, No. 4, Apr. 2002.
Schwelb et al., "All-Optical Tunable Filters Built with Discontinuity-Assisted Ring Resonators"; Journal of Lightwave Technology, vol. 19, No. 3, Mar. 2001.
Gorodetsky et al., "Rayleigh scattering in high-Q microspheres"; Optical Society of America, vol. 17, No. 6, Jun. 2000.
A. Yariv, "Universal relations for coupling of optical power between microresonators and dielectric waveguards"; Electronics Letters, vol. 36, No. 4, Feb. 17, 2000.
Kawabe et al., "Whispering-gallery-mode microring laser using a conjugated polymer"; Applied Physics Letters, 72, 141, 1998.
Little et al., "Second-order filtering and sensing with partially coupled traveling waves in a single resonator"; Optics Letters, vol. 23, No. 20, Oct. 15, 1998.
Ishii et al., "Mode Stabilization Method for Superstructure-Grating DBR Lasers"; Journal of Lightwave Technology, vol. 16, No. 3, Mar. 1998.
Teixeira et al., "Systematic Derivation of Anisotropic PML Absorbing Media in Cylindrical and Spherical Corrdinates"; IEEE Microwave and Guided Wave Letters, vol. 7, No. 22, Nov. 1997.
Little et al., "Microring Resonator Channel Dropping Filters"; Journal of Lightwave Technology, vol. 15, No. 6, Jun. 1997.
Little et al., "Surface-roughness-induced contradirectional coupling in ring and disk resonators"; Optics Letters, vol. 22, No. 1, Jan. 1, 1997.
Ishii et al., "Quasicontinuous Wavelength Tuning in Super-Structure-Grating (SSG) DBR Lasers"; IEEE Journal of Quantum Electronics, vol. 32, No. 3, Mar. 1996.
Weiss et al., "Splitting of high-Q Mie modes induced by light backscattering in silica microspheres"; Optics Letters, vol. 20, No. 18, Sep. 15, 1995.
Wei-Ping Huang, "Coupled-modetheory for optical waveguides: an overview"; Optical Society of America, vol. 11, No. 3, Mar. 1994.
Jayaraman et al., "Theory, Design, and Performance of Extended Tuning Range Semiconductor Lasers with Sampled Gratings"; IEEE Journal of Quantum Electronics, vol. 29, No. 6, Jun. 1993.
Haus et al., "Coupled-Mode Theory"; Invited Paper—Proceedings of the IEEE, vol. 79, No. 10, Oct. 1991.
Haus et al., "Coupled-mode formulations"; Optics Letters, vol. 14, No. 21, Nov. 1, 1989.
Shun-Lien Chuang, "Application of the Strongly coupled-Mode theory to Integrated Optical Devices"; IEEE Journal of Quantum Electronics, vol. QE-23, No. 5, May 1987.
Shun-Lien Chaung, "A Coupled Mode Formulation by Reciprocity and a Variational Principle"; Journal of Lightwave Technology. vol. LT-5, No. 1, Jan. 1987.
Amnon Yariv, "Coupled-Mode Theory for Guided-Wave Optics"; IEEE Journal of Quantum Electronics, vol. QE-9, No. 9, Sep. 1973.
Rohit Grover PhD., Indium Phosphide Based Optical Micro-Ring Resonators, Thesis for Doctor of Philosophy degree, © 2003.
Xu, Qianfan; Schmidt, Bradley; Pradhan, Sameer; Lipson Michal, "Micrometre-Scale Silicon Electro-Optic Modulator", Nature, vol. 435, Issue 7040, pp. 325-327, May 19, 2005 (Abstract).
Qui, Weibin; Kang, Young Mo; Goddard Lynford L., "Quasicontinous Refractive Index Taliloring of SiNx and SoPxMy for Broadband Antireflective Coatings", © 2010 American Institute of Physics, Applied Physics Letters 96, 141116 (2010).

\* cited by examiner

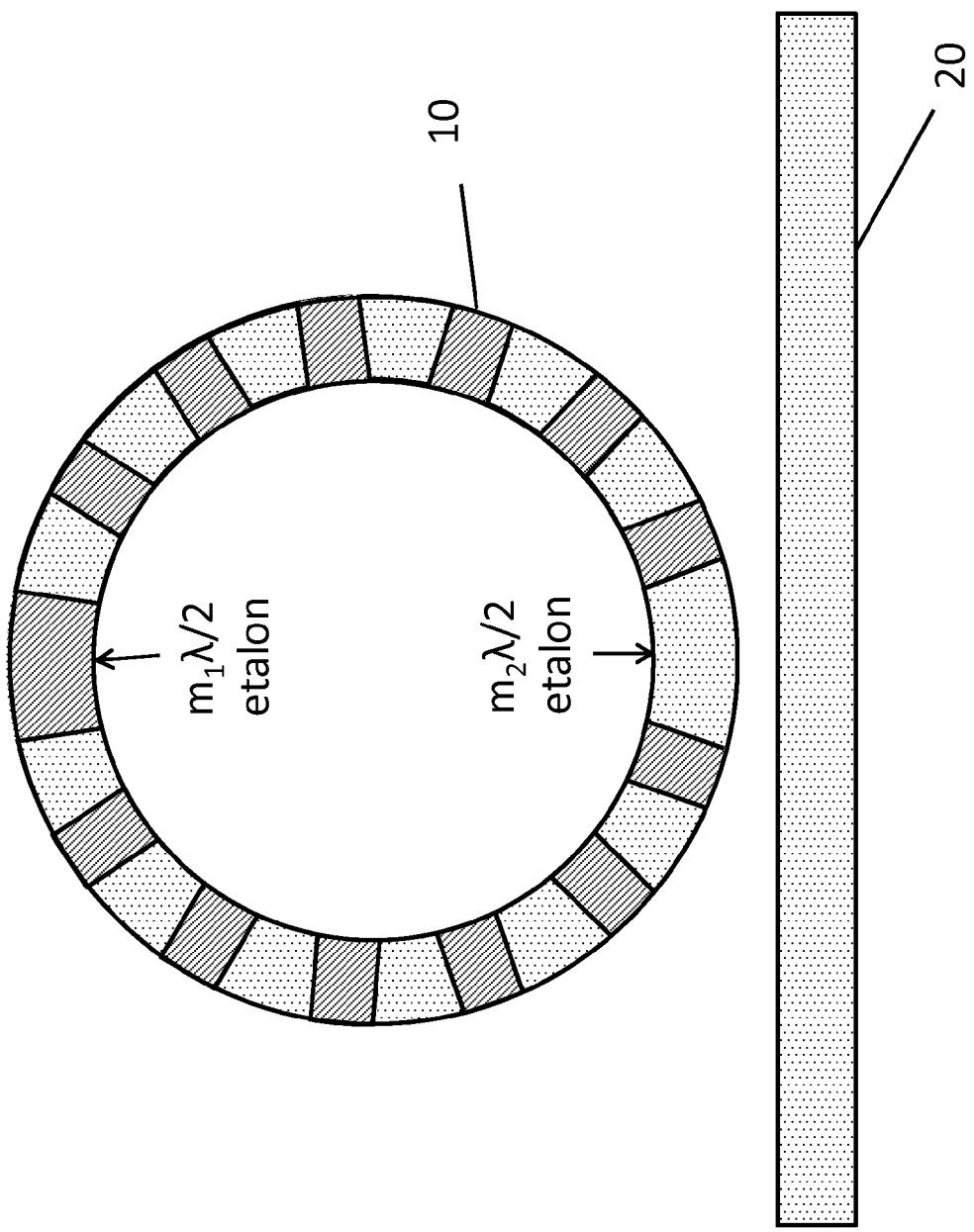

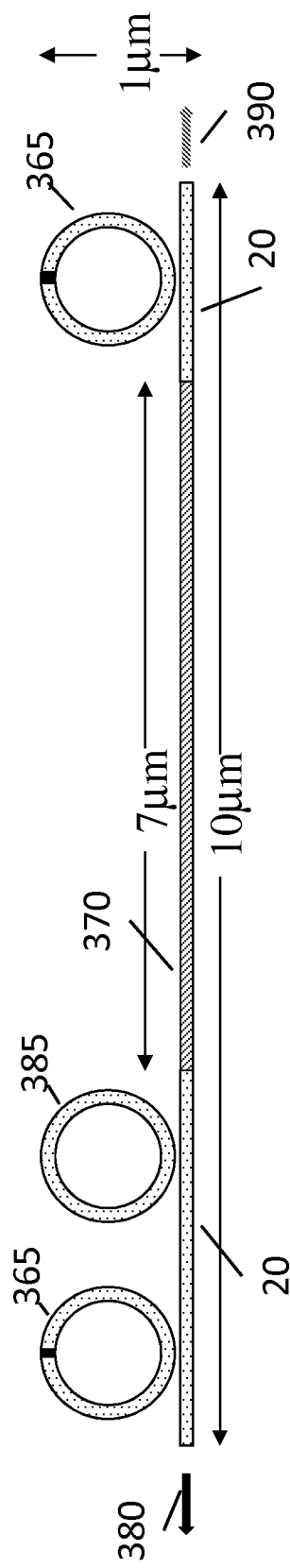
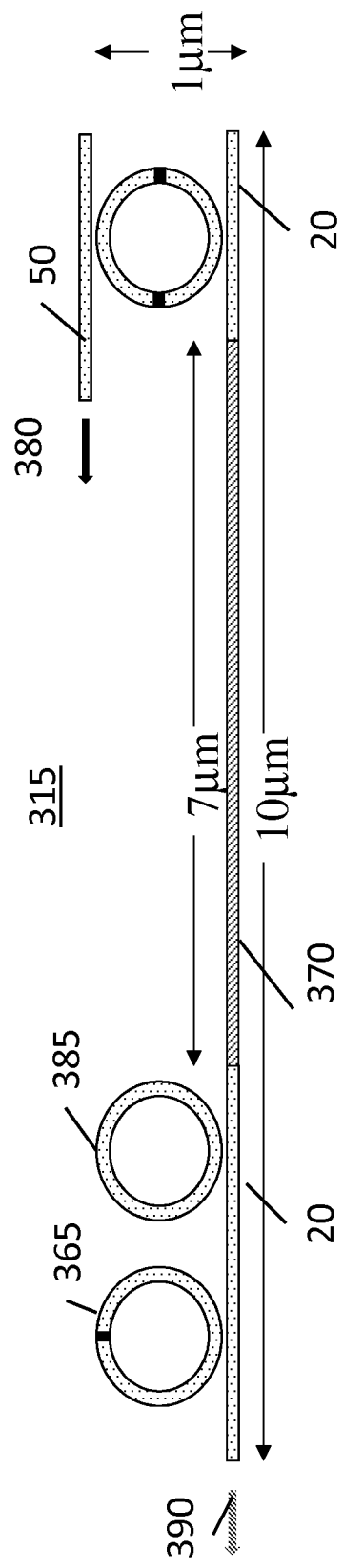
FIG. 7A
FIG. 7B

DISTRIBUTED REFLECTOR IN A MICRORING RESONATOR

This application claims the benefit of U.S. provisional application 61/382,537, filed on Sep. 14, 2010, which is incorporated herein by reference.

TECHNICAL FIELD

The present application may be related to the design and use of gratings in optical components and systems.

BACKGROUND

A microring resonator (MRR) has been used in various photonic devices due to the potentially large quality factor (Q) and small size of the MRR. Such devices have been used as the building blocks of integrated optical filters, switches, modulators, logic gates, memories, delay lines, sensors, and laser cavities.

The distributed Bragg reflector (DBR) is a technology that has enabled numerous optoelectronic devices including vertical cavity lasers, narrow linewidth lasers, fiber Bragg gratings, dichroic mirrors, and dispersion compensation filters. The DBR laser has many applications including communications, metrology, sensing, and spectroscopy.

A dispersive photonic bandgap crystal (PhC) in an MRR have been investigated for narrowing a resonator linewidth using enhanced modal dispersion near the PhC bandgap. The device was designed to have a sharp notch in reflection at resonance by coupling a PhC MRR to a broadband external linear reflective PhC in a bus waveguide. Good notch filtering performance requires that the external PhC be both highly reflective and have minimal scattering loss, and also requires precise phase matching of the PhC k-vector to the MRR. These constraints make fabrication of the device difficult. Also, when the PhC is very highly reflective, the strength of the field in the ring is approximately less than or equal to the input field strength in the bus waveguide.

SUMMARY

A family of microring devices, which may be referred to as a distributed reflector in an optical ring raveguide is disclosed. An example of such a device is a distributed Bragg grating in a microring resonator (DBR-MRR). The buildup of field strength in a ring resonator configuration yields multiple partial reflection encounters with a same set of grating elements. This may result in high reflectivity or high dispersion with only a few grating pairs and makes possible the design and fabrication of compact narrowband reflectors, filters, switches, and modulators for integration in photonic circuits. Such structures may be less sensitive to process variations in the formation of the gratings across a wafer than conventional gratings due to the multiple reflection encounters with the same grating. Moreover, such DBR-MRR may not produce the reflection side-lobes that are prevalent in conventional DBRs. The absence of side-lobes may lead, for example, to reduced channel crosstalk in dense wavelength division multiplexing (DWDM) systems and in lower power, higher-data-rate communications.

In an aspect, a device has an optical ring waveguide with a grating along at least a portion thereof, and an optical waveguide coupled to the optical ring waveguide.

In another aspect, an optical source device includes an optically amplifying structure, where an optical ring waveguide may be coupled to at least one of an input or an output of the optically amplifying structure, the optical ring waveguide having a grating disposed along at least a portion of the length thereof.

In yet another aspect, a laser having a gain medium may be adapted to be pumped by at least one of an optical or an electrical energy source; and, at least one optical ring waveguide having a grating along at least a portion thereof. The optical ring waveguide is coupled to the gain medium so as to form a resonant region including the gain medium.

An add-drop multiplexer is disclosed, including an optical ring waveguide having a grating along at least a portion thereof a first optical waveguide coupled to the optical ring waveguide; and a second optical waveguide coupled to the optical ring waveguide. The add-drop wavelength is determined by a diameter of the optical ring waveguide and a period of the grating.

A method of designing an optical filter is disclosed, the method including the steps of: selecting a design wavelength; determining a circumference of an optical ring waveguide to be an integral multiple of the design wavelength; selecting a length of a grating disposed along a circumference of the ring; selecting a reflection amplitude of a grating disposed along a length of the optical ring waveguide; and selecting a coupling coefficient between the ring optical waveguide and an optical waveguide coupled thereto; where the circumference, the coupling coefficient and the reflection amplitude are selected to determine a filter spectral response.

A computer program product is disclosed for computing the parameters of at least one of the reflective or transmissive optical filters, the product being stored in a non-volatile non-transient medium and including: instructions for configuring a computer to: accept data including a design wavelength, a filter bandwidth and a filter maximum amplitude response; and, to compute a diameter of an optical ring waveguide, a length of a grating disposed along a circumference of the optical ring waveguide, an index contrast of said grating, a reflection coefficient spectra of said grating, and a coupling coefficient between the ring waveguide and another optical waveguide such that that a desired filter bandwidth, and at least one of a reflection or transmission coefficient, are achieved when the filter comprising the other waveguide coupled to the optical ring resonator is disposed in an optical system.

The distributed reflector in a microring resonator architecture offers a wide variety of functionalities and may lead to a significant reduction in photonic device size for equivalent optical performance. Aspects of microring resonators and distributed Bragg reflectors may be combined such that, for example, at resonance, the microring resonator enables a high intensity of optical field to build up in the ring. The grating may produce a specifically designed reflectivity spectrum that can enhance or suppress reflection at the microring resonances. This enables specific reflectivity profiles for the entire structure such as, for example, a single isolated peak or a periodic comb of peaks to be produced.

A grating forming the reflector itself may be weakly reflecting (R<5% for a single pass through the grating at any wavelength), so that the optical power in the optical ring waveguide at a design wavelength is at least about 20 times larger than the power in the input bus optical waveguide. The weakly reflecting aspect of the grating near the design wavelength enables the DBR-MRR, for example, to effectively utilize the spectral filtering properties of a high-quality-factor microring. Otherwise, unwanted spectral mode splitting may occur and the reflectivity of the overall structure at the design wavelength is significantly reduced In devices such as the DBR-E(etalon)-MRR, described herein, the etalon structure may have much higher reflectivity at a wavelength separated from resonances of the microring (e.g. R>99% at a substantial wavelength offset, but R approaches 0% at a design wavelength, which is a resonance of the microring).

Representative, but non-limiting attributes of a DBR-MRR component may include:
- a reflection spectrum similar to that of a distributed Bragg reflector or sampled grating distributed Bragg reflectors (SGDBR) with significantly smaller scalar dimensions (10-100×). Reflection side lobes may be suppressed;
- a periodic comb spectrum of reflection peaks with uniform or non-uniform amplitudes which may be used, for example, as a cavity-end-mirror in broad band quasi-continuous tunable lasers, or other optical devices;
- a single-wavelength reflection peak with high side-mode-suppression-ratio (SMSR) and ultra-wide free spectral range (FSR) which may be used, for example, as a cavity-end-mirror for single-frequency lasers, or as a notch filter for optical transmission.

A DBR-MRR may be configured to exhibit spectral amplitude and phase responses that may not be feasible using DBR, sampled grating DBR (SGDBR), or MRR structures either individually, or in combination, by incorporating, for example, DBR-etalon structures in the ring resonator (DBR-E-MRR). Such DBR-E-MRR structures may find applications in, for example:
- ultra narrow band transmission filters where the full width at half maximum (FWHM) of the transmission passband may be, for example, about 6 pm. This bandwidth is significantly narrower than the 1040 pm FWHM for a MRR and 220 pm FWHM for an etalon, when used individually. Such a narrow band filter can be used, for example, to create a single frequency signal, to perform optical analog signal processing, to modulate an optical signal or to create a tunable narrow-linewidth filter for absorption spectroscopy or other modes of sensing, or the like;
- multiple output reflectors for compact semiconductor laser cavities. A laser cavity with a two-optical-bus DBR-E-MRR mirror as an output port may direct different portions of the laser light and/or amplified spontaneous emission (ASE) to different output ports. This may, for example, be used to reduce spontaneous emission noise appearing at specific optical output ports and enable configuration of a laser device exhibiting lower relative intensity noise (RIN), which is useful, for example, for low-power high-data-rate communications; and,
- sharp transition mirrors, which may be used, for example, as part of a passive external cavity for stabilizing or locking the wavelength of a laser (the cavity would have $dR/d\lambda<0$ for wavelength locking), or to modulate the location of a transmission bandpass region, a reflection bandpass region or a transition region in between, and use the device as an amplitude, frequency, or phase modulated optical switch, or as part of a tunable external cavity for modulating the wavelength of a laser.

$$z = 2L_t\left(\frac{n_e}{\lambda} - \frac{n_e}{\lambda_0}\right)$$

Figure 4B:
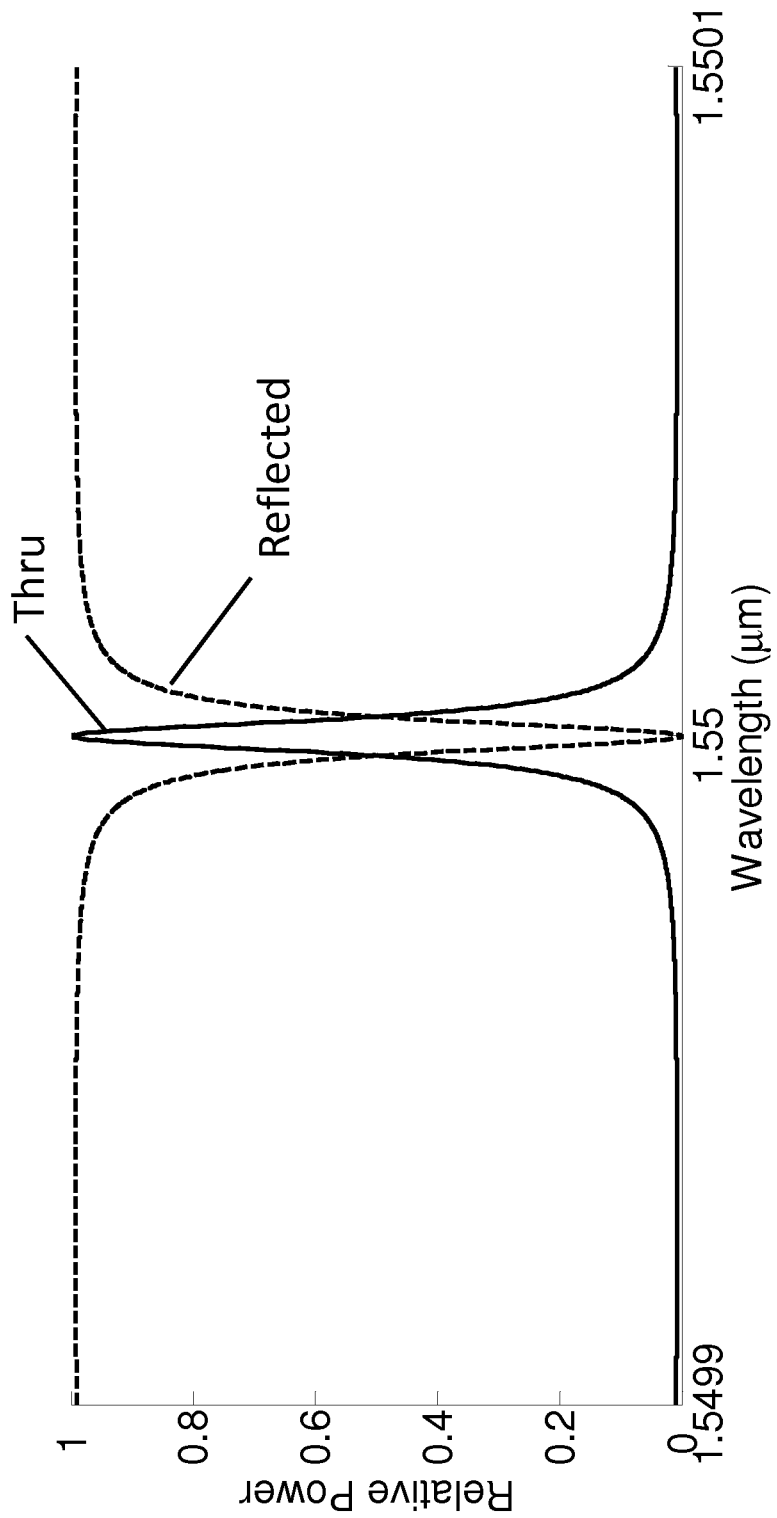
Figure 5:
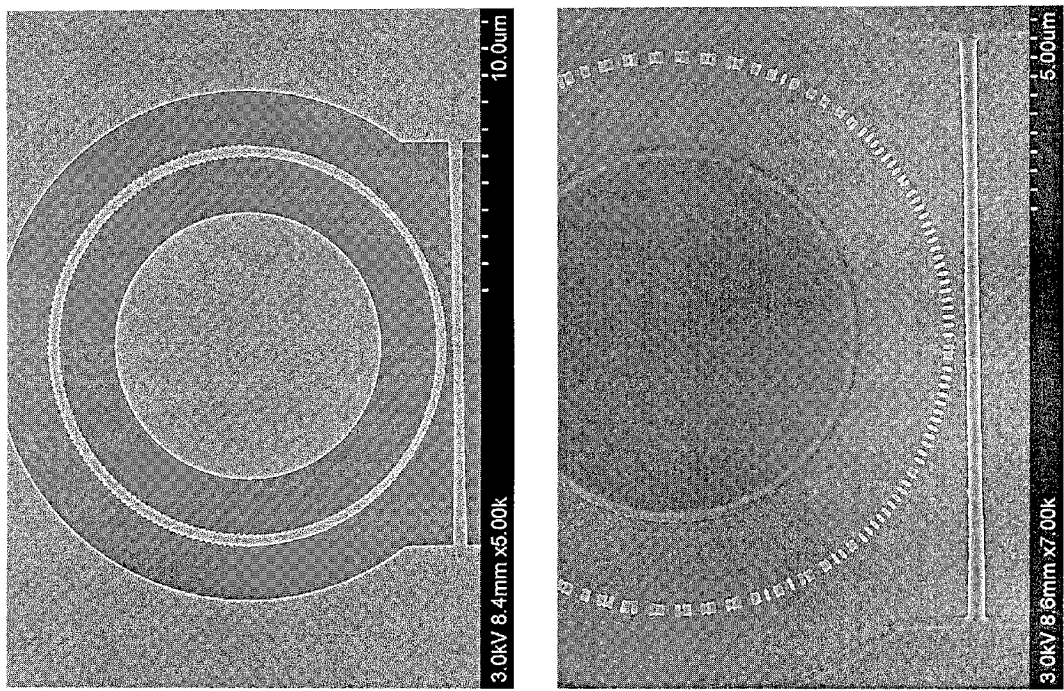
Figure 6:
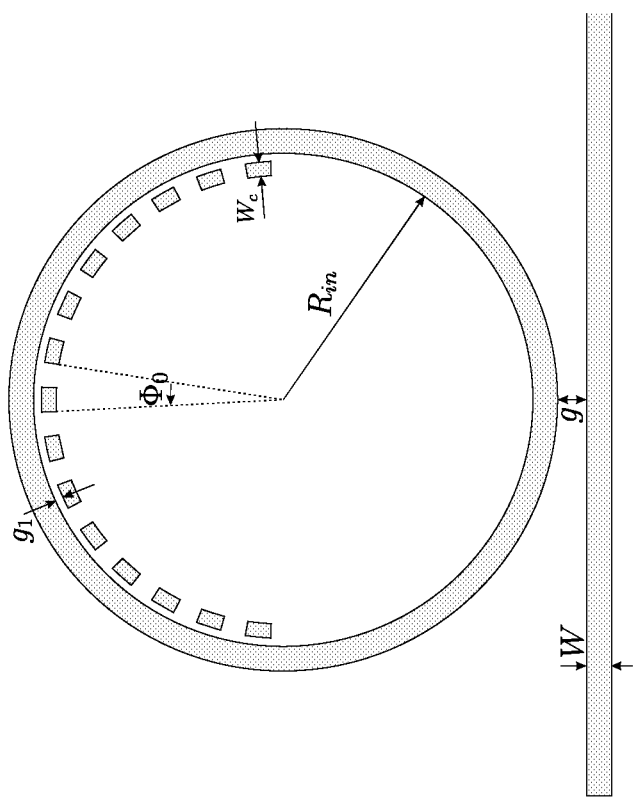
Figure 8:
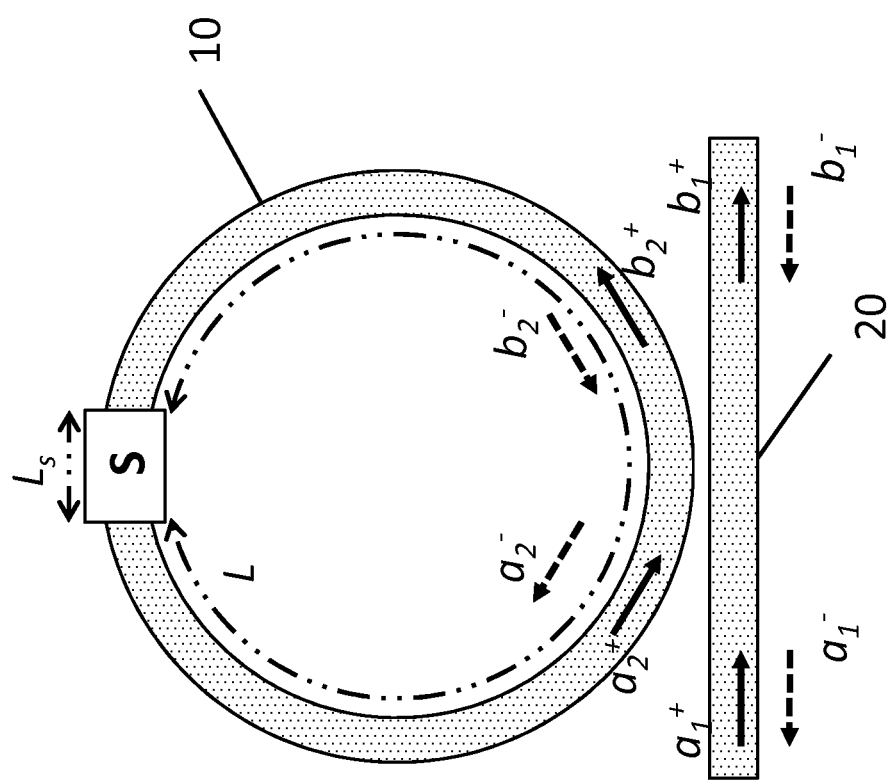
Figure 9A:
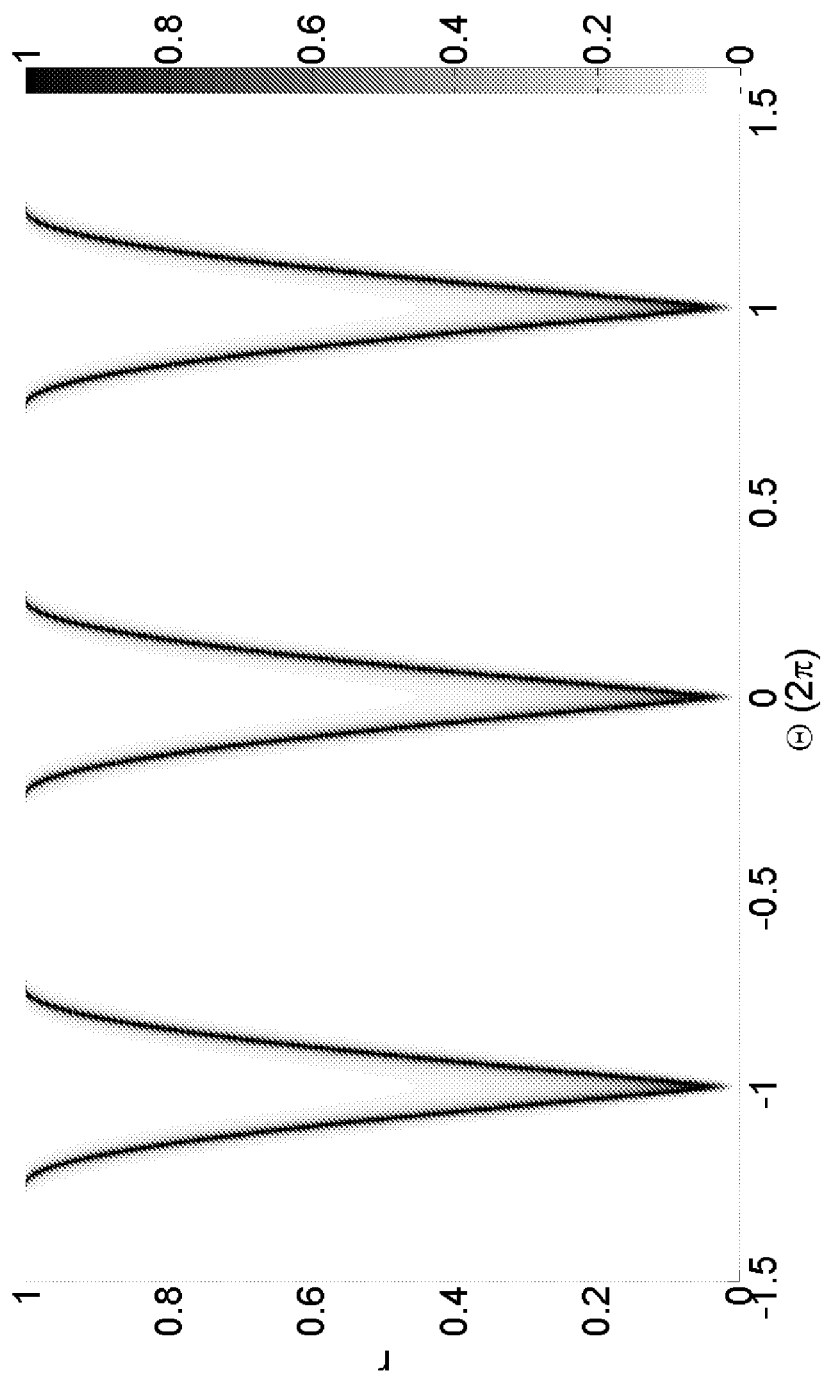
Figure 9B:
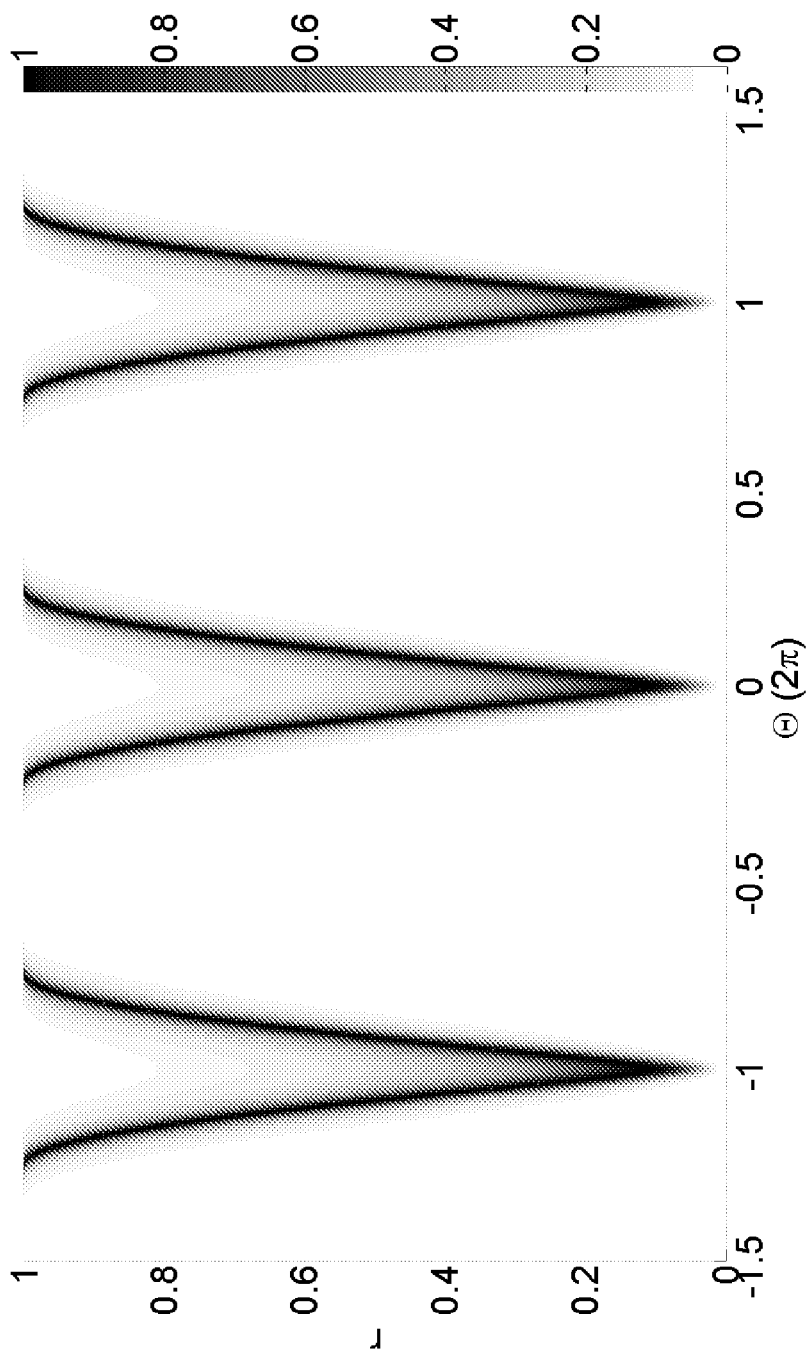
Figure 9C:
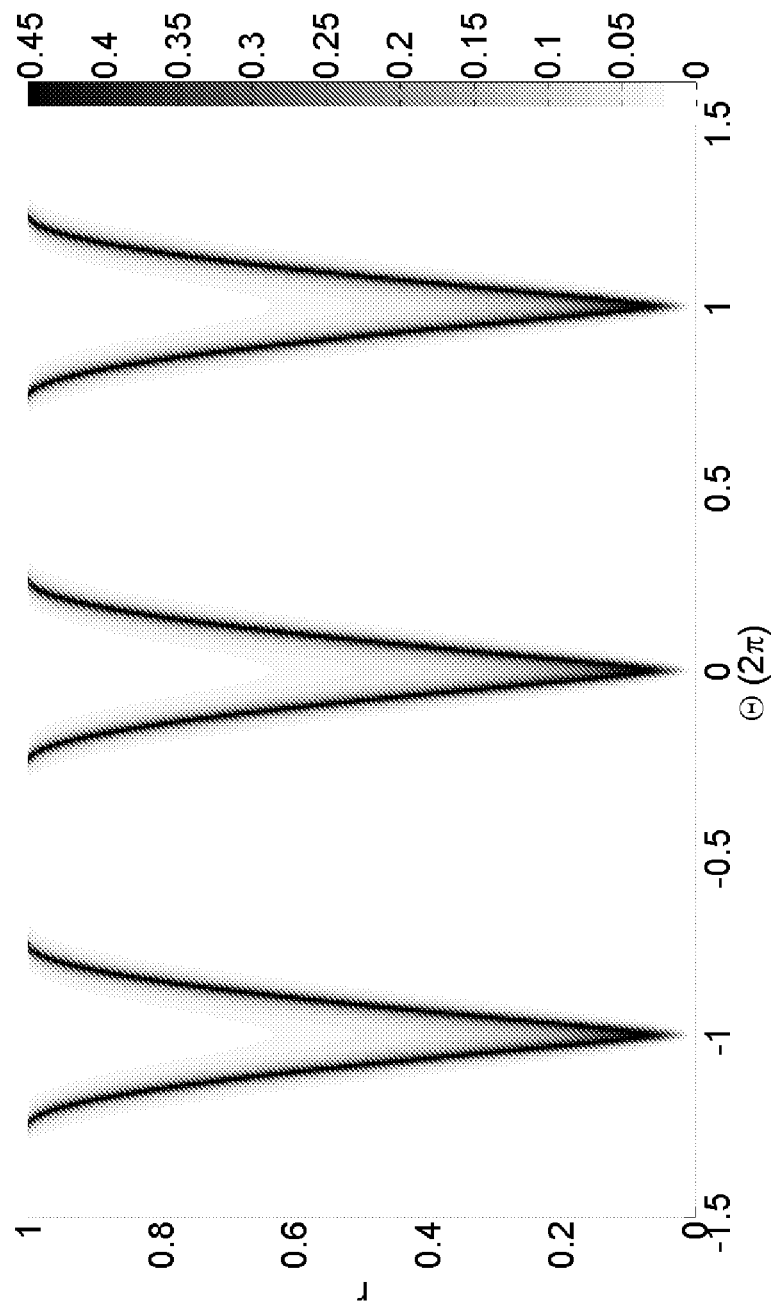
Figure 9D:
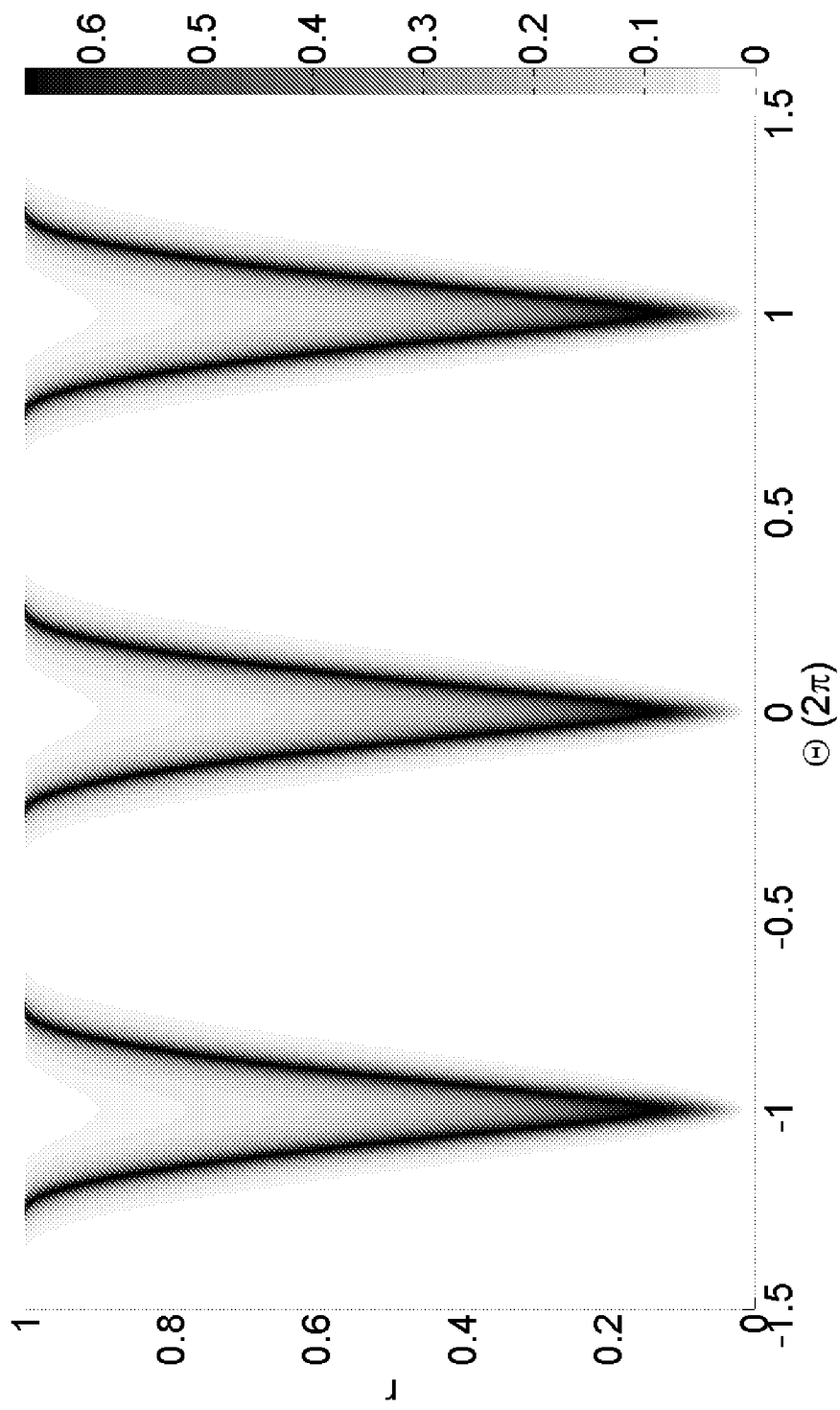
Figure 10A:
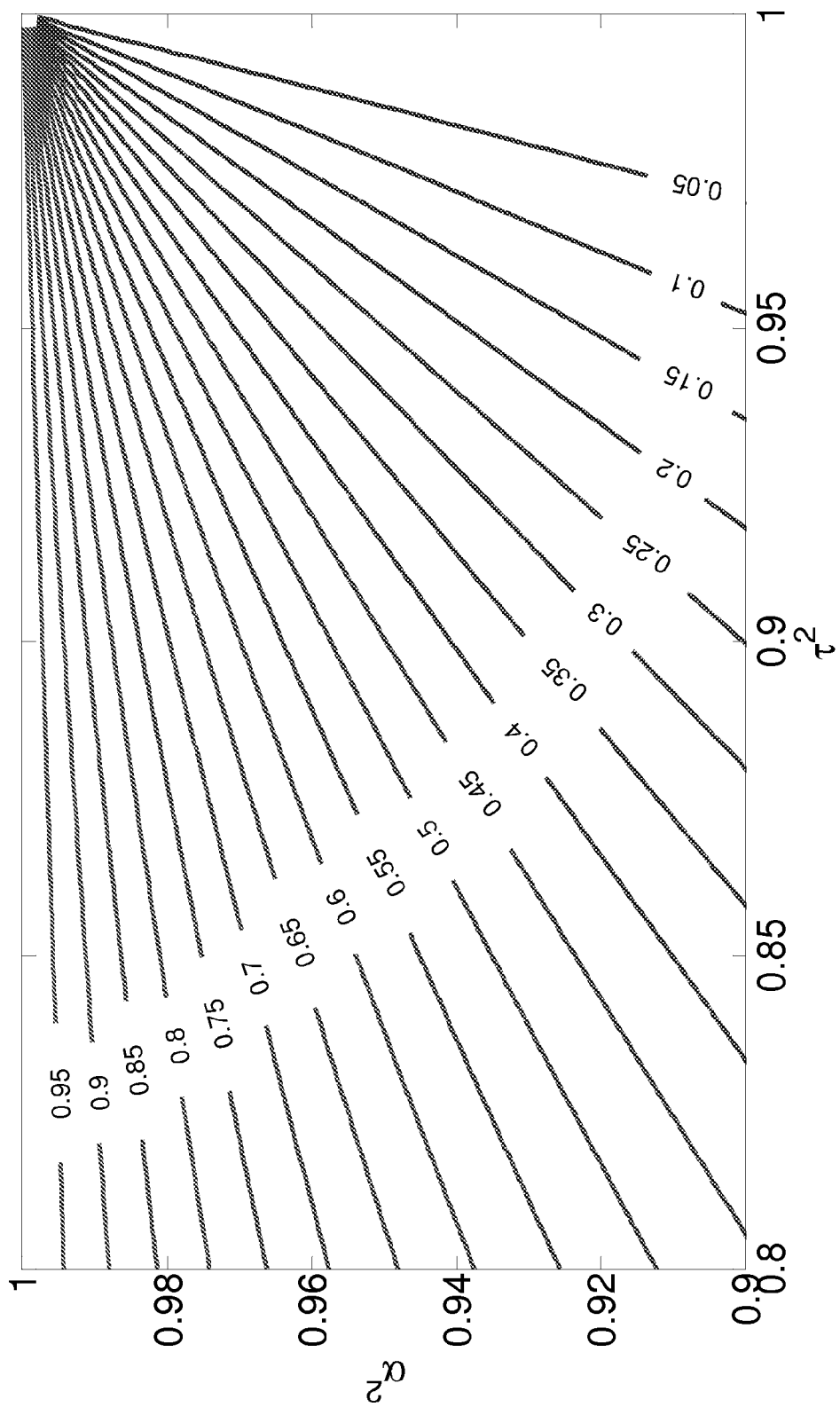
Figure 10B:
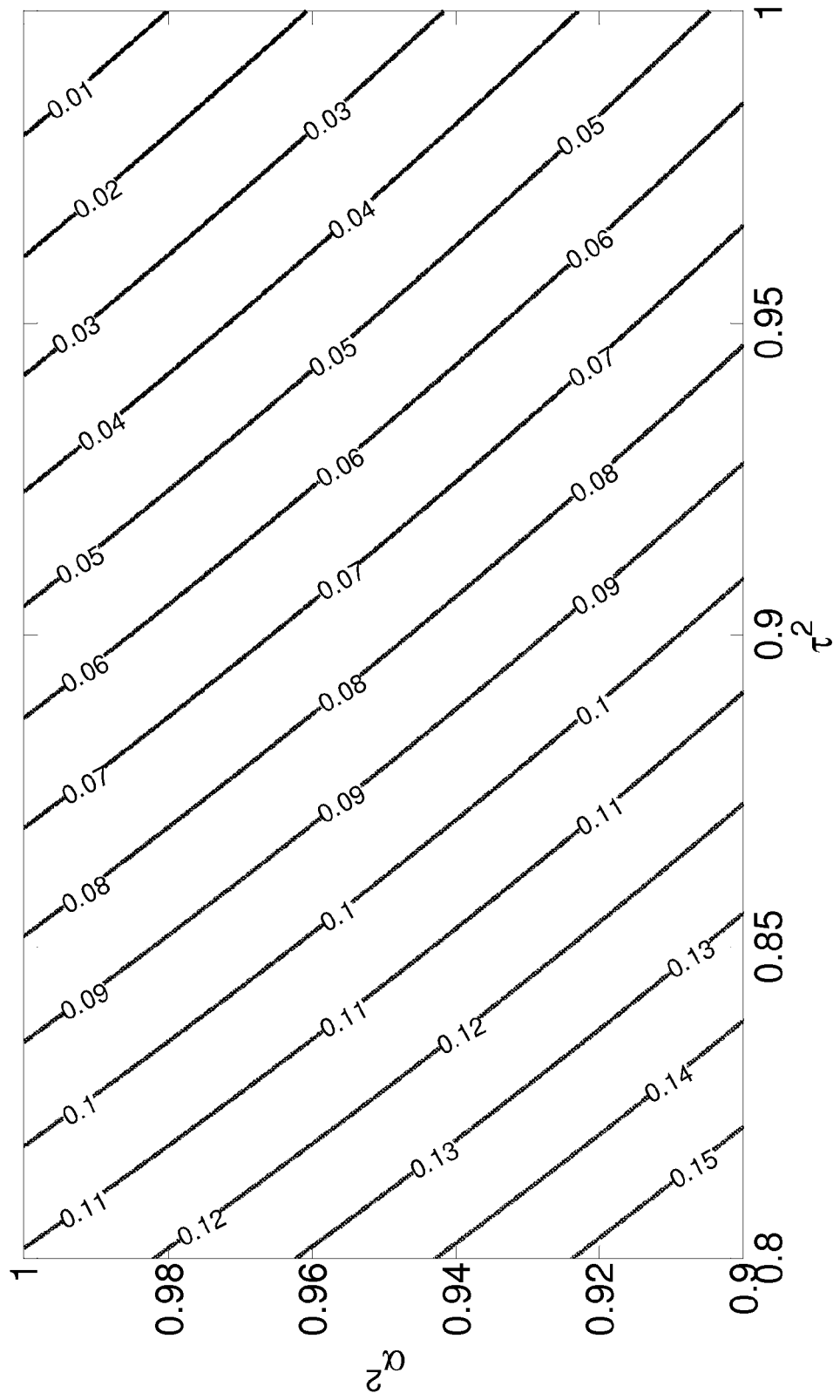
Figure 12A:
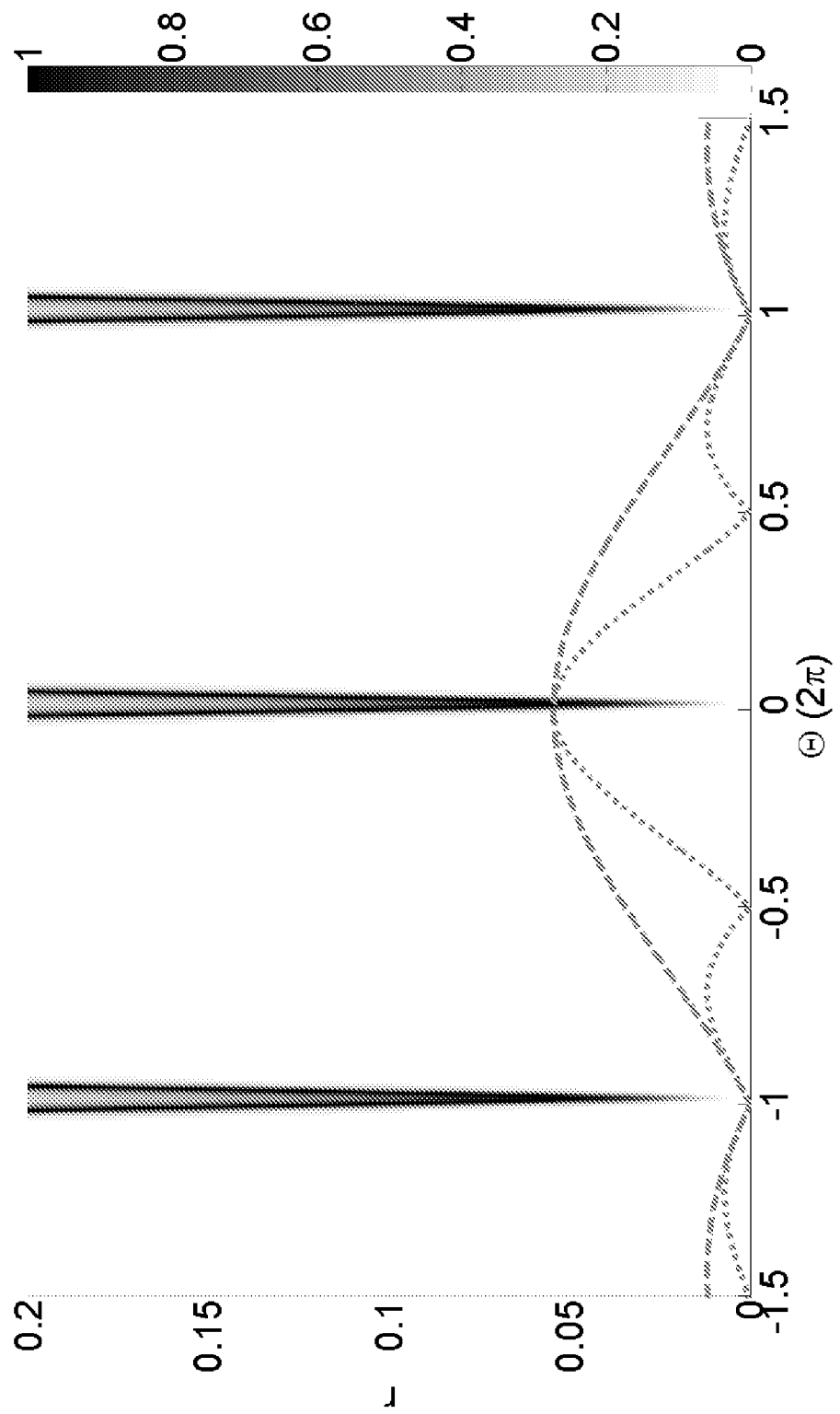
Figure 13:
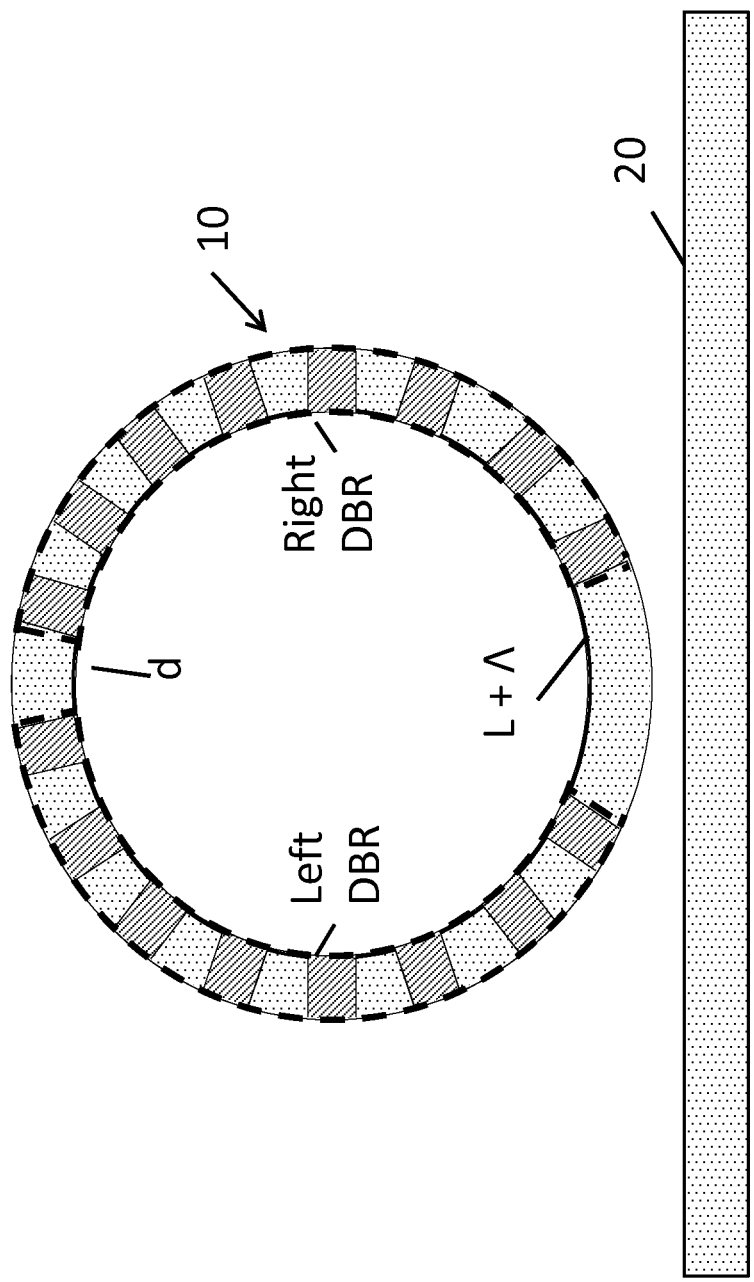
Figure 14A:
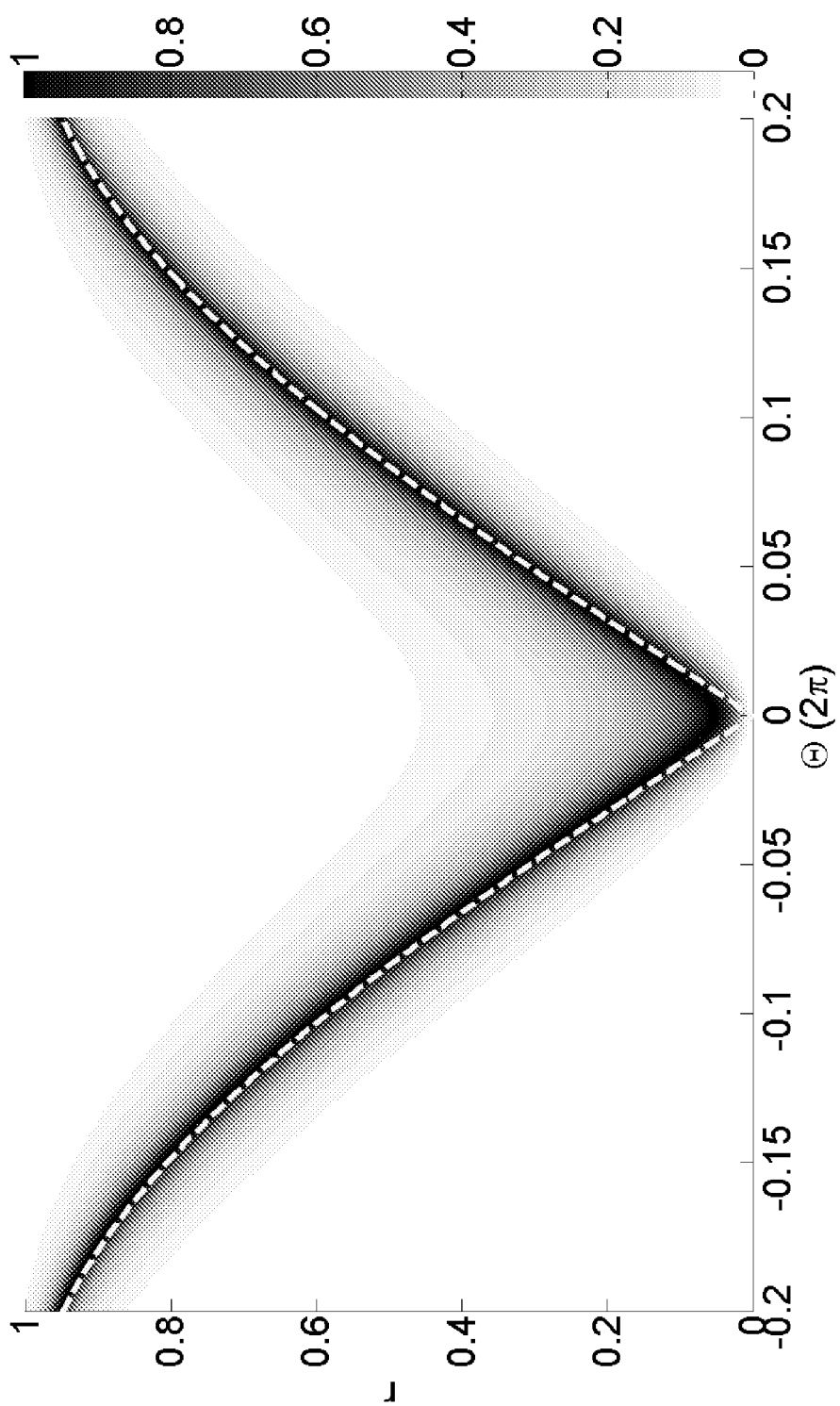
Figure 14B:
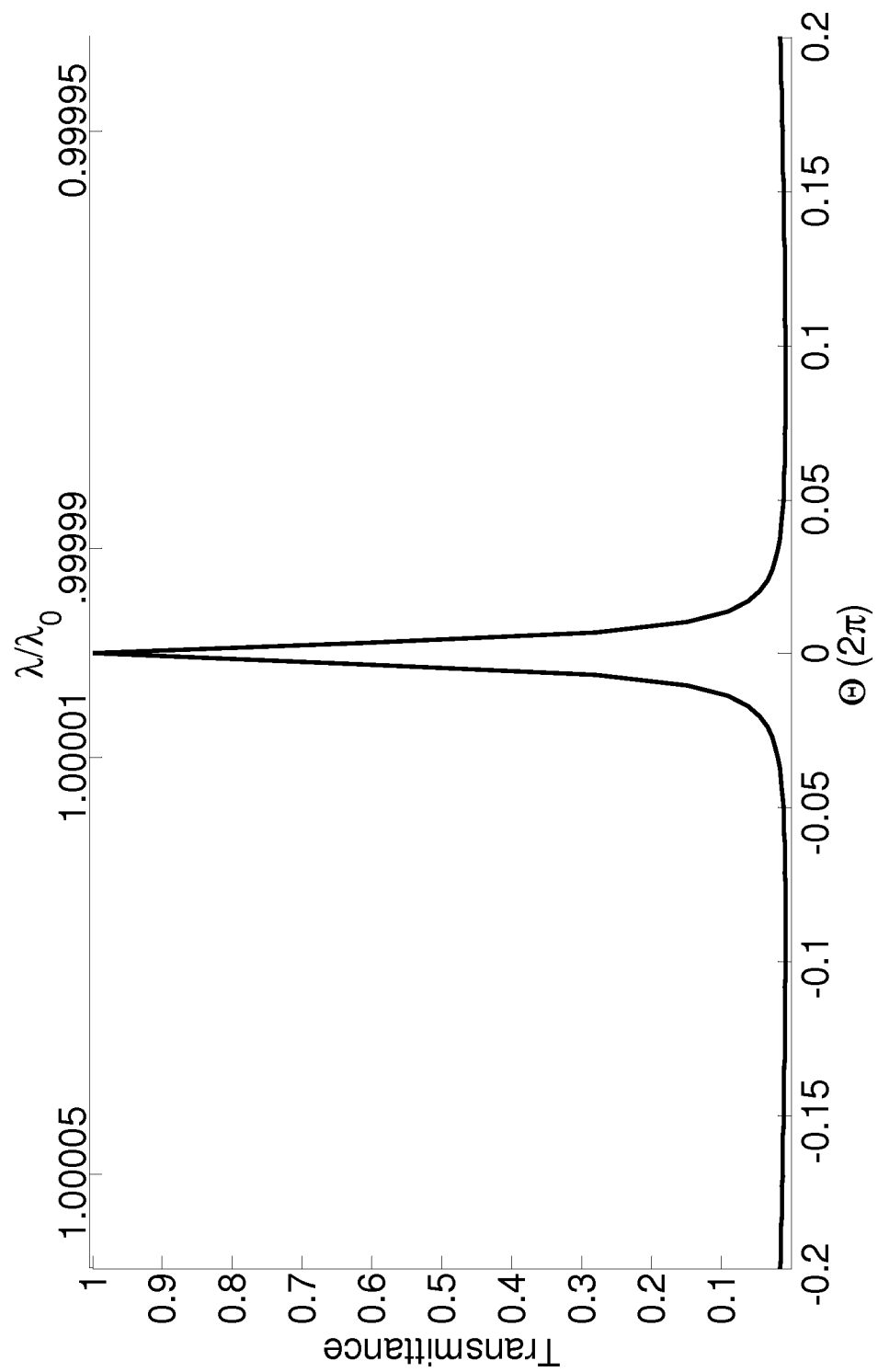
Figure 15A:
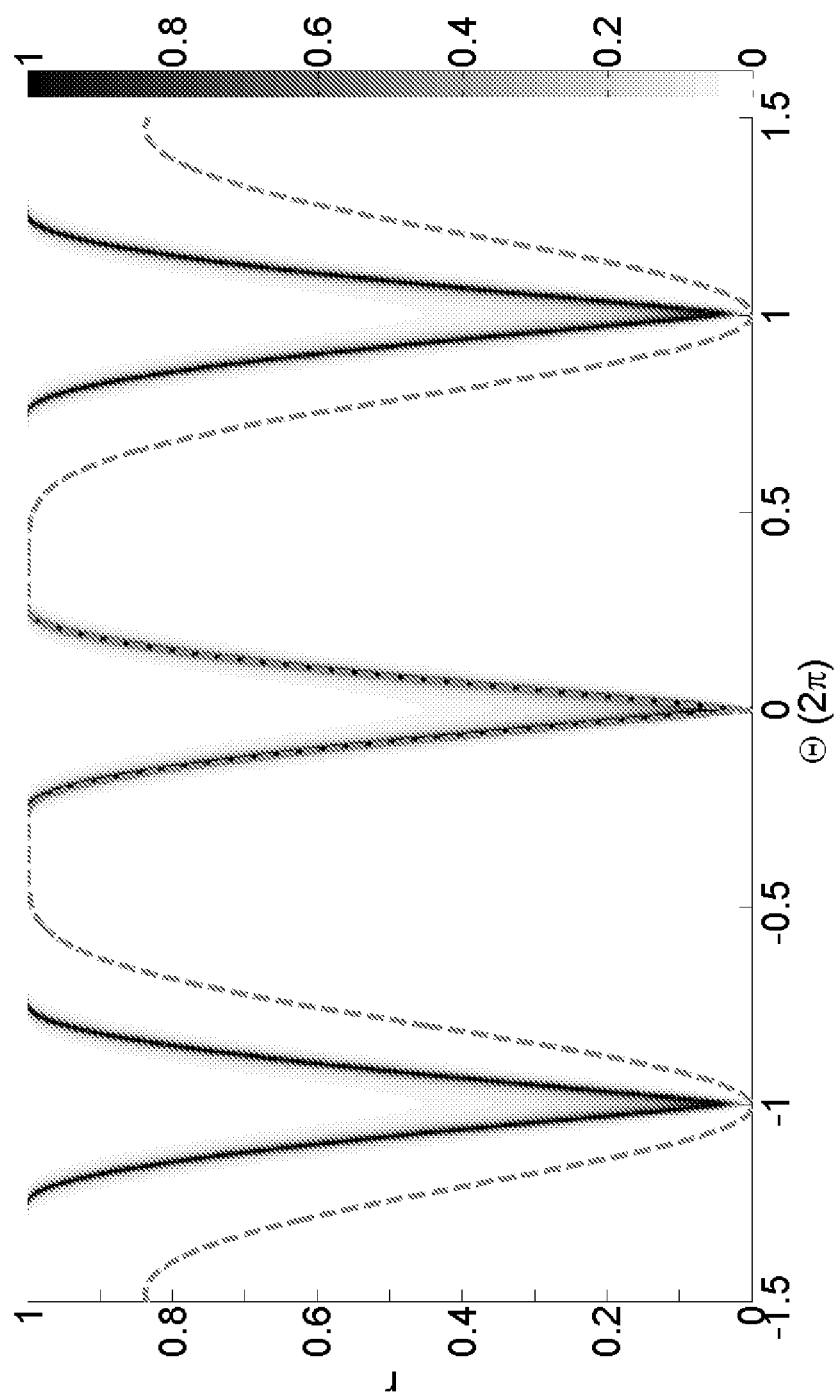
Figure 15B:
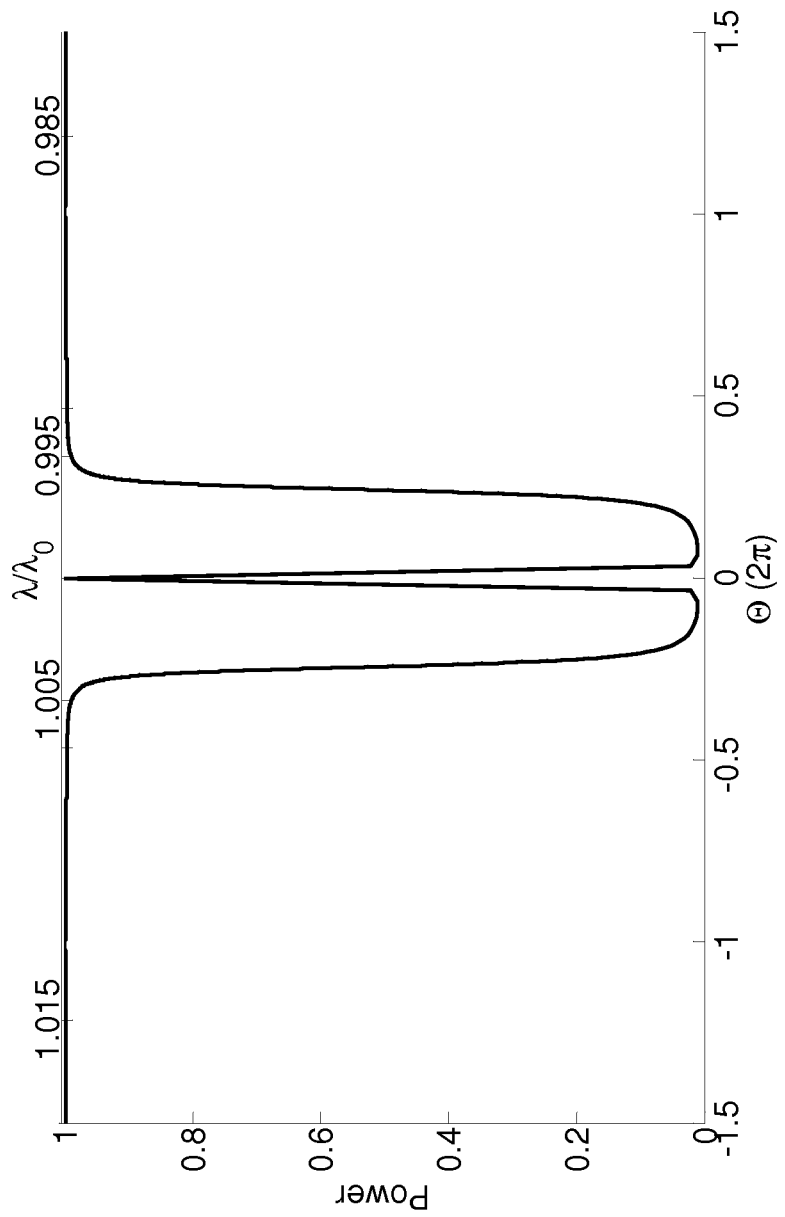
Figure 15C:
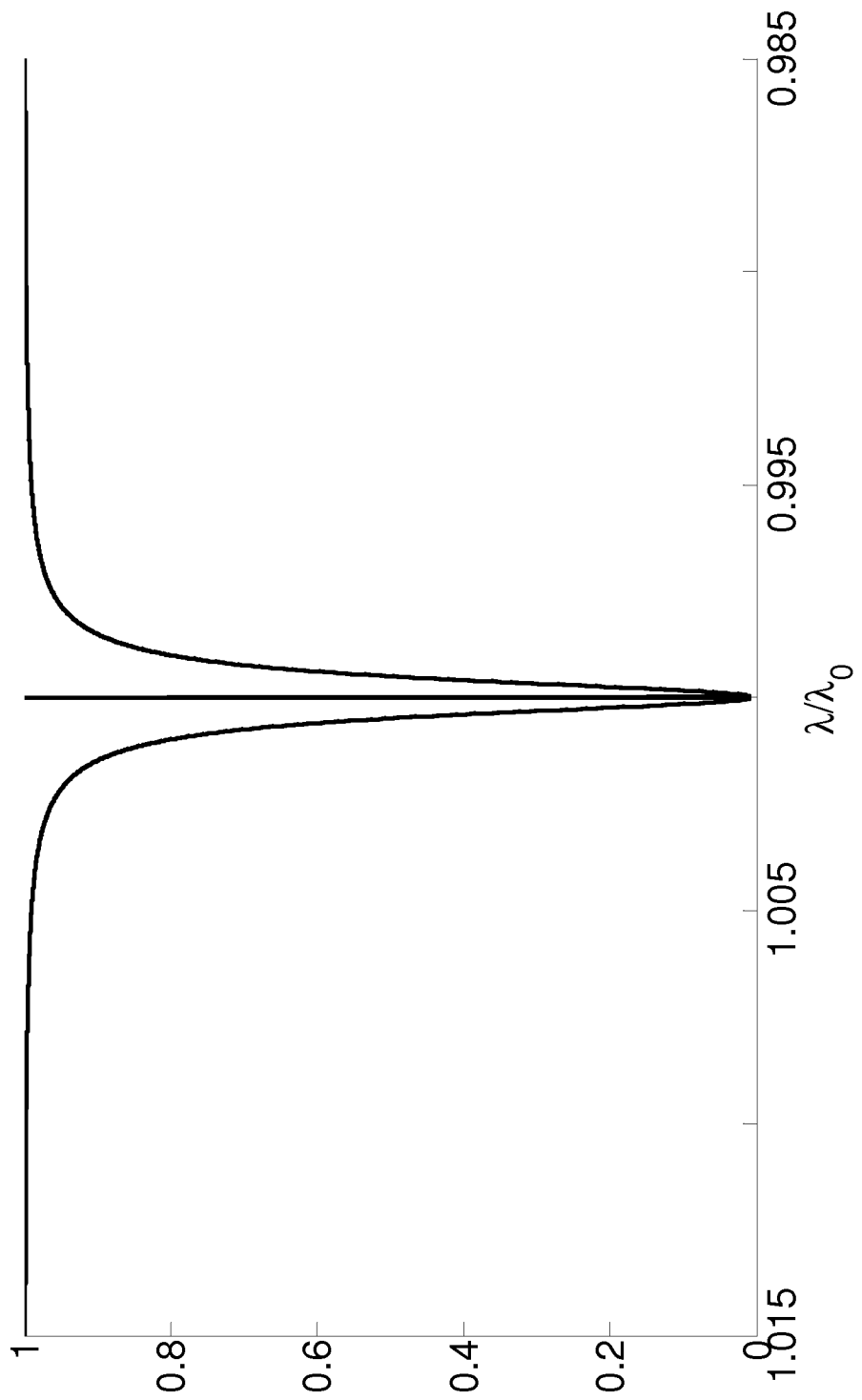
Figure 15D:
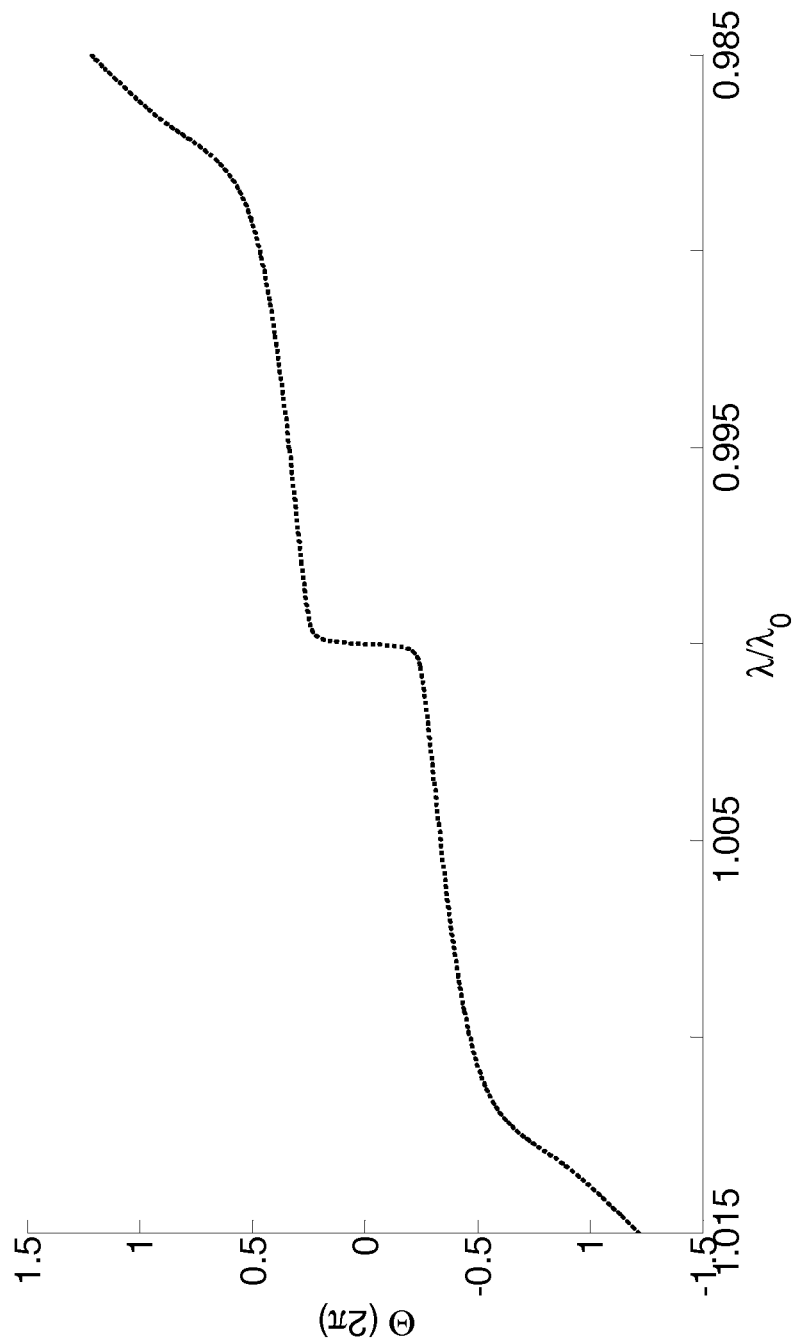
Figure 16A:
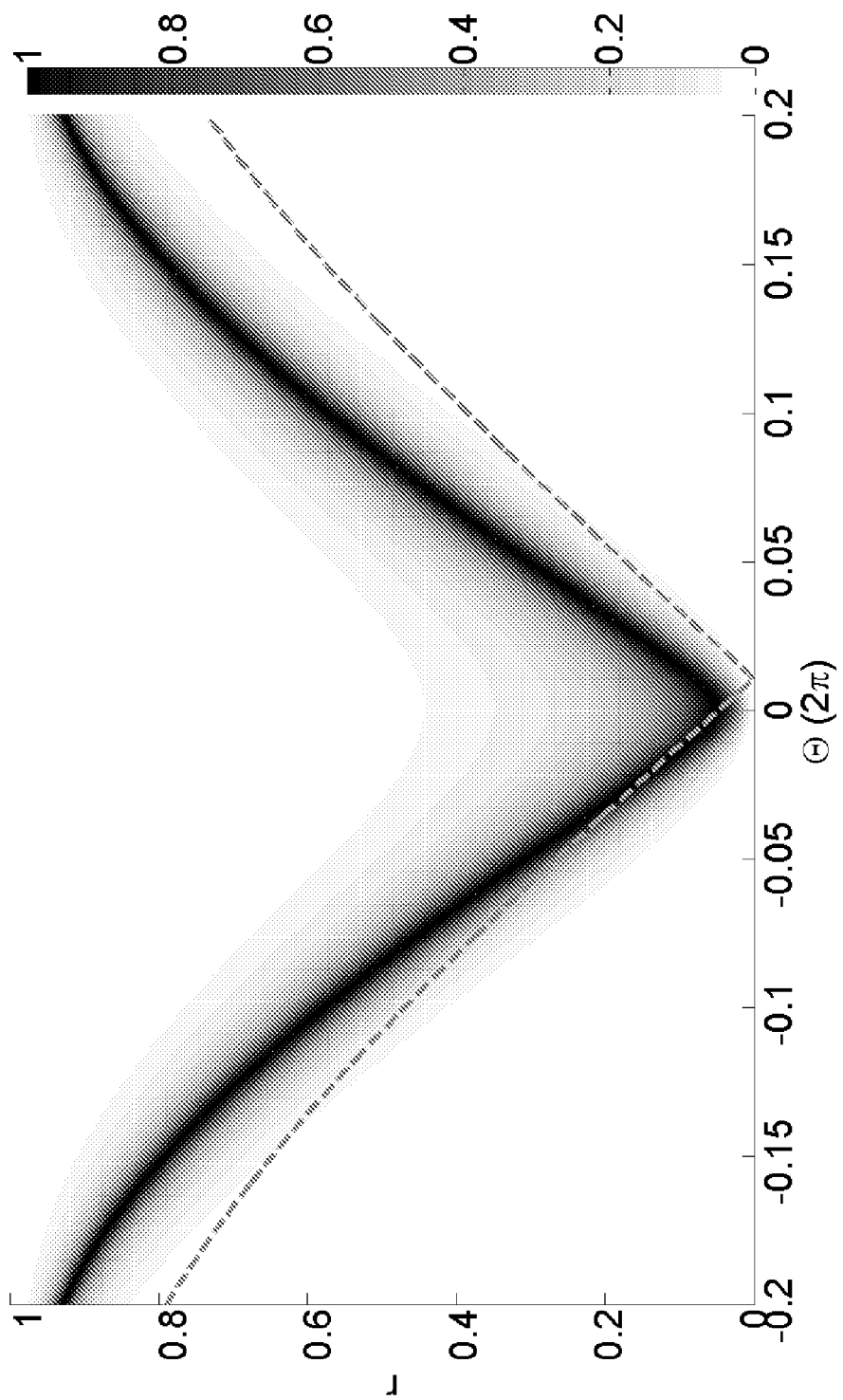
Figure 16B:
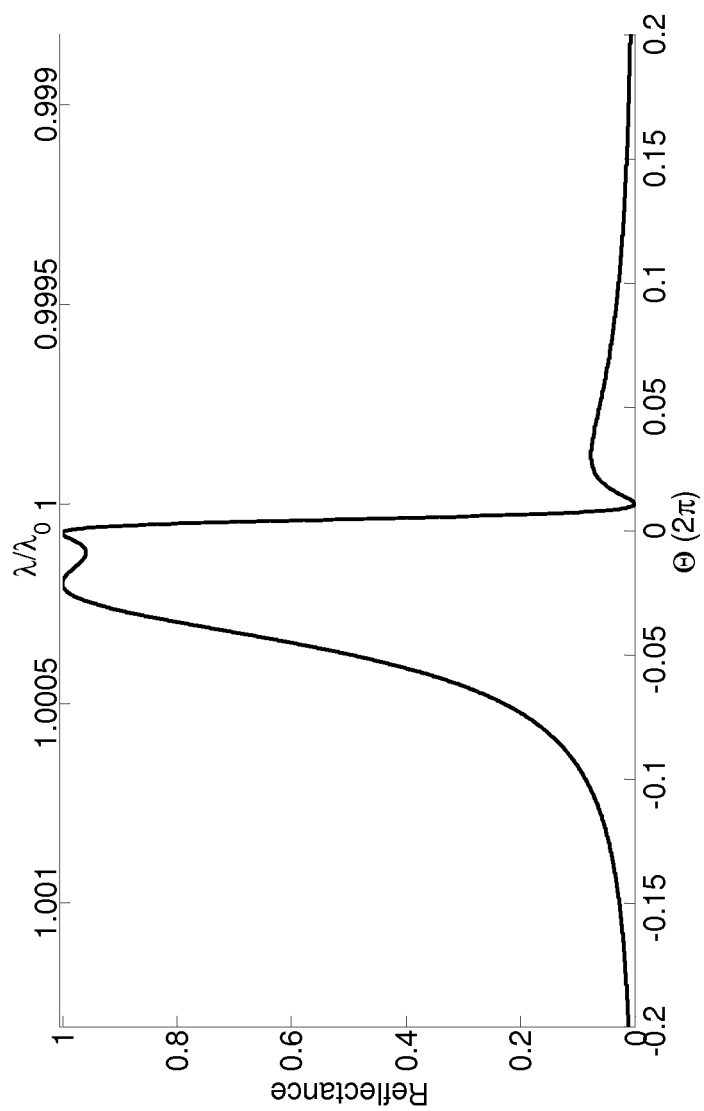
Figure 18:
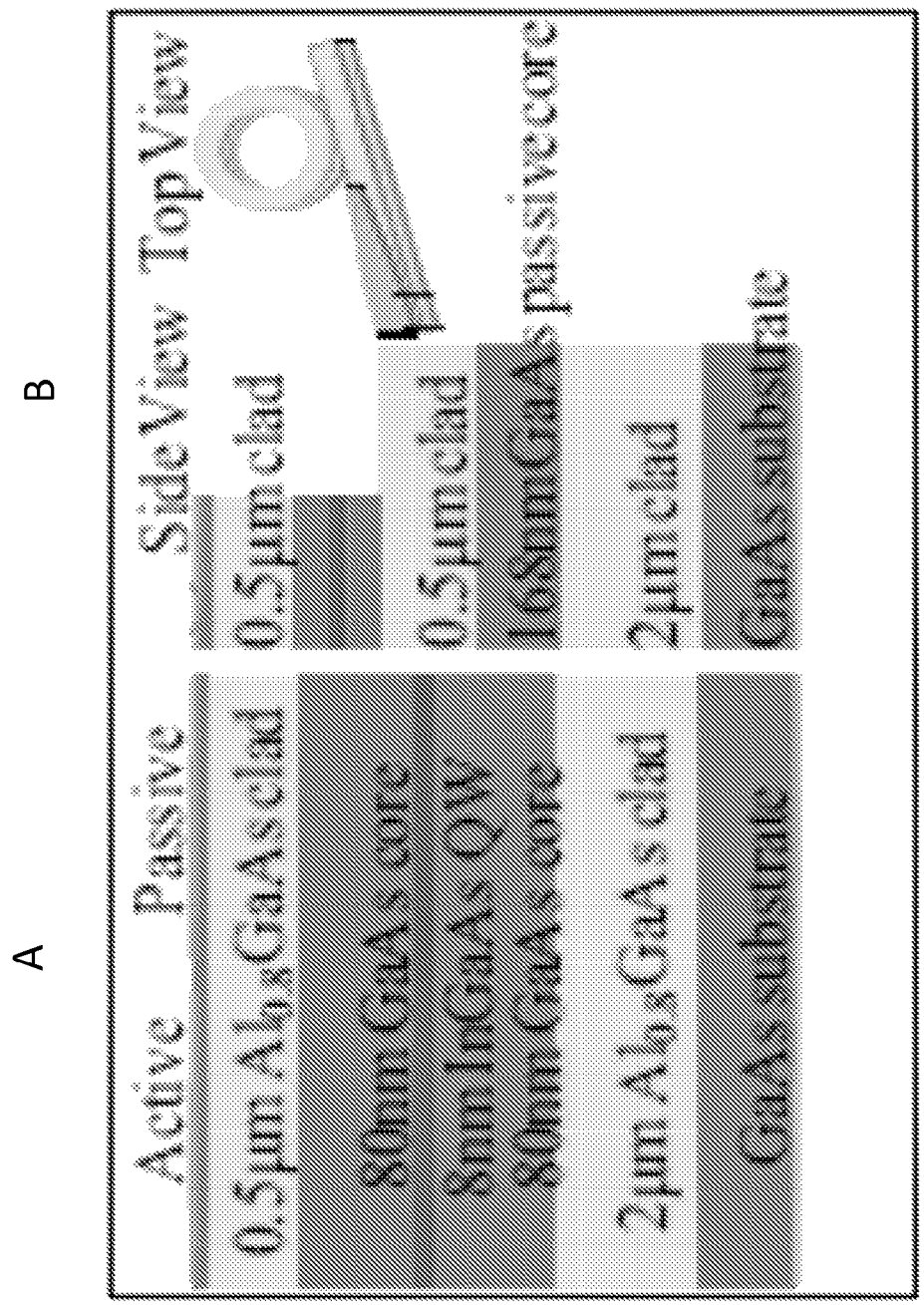
Figure 18C:
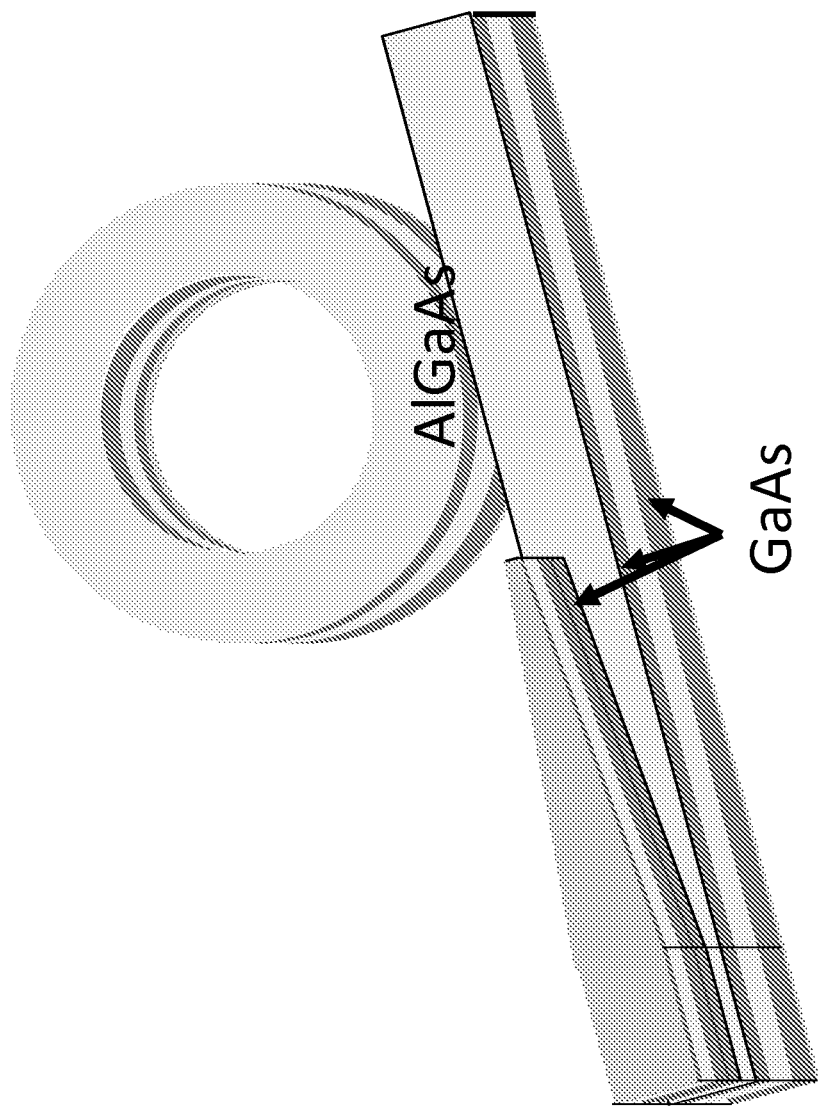
Figure 19:
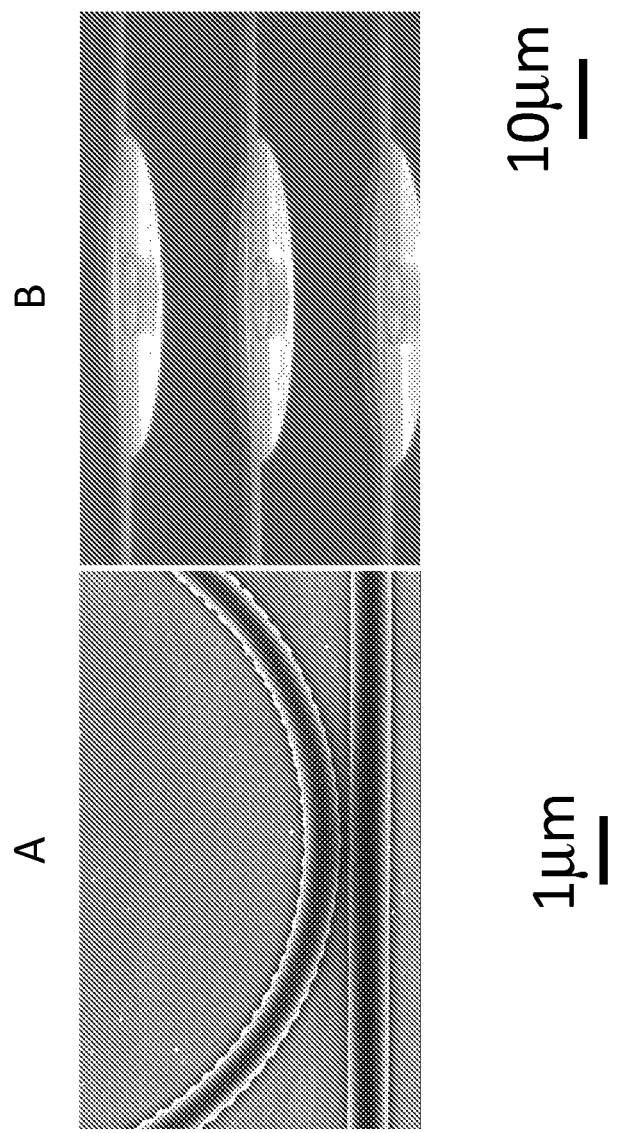
Figure 20:
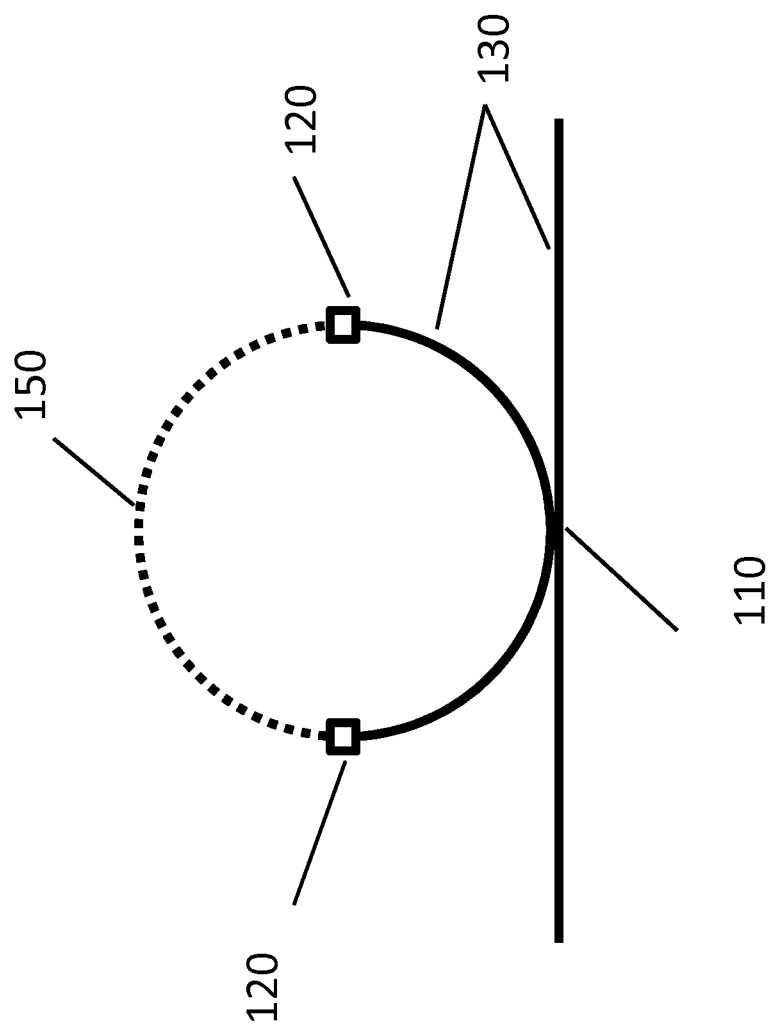
Figure 21:
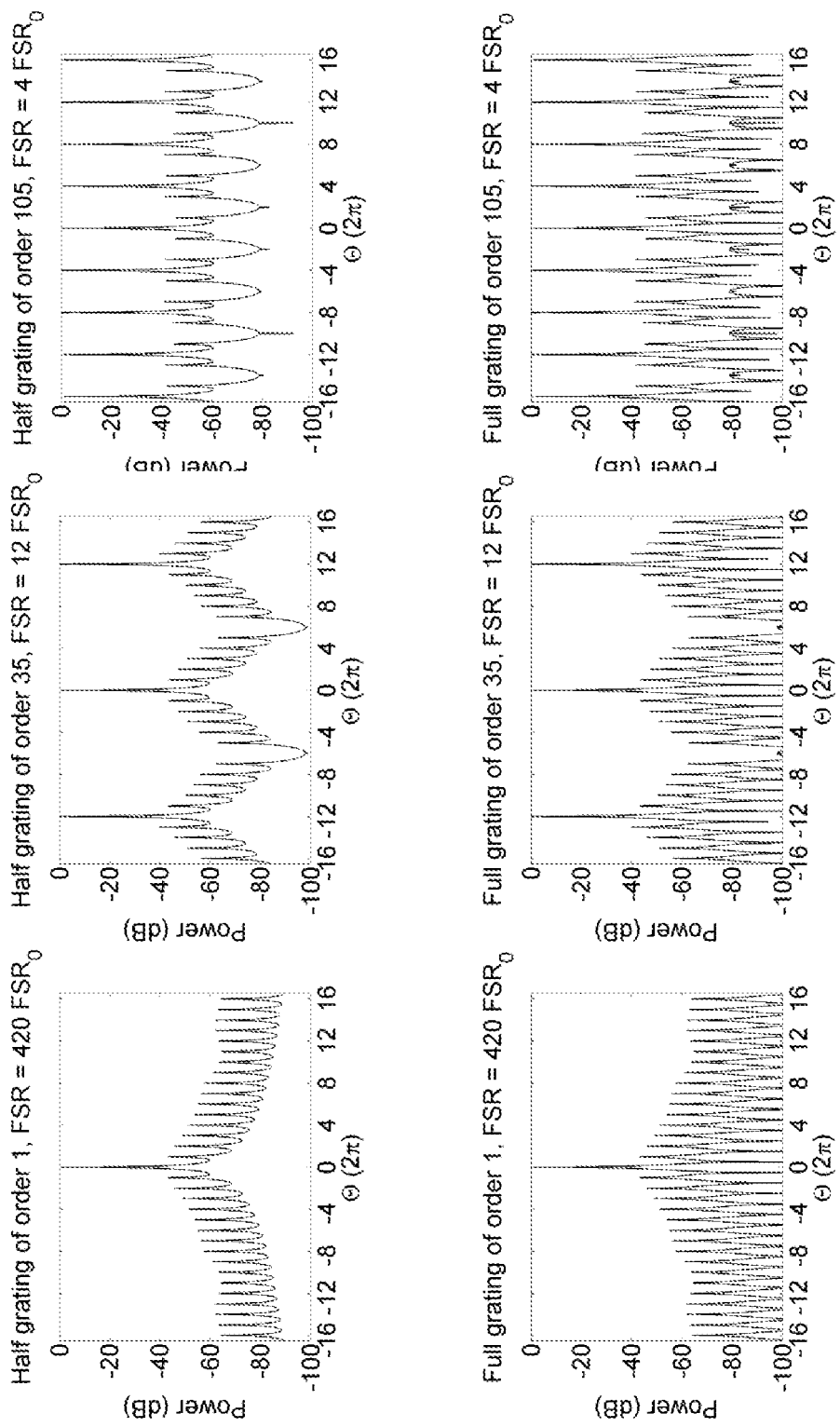
Figure 22:
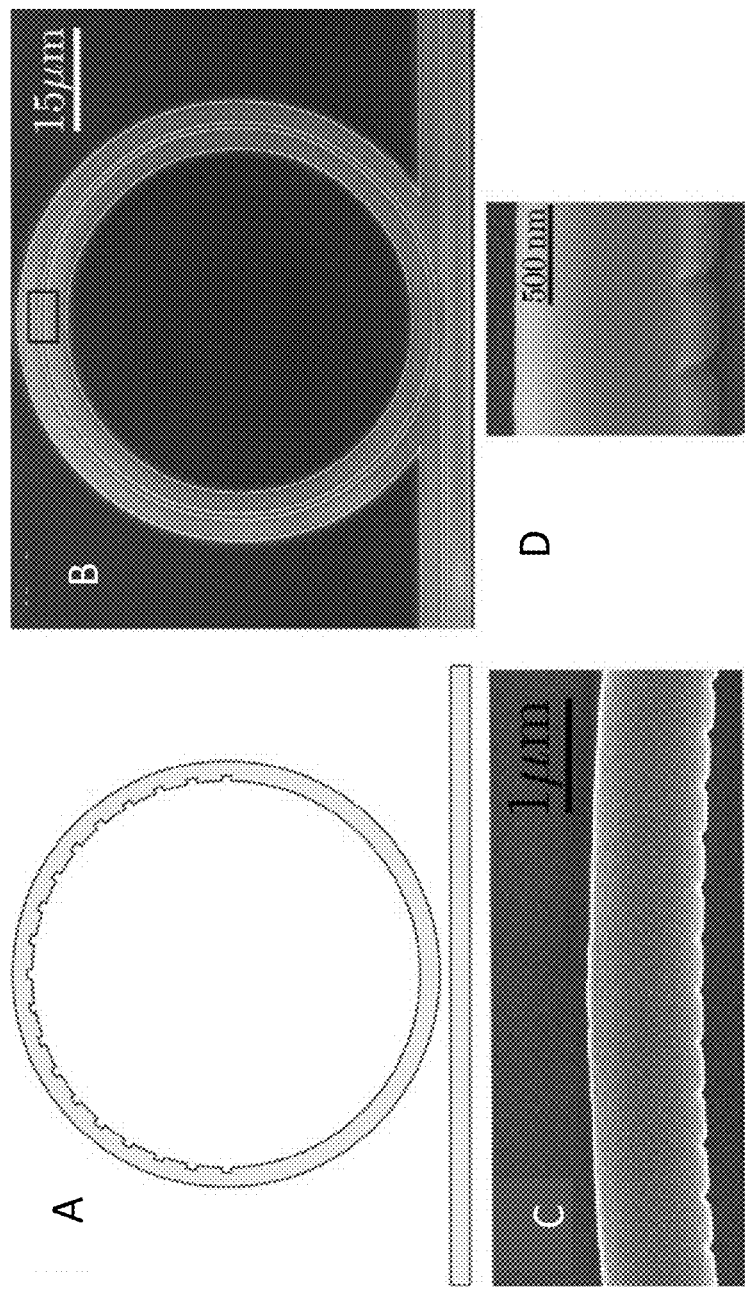
Figure 23A:
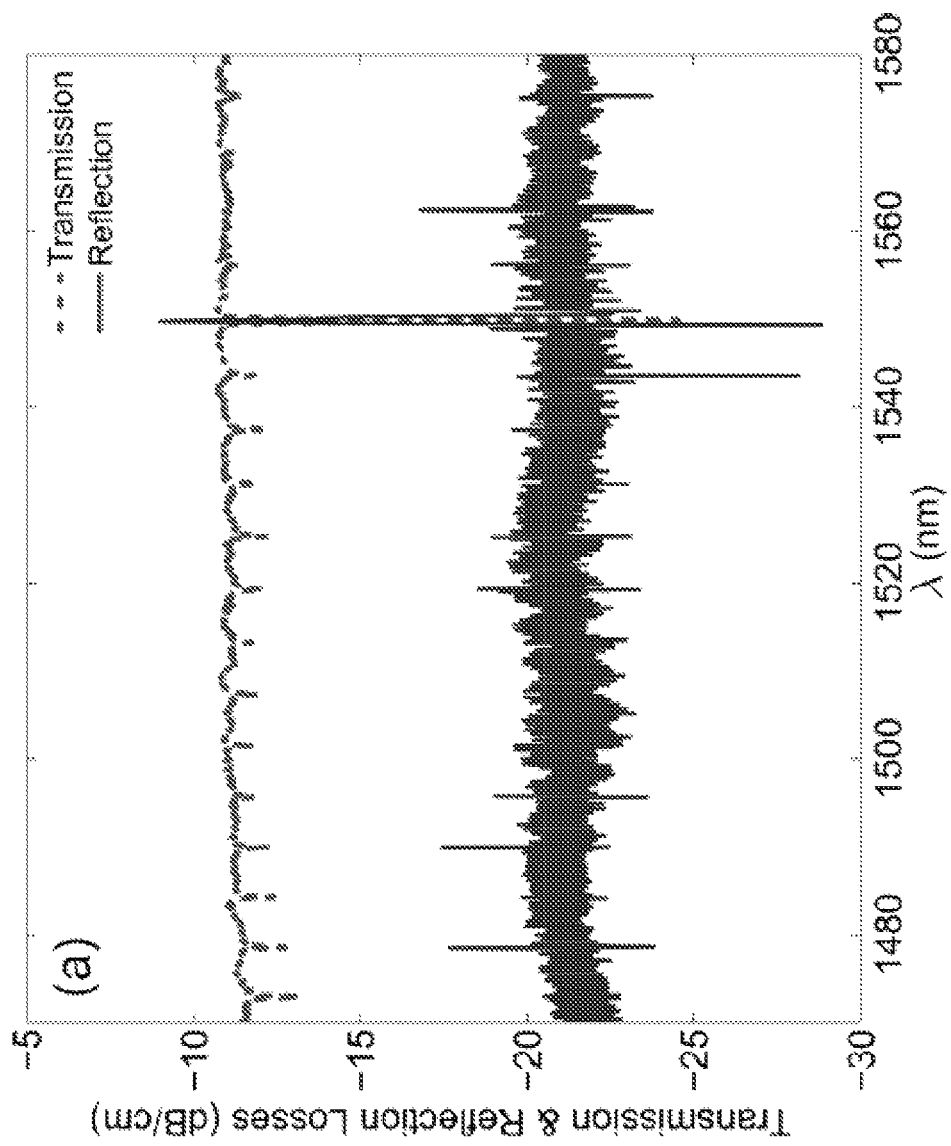

is the normalized wavelength of light, $L_t$ is the circumference of the DBR-MRR, $n_e$ is the effective index of the ring waveguide, $\lambda_0$ is the design wavelength, and $\lambda$ is the operating wavelength;

FIG. 4A shows an example where a single bus DBR-E-MRR produces a narrow transmission window at a design wavelength: as shown in B near resonance; and C, over a larger wavelength range, for $m_1=1$, $m_2=1$; an off-resonance etalon for the single bus DBR-E-MRR, e.g. $m_1=0.988$ and $m_2=1.012$ produces a sharp transition mirror shown in D; and a double bus DBR-E-MRR can produce a multiple-output reflector, where there may be output power at all four ports and a different spectral response at each port, as shown in E;

FIG. 5A shows a scanning electron microscope (SEM) image of a partially processed half-ring DBR-MRR with apodized grating on the top half of the ring; and B, a SEM image of a prototype full-ring DBR-MRR with grayscale grating;

FIG. 6 shows a DBR-MRR schematic representation with a gap to the ring along the circumference thereof;

FIG. 7 is a schematic representation of a quasi-continuously-tunable laser with A, output along main laser waveguide, and B output along separate waveguide for filtering amplified spontaneous emission; C is a schematic representation of a narrow linewidth laser whereby the DBR-MRR selects a single wavelength for lasing: the second cavity reflector is a broadband high reflectivity coating on one end of the bus waveguide; and, D is a schematic representation of a quasi-continuously-tunable laser where multiple DBR-MRR rings on each end of the lasing cavity are cascaded in series to achieve the desired comb profile, and to permit fine tuning as each ring can be tuned individually. Cascading of higher order grating rings or etalon rings enable reflection spectra not available by a single ring;

FIG. 8 shows a schematic diagram of a microring resonator integrated with a reflective element characterized by the scattering matrix S; the reflective element couples two modes propagating in opposite directions; superscripts + and − are used to denote the fields propagating in the direction of the arrows and in the opposite direction, respectively;

FIGS. 9 A, B, C, and D show contour plots of the reflectance of the integrated microring for different values of $\alpha^2$ and $\tau^2$ on the $\Theta$-r domain, respectively; A, $\alpha^2=1$, $\tau^2=0.9$; B, $\alpha^2=1$, $\tau^2=0.8$; C, $\alpha^2=0.95$, $\tau^2=0.9$; and D, $\alpha^2=0.95$, $\tau^2=0.8$;

FIG. 10 shows A, contour maps of critical reflection coefficient, $r_c(0)$, and B, the resultant reflectance $|a_{1c}^-|^2$ from the integrated microring on the $\tau^2$-$\alpha^2$ plane;

FIG. 11 shows contour plot and reflectance spectra for a comb reflector: A, the plot of $|a_1^-(\Theta,r)|^2$ overlaid with the reflection profile of the reflective element $r(\Theta)$ (dashed line), with a periodic peak reflection at $\Theta=2m\pi$; and B, reflectance spectra of the Fabry-Pérot MRR (FP-MRR) for various values of $\alpha^2$. The Fabry-Perot (FP) reflection coefficients are set to their corresponding critical value $r=r_c(0)$;

FIG. 12 shows A, a single peak reflector contour plot where the reflection profile of the reflective element (dashed line for half-ring DBR-MRR and dotted line for full-ring DBR-MRR) can be used to realize a single peak reflector; and B, reflectance spectra of the single-peak DBR-MRR configuration;

FIG. 13 shows a schematic diagram of a DBR-E-MRR where each DBR mirror element is defined symmetrically by the dashed lines, which gives the extra length Λ for the ring portion;

FIG. 14 shows a narrowband transmission filter configuration obtained using the effective mirror model with A, the overlaid reflection profile of the etalon and B, the resultant transmission response. Under the lossless condition, the sum of reflection and transmission power at any point is unity;

FIG. 15 shows the response of a narrow transmission filter evaluated numerically by a transfer matrix method (TMM) for A, the overlaid reflection profile; B, the resultant transmission response; C the amplitude transmission response as a function of λ; and D, the corresponding phase transmission response;

FIG. 16 shows the response for a sharp transition mirror configuration;

FIG. 17 shows a cross section view of a DBR-MRR structure in the region where the DBR-MRR structure is coupled to the bus waveguide;

FIG. 18 A shows a cross section of a structure suitable for quantum well intermixing (QWI); and, B shows an example of coupling to a gain medium using a vertical coupling with a taper (with an inset view of the overall structure); C, shows an enlarged perspective view of the structure showing the DBR-MRR and the gain medium region; and, D shows an example of coupling from a gain region to the passive DBR-MRR located vertically above the gain region;

FIG. 19 shows an SEM image of an apodized GaAs grating: A, top view showing a full ring DBR-MRR, and, B angled side view showing an array of 3 adjacent devices where the etched region appears white and the sidewalls of the ring and bus waveguide are visible;

FIG. 20 shows an example of a DBR-MRR using optical fiber, in a configuration where the DBR is separately fabricated and spliced into a circuit including a optical fiber directional coupler;

FIG. 21 shows the wavelength-dependent response computed for DBR-MRR configurations where the grating order is unity, and for higher order gratings, for half-ring and full ring configurations;

FIG. 22 shows A, a schematic representation of a MRR with integrated DBR; B, a SEM image of a fabricated device prior to top cladding deposition; C, a close up view of the portion of the image inside the rectangle shown in B; and, D, an angled view of the modulated index ring and waveguide;

FIG. 23 shows the reflection and transmission spectra of a reflective ring resonator according to the model.

Figure 24:
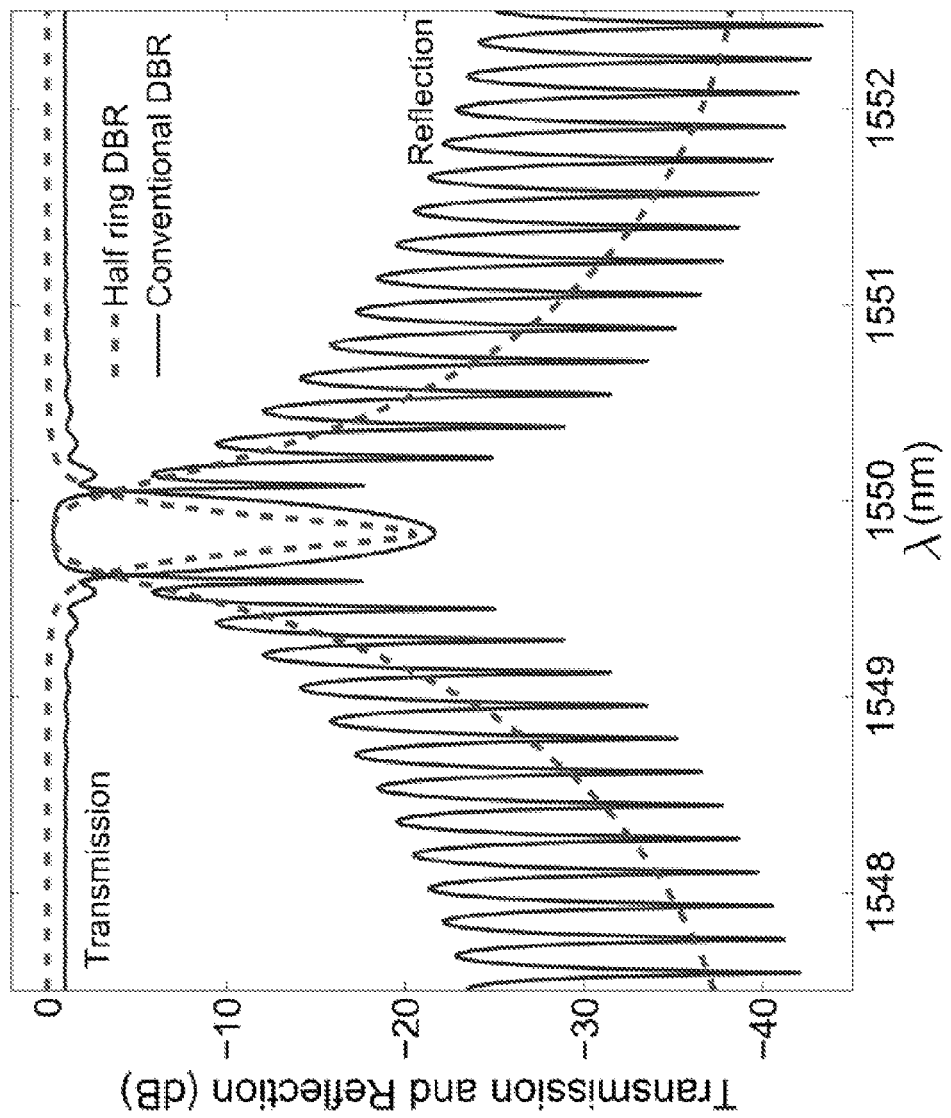

FIG. 24 shows A, the measured reflection and transmission spectra of a reflective ring resonator; and B, an expanded view of the measured spectra in A around the main reflection peak; the dashed lines show the simulated spectra of a fitted model.

DESCRIPTION

Exemplary embodiments may be better understood with reference to the drawings, but these examples are not intended to be of a limiting nature. Embodiments of this invention may be implemented in hardware, firmware, software, or any combination thereof, and may include instructions stored on a machine-readable medium, which may be read and executed by one or more processors.

When describing a particular example, the example may include a particular feature, structure, or characteristic, but every example may not necessarily include the particular feature, structure or characteristic. This should not be taken as a suggestion or implication that the features, structure or characteristics of two or more examples should not or could not be combined. When a particular feature, structure, or characteristic is described in connection with an example, a person skilled in the art may give effect to such feature, structure or characteristic in conjunction with other embodiments except when such combination is specifically excluded.

Reflective devices based on coupling of ring resonators have been analytically studied and experimentally demonstrated. At each resonance wavelength, an ideal microring resonator may support two degenerate counter propagating resonance modes which are uncoupled. However, due to large field enhancement in a high Q ring, even a small perturbation can create strong coupling between the two modes. Mode coupling causes splitting of the two degenerate resonance wavelengths. Unwanted coupling caused by imperfections in a resonator affects the performance of microring based photonic devices and generally is considered undesirable.

Herein, the spectral response properties of a grating in a ring resonator device are analyzed using two different computational techniques. In the first, the transfer matrix method (TMM) is used to derive a closed form one-dimensional analytical solution for fast simulation in the steady state case. In the second, a graphical technique enables an understanding of the effects of design parameters such as ring circumference, coupling factor, loss, DBR period, contrast, number of pairs, on the spectral response of a structure.

Using these techniques, a person of skill in the art having the benefit of this disclosure can design an optical device to have particular functionalities and advantages when compared to the individual components thereof; for example: a single reflection peak with high SMSR and wide FSR, for example; a narrow full width at half maximum transmission band, and a sharp spectral transition, with high extinction ratio and low insertion loss. Such devices may replace a SGDBR and may have additional useful properties. The one-dimensional computational model has numerous simplifying assumptions and may often be used for initial design purposes. To more accurately predict the responses and to model non-ideal effects such as refractive index dispersion, waveguide dispersion, scattering loss, and random fabrication imperfections, another technique based on coupled-mode theory may be used to obtain a 3D approximation in cylindrical coordinates. The calculation of the coupling of counter propagating fields due to arbitrary perturbations along the ring shows results comparable to finite element method (FEM) results but generally requires considerably less time to process.

The use of the graphical design method and the coupled-mode approach is described herein along with fabrication techniques and simulation results. Other design approaches can also be used, such as FEM.

An optical mirror device comprising a single microring resonator with an integrated reflective element is described along with a graphical method to engineer overall frequency-dependent response without needing detailed numerical computations, at least for preliminary design. This analysis of a microring resonator with a distributed Bragg reflector integrated into or coupled thereto may be applied to more general reflective elements as well, including chirped gratings and grating etalon combinations. Configurations of a comb reflector, a single-peak reflector, a narrow transmission filter, and a sharp transition mirror are described as examples. Such devices may have typical dimensions of a microring resonator, allowing dense integration of the elements as planar photonic devices.

Figure 1A:
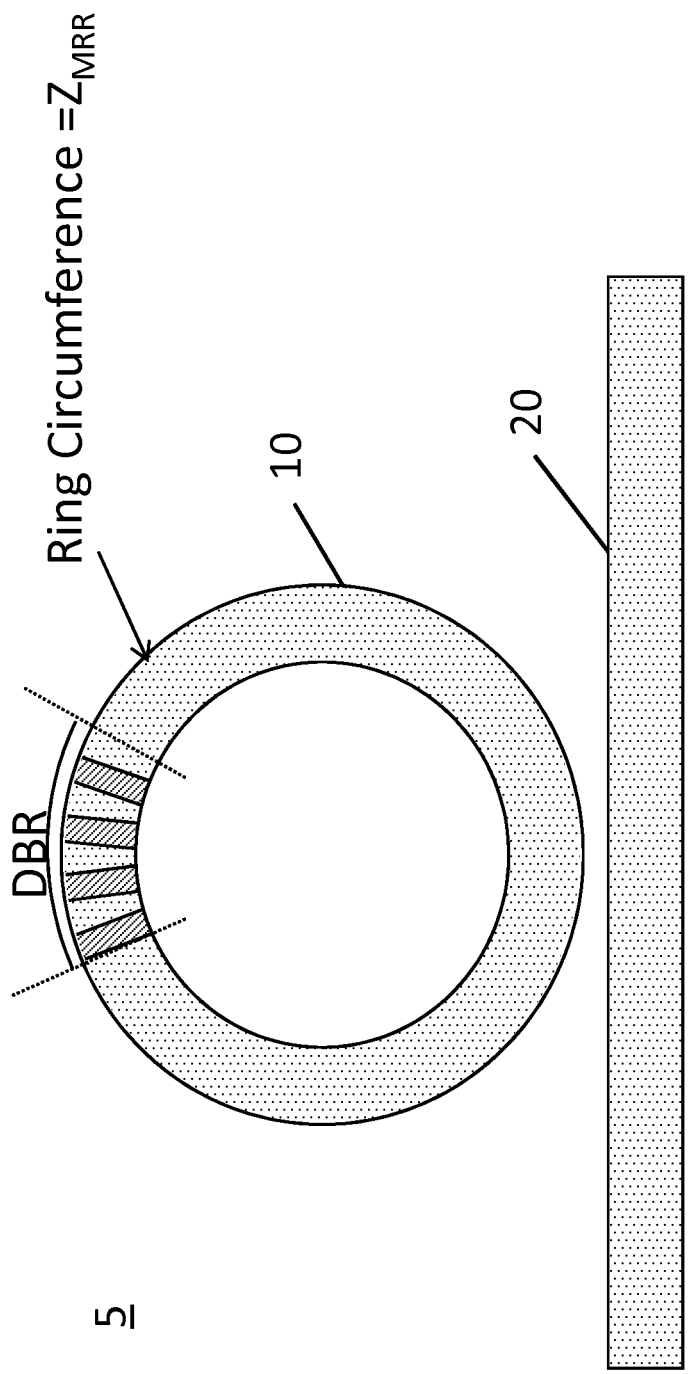
FIG. 1A shows a representation of a DBR-MRR structure which may be fabricated, for example, in on a substrate region that is 8 μm long by 9 μm wide and achieves the same spectral response as B, a typical SGDBR mirror with 45 repetitions that occupies a 174 μm long region of width 5 μm. The dimensions assume a 1 μm wide waveguide and 2 μm border per side in both cases. Overall, the device area is 72 μm² for the DBR-MRR, which is 12× smaller than the equivalent SGDBR of area 870 μm².

In FIG. 1A, a MRR 10 is coupled to another optical waveguide 20 to form a distributed Bragg reflector in a microring resonator 5. This coupling is shown schematically as having a portion of the MRR 10 being in proximity to a region of the optical waveguide 20. A person of skill in the art would appreciate that the coupling coefficient $\kappa^2$ between the MRR 10 and the optical waveguide 20 would depend, for example, on the proximity of the two structures in wavelengths, the refractive indicies of the two structures, and that of any cladding or substrate medium on which the other structures are formed.

Figure 1B:
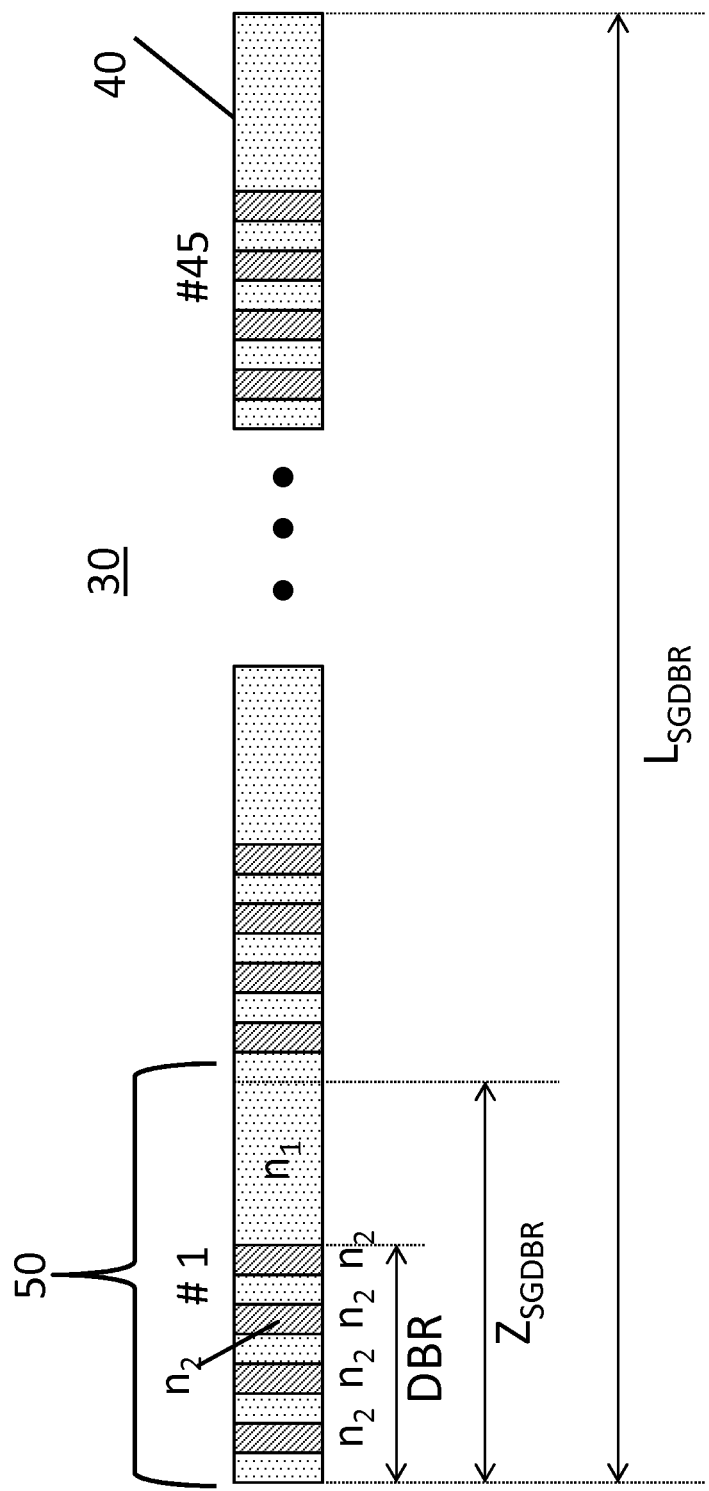

FIG. 1B shows a typical SGDBR 30, comprising a plurality of DBR regions 50 spaced along its length. In this example, each of the DBR regions is identical, although other configurations are known and may be used. Each of the DBR regions 50 may include a plurality of modified refractive index elements having a refractive index $n_2$, spaced apart along the length of the DBR region, where the native refractive index of the waveguide is $n_1$. In this configuration, there may be a region of refractive index $n_1$ separating the periodic bursts of refractive index $n_2$. The distance between the start of successive DBR regions is $Z_{SGDBR}$, and the overall length of the SGDBR is $L_{SGDBR}$.

The reflectivity spectrum of a DBR-MRR 5 can be engineered to be similar to that of a much longer SGDBR 30. Using the DBR structure of FIG. 1A where the circumference Z of the microring resonator 10 is twice the period Z of the SGDBR ($Z_{MRR}=2Z_{SGDBR}$), an equivalent FSR may be achieved. For a given $L_{SGDBR}$, the FWHM of the two structures may be matched by choosing an appropriate coupling coefficient $\kappa^2$ between the MRR 10 and the optical waveguide 20, which affects the amount of field built up in the ring; that is, a quality factor, Q, of the ring. The FWHM may be reduced without increasing device size, an attribute which may not be feasible in a SGDBR. The peak reflectivity of each peak in a DBR-MRR can be controlled by adjusting, for example, the index contrast $n_2-n_1$ and other parameters of the grating in the ring.

Also, the multiple reflection encounters between the optical field and each of the refractive index perturbations of the grating in the MRR ring 10 may relax the requirement for tight fabrication tolerances ordinarily requiring uniformity of grating dimensions across a wafer. Moreover, as will be seen, the reflection spectral side lobes may be effectively suppressed in embodiments of the DBR-MRR. Generally, the output facets of the coupled waveguide 20 should be coated with an anti-reflective coating or angled facet so as to suppress unwanted reflections therefrom at a waveguide air interface, or other discontinuity. However, in circumstances such as where a resonant cavity is to be formed, one or more of the facets may be configured to provide for a reflection in lieu of using a MRR. Such an example would be a laser device as described herein.

A single peak in reflection is usually achieved by a long, continuous DBR, or SGDBR. The equivalent DBR-MRR structure is much smaller in dimensions, may also achieve a narrower FWHM, effectively eliminate reflection side lobes, and is less sensitive to fabrication tolerances. Moreover, the filter roll-off may be faster than conventional linear gratings as illustrated in FIG. 24.

Figure 2A:
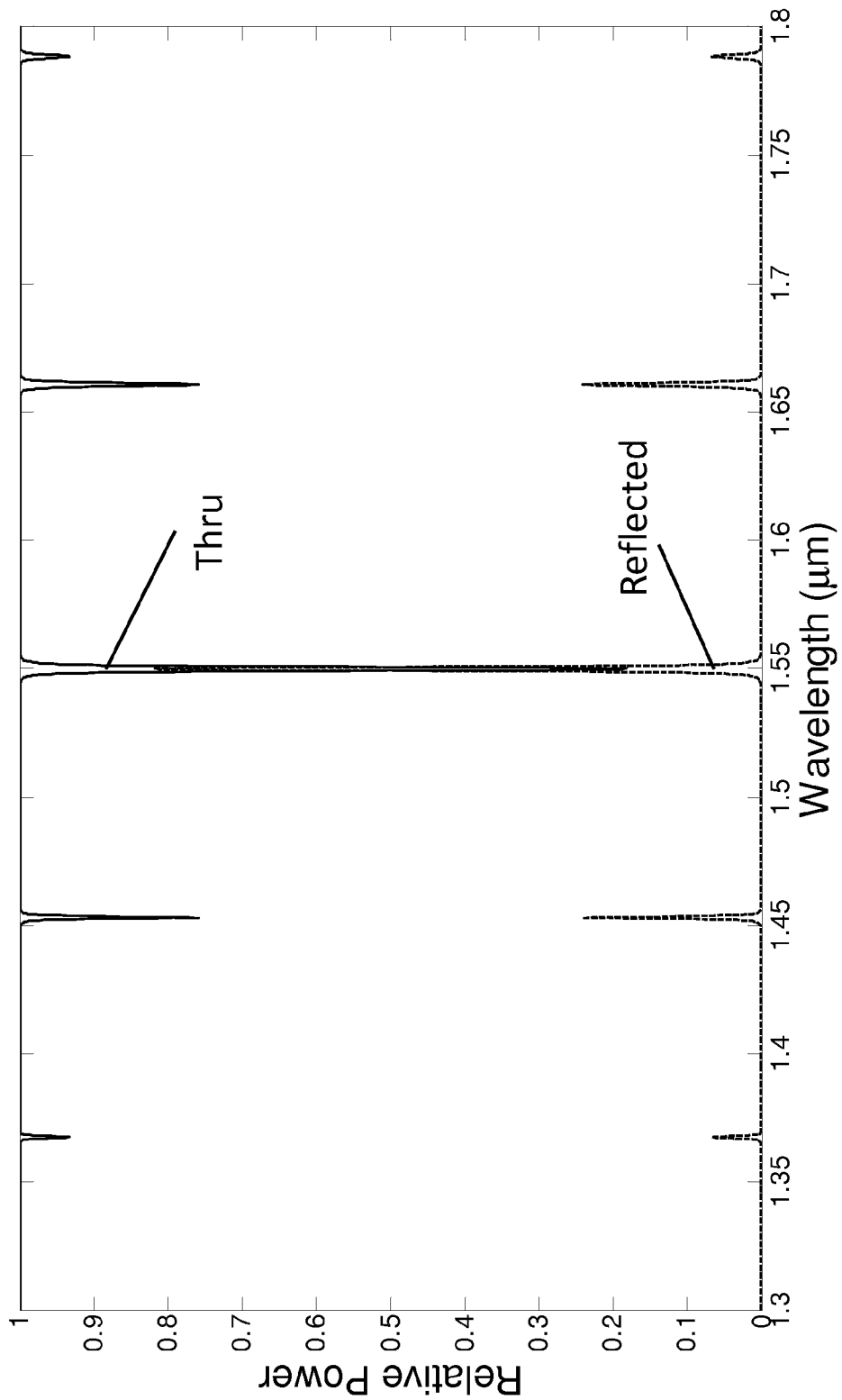
FIG. 2 shows simulation results for the reflective structures described in FIG. 1A, DBR-MRR, and B, SGDBR. Note that the DBR-MRR in A does not exhibit side-lobe ripples near the reflection peaks.
Figure 2B:
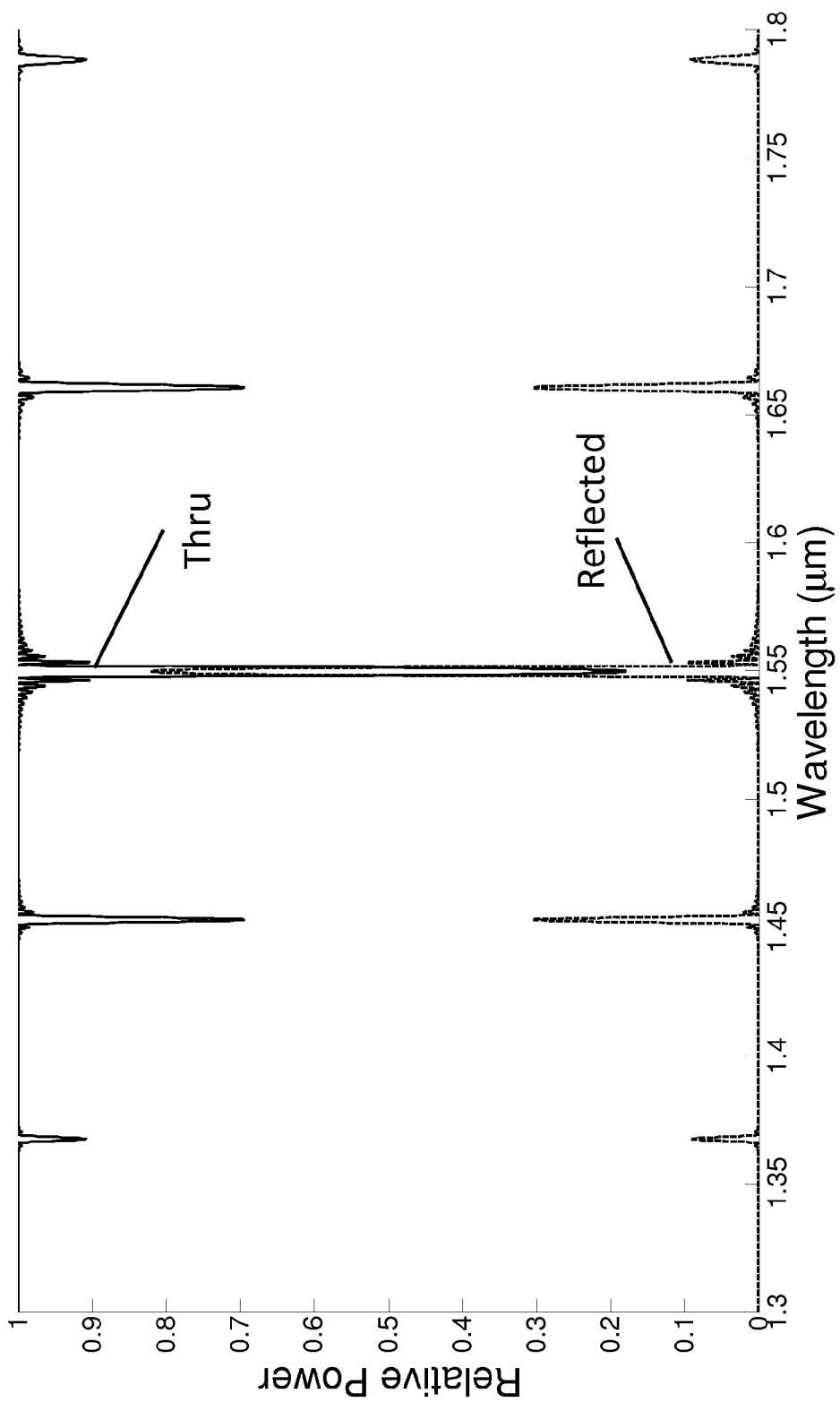

In an example, a very long DBR structure with continuous gratings (116 μm long by 5 μm wide, not shown here) could achieve a single reflection peak. Such a device structure may be replaced by an equivalent, but much smaller half-ring DBR-MRR or a full-ring DBR-MRR (8 μm long by 9 μm wide) resulting in an 8× reduction in substrate area. FIG. 2A shows the spectral response of the DBR-MRR and FIG. 2B shows the spectral response of the equivalent SGDBR. The term "ring" is used with the understanding that the "ring" need not be circular. A racetrack shape, or other topologically equivalent shape, is usable providing only that the radius of curvature along the ring is sufficiently large with respect to the operating wavelength so as to keep radiative losses within design limits for overall loss. Where the terms "half-ring" and "full-ring" are used, they are meant to figuratively describe the situations shown in FIGS. 3A and 3B, respectively, where the overall linear extent of the DBR is compared with the circumference of the MRR.

Figure 3A:
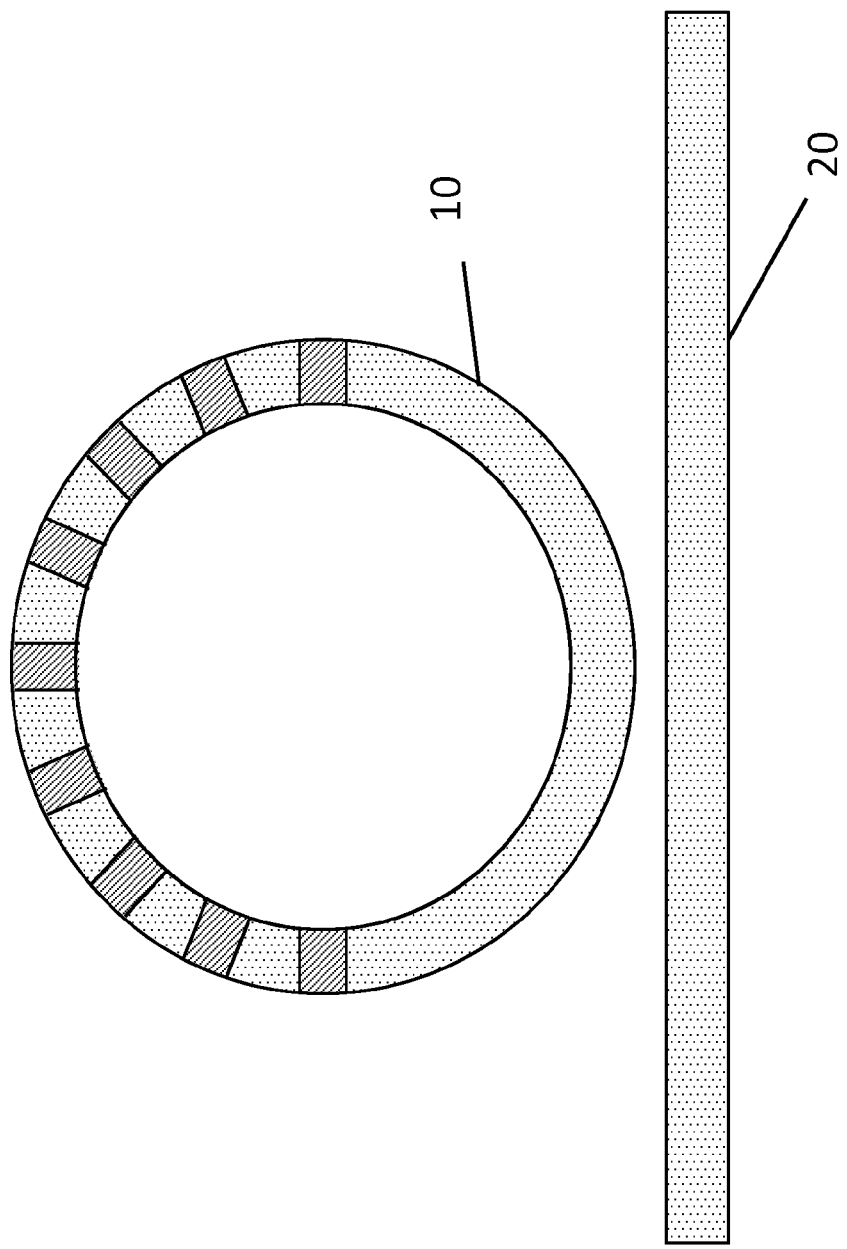
FIG. 3 shows the computed response of A, a half-DBR and B, a full-DBR ring device where.
Figure 3B:
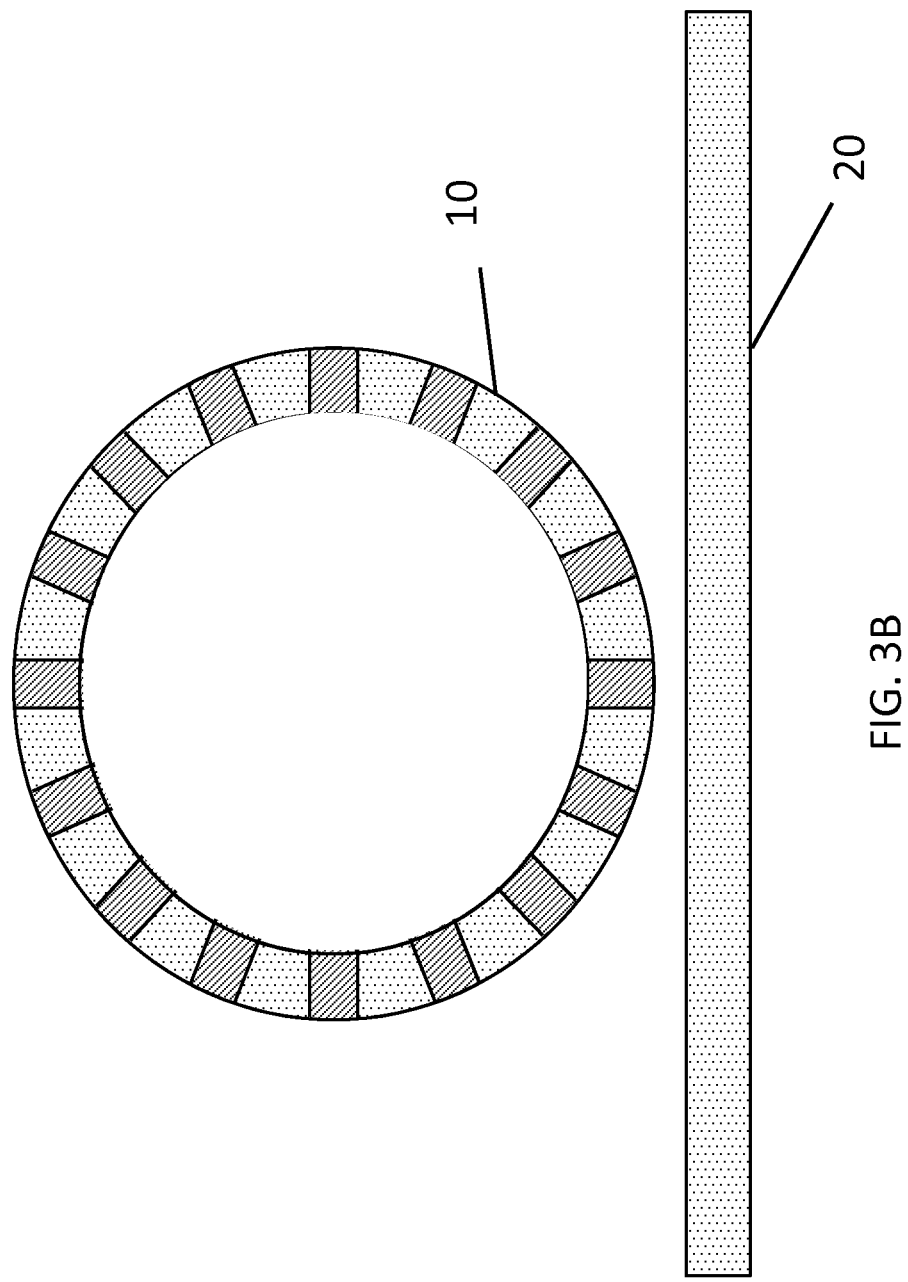

Using the half-ring DBR-MRR and the full ring DBR-MRR configurations as shown in FIGS. 3A and 3B, respectively, the side-lobe ripple of the DBR-MRR configuration near z=0 may be effectively suppressed. Although ideal half-ring and full-ring DBR-MRR devices have a perfect null in reflectivity at non-zero even integers of z, the ring resonance may result in weak reflections near these values.

By inserting an etalon structure in the MRR 10 with a gap equal to a half-integer multiple of the effective design wavelength $\lambda_0$ (FIG. 4A), a narrow transmission filter may be obtained. When the length of the etalon in the single bus configuration is chosen to be offset from the resonance of the ring, the output characteristics are such that sharp transition mirror is obtained.

Figure 4C:
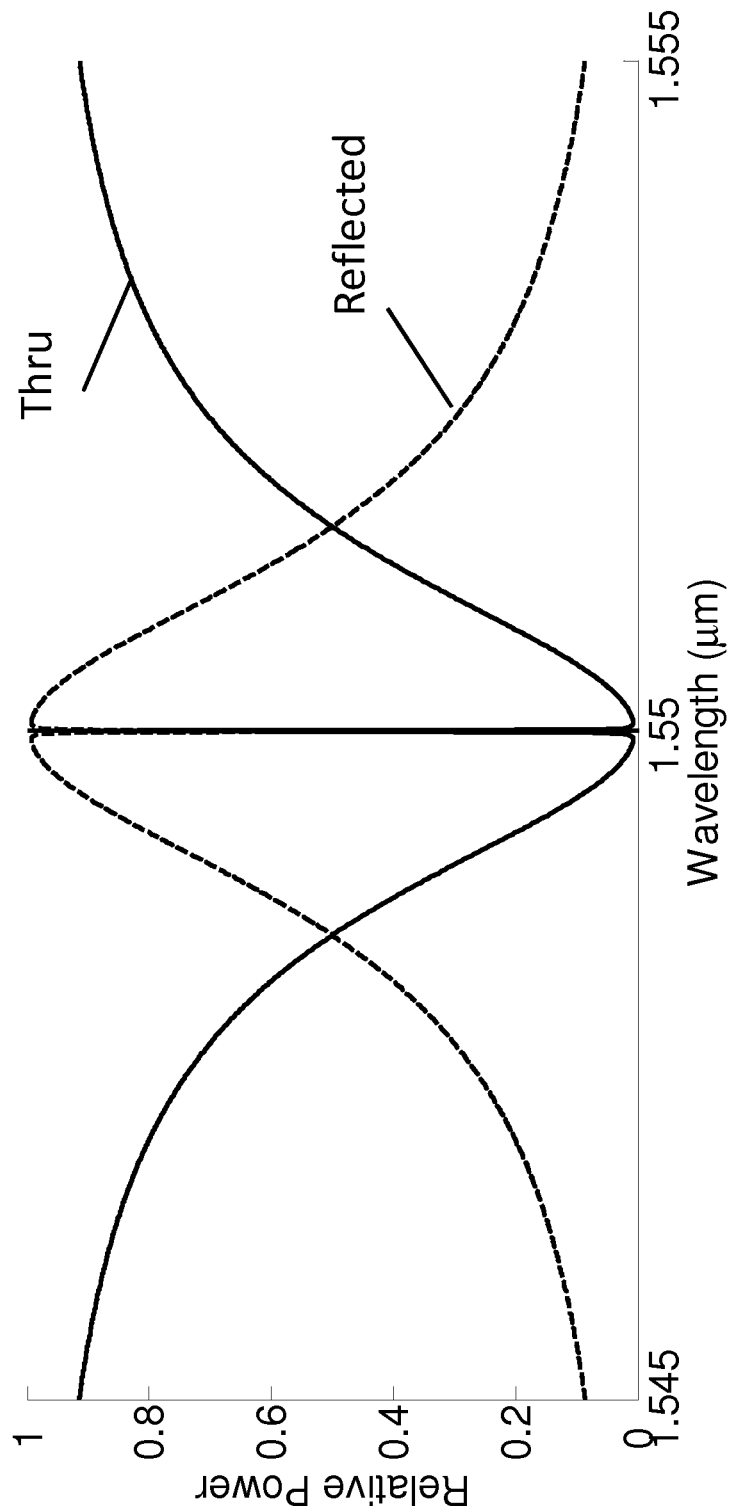
Figure 4D:
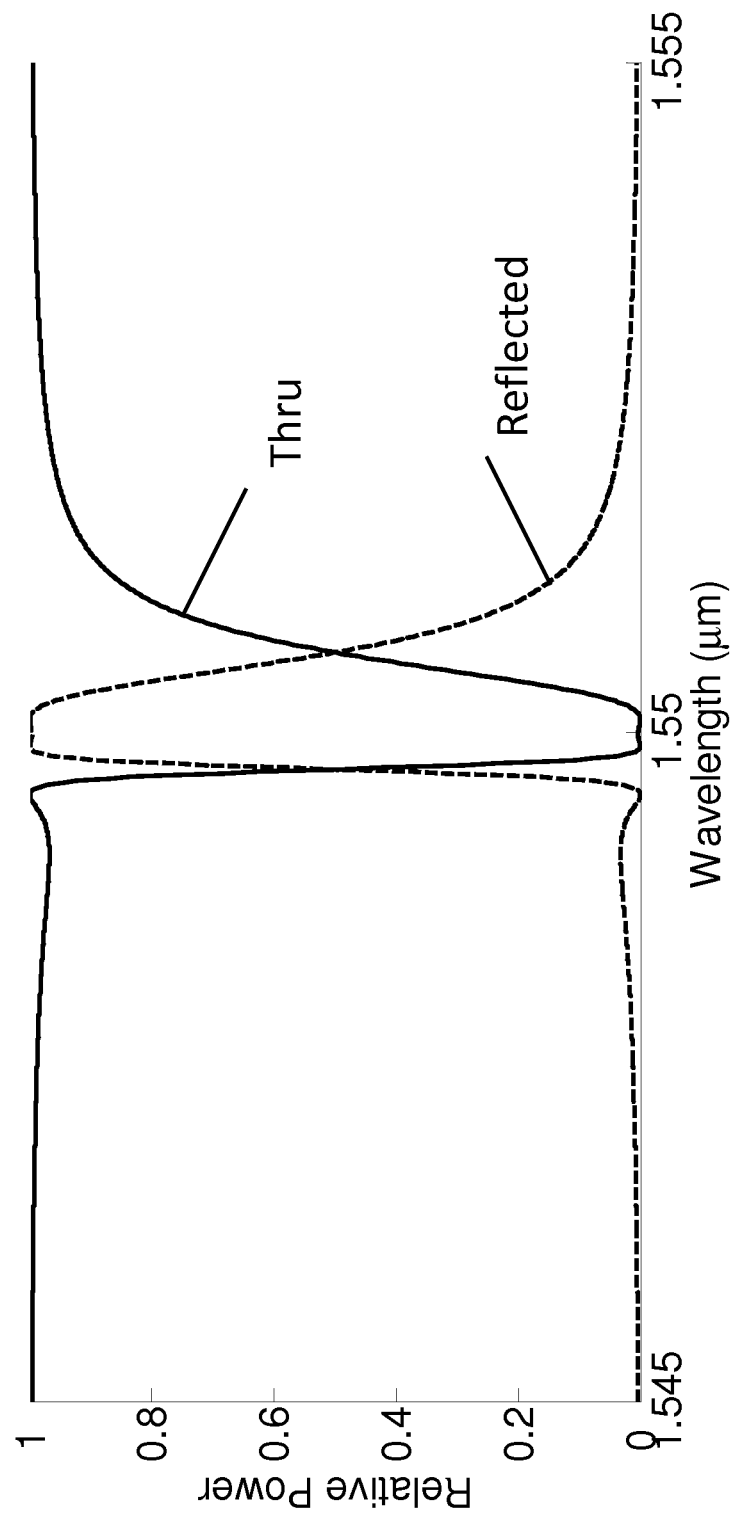
Figure 4E:
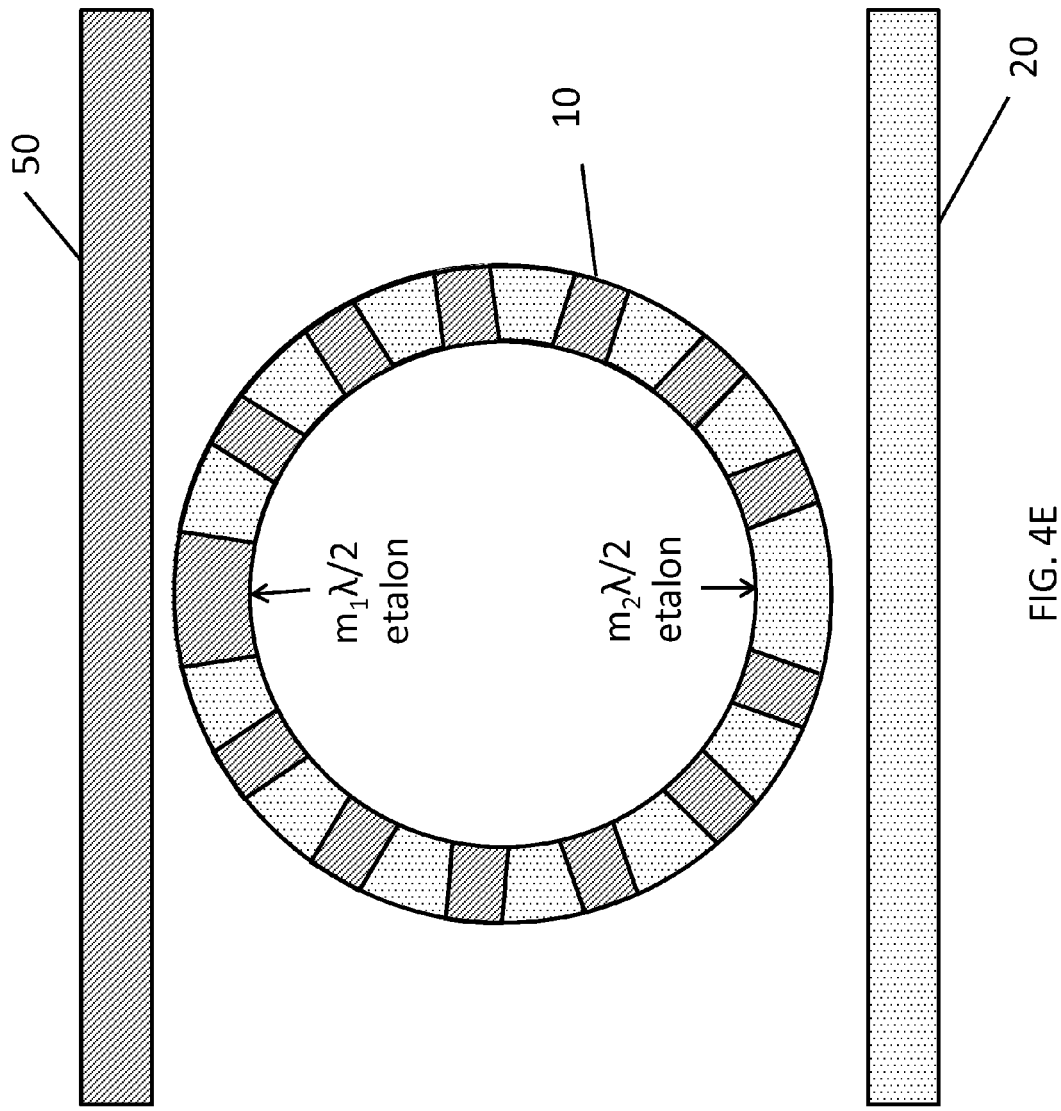
Figure 4F:
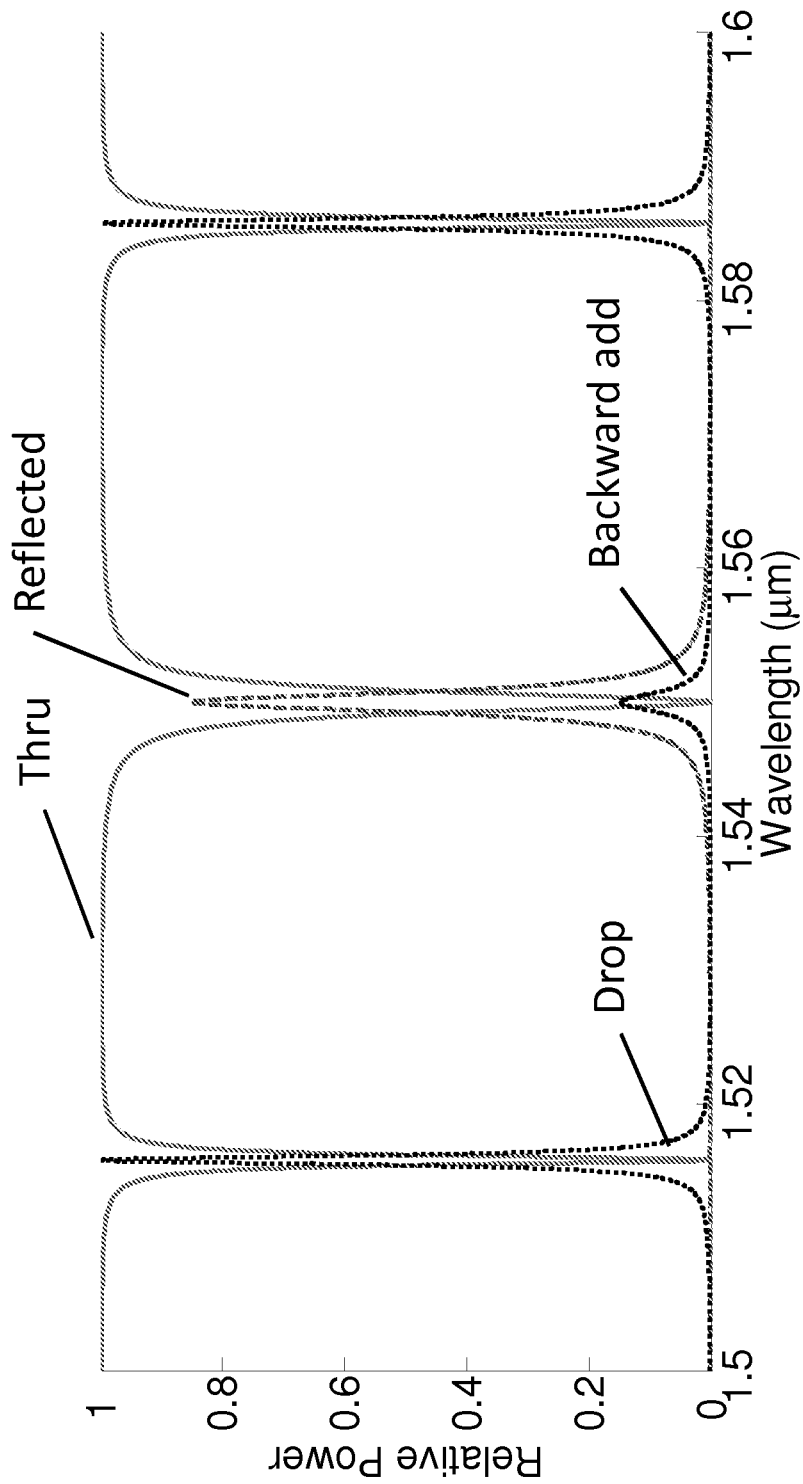

A single bus DBR-E-MRR forming a narrow transmission window at the design wavelength as shown in FIG. 4C for $m_1=1$, $m_2=1$. The response far from the design wavelength is shown in FIG. 4D. An off-resonance etalon for the single bus DBR-E-MRR, e.g. $m_1=0.988$ and $m_2=1.012$ would yield a sharp transition mirror shown in FIG. 4E. A configuration adding another bus waveguide 50 coupled to the DBR-E-MRR as shown in FIG. 4E to form a double bus device, can be used to produce a multiple-output reflector, where there may be output power at all four ports and a different spectral response at each port, and whose response is shown in FIG. 4F. This device may, for example, be used as an add-drop multiplexer in optical networks.

The gratings on the microring resonators may be fabricated, for example, either vertically (two-step or grayscale lithography) or horizontally (apodized). Other fabrication techniques may be used as well, as are now known or may be subsequently be developed. Here, apodization refers to varying the width of the waveguide. This apodization of width may be rectangular, sinusoidal, triangular, or another shape so as to achieve a desired reflection strength and spectral profile. Vertical gratings may be fabricated using a two-step known method using vertical anisotropic etching, resulting in difference in height of the material. The two-step approach begins with patterning and etching the ring 10 and the waveguide 20 in a substrate. Next, the substrate surface is planarized with a material such as benzocyclobutene (BCB) polymeric resin. The gratings are then patterned on the ring 10, and a second etch performed.

The grayscale method involves patterning the ring 10 and waveguide 20 using a high exposure dose and the gratings using a low exposure dose, in a single manufacturing stage. This process creates two different mask heights, one for the waveguide and ring, and another for the gratings. By transferring the different mask heights to the wafer during etching, one may achieve vertical gratings on a microring without a planarization process or a second etching step.

Apodized gratings may be generally easier to fabricate than the vertical gratings. When patterning the waveguide and the ring, the gratings may be incorporated in the pattern, and with a single patterning and etching step, the gratings are fabricated along with the waveguide and the ring (see FIGS. 5A, B). With apodized gratings, the refractive index contrast of the gratings may be manipulated because the index contrast is controlled primarily by the pattern rather than a fabrication parameter such as etch depth. Other apodizing techniques may be used.

Bragg gratings may be directly patterned on the microring resonator (e.g., by apodized or vertical etch) or separated by a small distance from the ring along its circumference as shown in FIG. 6. In each geometry, the strength of the reflection coefficient from the grating itself can be controlled. In the apodized example, this may be done by setting the change in width of the apodization ($\Delta w$). In the vertical etch embodiment, the etch depth can be controlled. In the separated grating embodiment, the gap between the ring and the grating teeth ($g_1$) as well as the width of the grating teeth ($W_c$) may be used to similar effect. In the apodized and in the separated embodiments, the gratings may be patterned on the inner side of the ring, the outer side of the ring, or both. This provides an additional technique which may be used to control the reflection coefficient.

The period of the grating around the circumference may be a constant value so that the grating provides strong reflection at a single wavelength, or it may be chirped or sampled so that the grating provides strong reflection or phase shifts at multiple wavelengths. The combined response of the ring and grating may be significantly different than that of the grating alone due to the resonant nature of the ring. While details of these gratings are not described herein, they will be familiar to a person of skill in the art, who may use such grating in accordance with the teachings herein to produce a variety of optical components and devices.

Figure 7C:
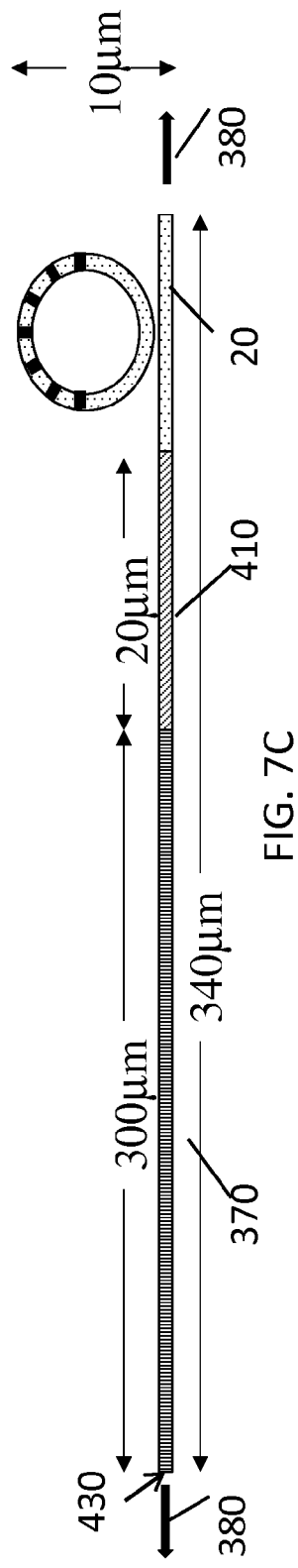

DBR-MRR optical elements may be used, for example, as cavity mirrors for compact narrow-linewidth single-frequency or tunable laser sources. As shown in FIG. 7A, a compact tunable laser 310 can be comprised of optical elements having parameters selected to control the gain 370 and, the phase 385 of the cavity and also the center wavelengths of each of the DBR-MRR end mirrors 365. The end mirror may be, for example, a single $\lambda/4$ DBR-MRR comb mirror 365, so that a comb reflectivity profile is generated to enable quasi-continuous tuning using the Vernier effect. The grating of the DBR-MRR may be a higher order grating such as $3\lambda/4$, $5\lambda/4$, ..., in order to select a desired subset of peaks from the comb. That is, the DBR-MRR 365 may be designed to be reflective at all resonances of the microring, at every other resonance, at every third resonance, or as desired. A comb version of the DBR-E-MRR (long etalons) can be used to produce a multiple-output-port mirror, as shown in FIG. 7B. The phase-control section can be a MRR 385, or other optical element, or a portion of the coupled waveguide 20 for electrooptical or thermal tuning 410 (as shown in FIG. 7C) while providing a low insertion loss (see, for example, "Micrometer-scale silicon electro-optic modulator", by Qianfan Xu, Nature Letters, Vol. 435, 19 May 2005 which is incorporated herein by reference). A doped-waveguide gain section 370 is disposed between the mirrors 365 and is pumped by well known techniques (not shown). Low-threshold lasers are possible since the mirror reflectivities can be high and thus the gain cavity 370 can be small; the device footprint may be 100× smaller than conventional DBR tunable lasers. One of the end mirrors may be a cleaved or etched facet with a highly reflective coating (see FIG. 7C, 430).

One end mirror may be a DBR-MRR structure (e.g., 365), and the other end mirror is either a cleaved facet, etched facet, or a cleaved or etched facet with a broadband highly reflective (HR) coating (see FIG. 7C, 430). The broadband HR coating may be formed, for example, by deposition of a SiNx and SiO2 dielectric Bragg stack on the facet. This alternate geometry, which may be used in any of the examples, obviates the needing to align the DBR-MRR wavelengths on the two cavity ends to be the same, and may simplify fabrication. Such a configuration can be used, for example, to make single wavelength lasers, tunable lasers, or lasers with other desirable features, including active optical sensors or other active photonic integrated circuit elements.

Figure 7D:
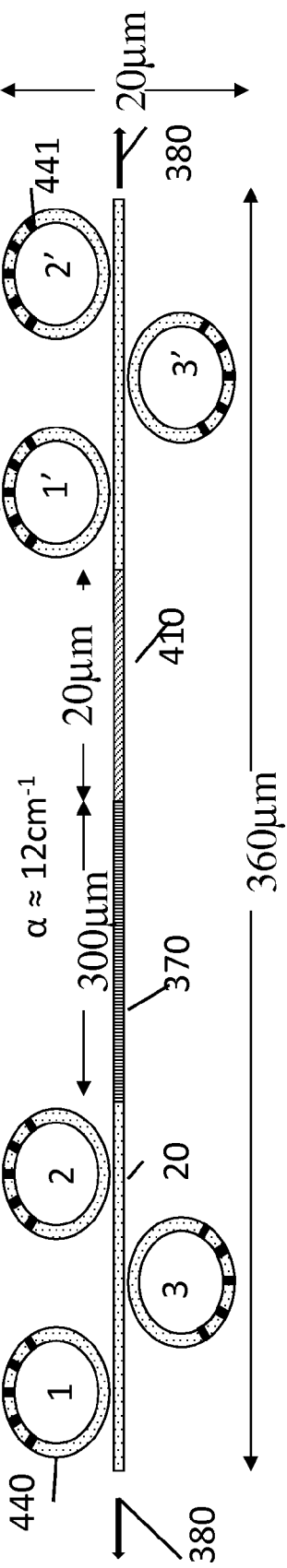

As shown in FIG. 7D, the grating may occupy some fraction of the ring, rather than the half ring or the full ring. This arrangement may result in a reflection peak of unequal amplitude at each resonance. As described below, a higher-order grating may be used to generate unequal amplitude peaks at every $q^{th}$ resonance, where q=1, 2, 3, is some chosen natural number. FIG. 7D also illustrates that, by cascading several micro rings with different diameters and different center wavelengths (1 and 1' are close in frequency, 2 and 2' are close in frequency, 3 and 3' are close in frequency), the exact comb pattern and tuning can be better controlled better.

While the examples herein often use waveguide elements fabricated on an optical substrate, optical waveguides may also include optical fiber, which may be doped to provide a gain section or a phase control section, as well as the DBR-MRR, where the grating may be written by optical bleaching or other techniques. Composite designs using components fabricated on an optical substrate, optical fiber, semiconductor devices and the like may also be used to achieve the characteristics described herein.

In an example, a method of design of a single microring resonator 10 with an integrated reflective element S is described, using the graphical method. The ring 10 has a total circumference $L_t=L+L_s$, where L and $L_s$ correspond to the length of the ring 10 and the reflective element S respectively, as depicted in FIG. 8. All electromagnetic fields are assumed to be normalized in power.

For simplicity, the coupling and transmission coefficients, $\kappa$ and $\tau$, of the ring-bus coupler and the round trip field attenuation in the ring $\alpha$ are assumed to be wavelength independent, although this is not intended to be a limitation. The analysis presented may be extended to a more accurate performance model which may involve wavelength dependent coefficients, so as to account for refractive index and waveguide dispersions.

In an example, consider a passive case, $0<\alpha\leq1$. While this is a passive example, this is not intended to preclude the incorporation of gain elements such as semiconductor optical amplifiers, doped-fiber optical amplifiers, and the like into the structure, such as has been previously described. Where the gain element is a semiconductor device, the device may be treated as a lumped device and incorporated in the scattering matrix. Doped-fiber components may use, for example Erbium, Neodymium or other rare earth elements in combinations that are known or may be developed for producing optical gain over a bandwidth when pumped by a source of energy. For the purposes of this discussion, the characteristics of the gain element may be lumped with the scattering matrix S.

The scattering matrix of the integrated reflective element be expressed as given $$S = \begin{pmatrix} S_{11} & S_{12} \\ S_{21} & S_{22} \end{pmatrix} \quad (1)$$

If the reflective element is assumed to be lossless, passive and reciprocal, the scattering matrix is:

$$S = \begin{pmatrix} ire^{i\psi} & t \\ t & ire^{-i\psi} \end{pmatrix} e^{i\phi} \quad (2)$$

which satisfies the lossless condition $S^\dagger S = I$ and the reciprocity condition $S_{12}=S_{21}$. We use the $e^{-i\omega T}$ time convention. Here, r and t are the magnitude of the reflection and transmission coefficients of the integrated reflective element, respectively, such that $r^2+t^2=1$, and $\phi$, $\psi$ are phase terms.

The steady state solutions of the transmitted and reflected fields normalized to the input signal of the microring are:

$$b_1^+ = \frac{\tau - \alpha t(1+\tau^2)e^{i(\theta+\phi)} + \alpha^2 \tau e^{i2(\theta+\phi)}}{1 - 2\alpha\tau e^{i(\theta+\phi)} + \alpha^2\tau^2 e^{i2(\theta+\phi)}} \quad (3)$$

$$a_1^- = \frac{i\alpha r(1-\tau^2)e^{i(\theta+\phi-\psi)}}{1 - 2\alpha\tau e^{i(\theta+\phi)} + \alpha^2\tau^2 e^{i2(\theta+\phi)}} \quad (4)$$

where $K = \begin{pmatrix} \tau & i\kappa \\ i\kappa & \tau \end{pmatrix}$ is the coupling matrix; $\kappa$, $\tau$ are amplitudes of coupling and transmission coefficients, respectively; $a_1^+=1$, $b_1^-=0$; and, a lossless coupling condition, $\kappa^2+\tau^2=1$, are assumed where:

$$\phi = \angle S_{12} \quad (5)$$

$$\theta = \beta L \quad (6)$$

are the transmission phase shifts of the reflective element and the ring portion, respectively, and $\beta$ is the modal propagation constant in the ring waveguide.

$$\Theta = (\theta-\theta_0)+(\phi-\phi_0) \quad (7)$$

is defined as total detuned round trip phase shift in the integrated micro-ring, where the subscript represents the quantity at the design wavelength $\lambda_0$. Unless otherwise specified, L is chosen to satisfy $\theta_0+\phi_0=2m\pi$ for some integer m (resonance at the design wavelength), and thus $a_1(\theta+\phi)=a_1^-(\Theta)$ and $b_1^+(\theta+\phi)=b_1^+(\Theta)$.

Although Eqs. (3) and (4) were solved assuming the reflective element is positioned at the center of the ring, the reflection and transmission field amplitude $|a_1^-|$ and $|b_1^+|$ in the model are not dependent on the relative position of the integrated element in the ring, provided that the inserted element is not directly coupled to the bus waveguide. Only the phase of the reflection coefficient $\angle a_1^-$ is affected by the relative position of the reflective element. The transmission phase $\angle b_1^+$ is not affected.

If the attenuation coefficient $\alpha$ of the microring and the transmission coefficient $\tau$ of the ring-bus waveguide coupler are given parameters of the microring, $r(\Theta)$ and $t(\Theta)$ may be engineered using Eqs. (3) and (4). $\psi$ may be neglected, as it does not affect the output power as seen from Eqs. (4). For a lossless reflective element, $t=\sqrt{1-r^2}$ and therefore Eqs. (3) and (4) need evaluation only in the $\Theta$-r domain. The condition for obtaining the maximum reflection that can be realized from the integrated microring for given $\alpha$ and $\tau$ may be found by solving the differential equation $\nabla_{\Theta,r}|a_1^-(\Theta,r)|_2=0$, which yields the reflective element critical reflection coefficient profile $$r_c(\theta) = \frac{\sqrt{(1-\alpha^2\tau^2)^2 + 4\alpha^2\tau^2\sin^2\Theta}}{1+\alpha^2\tau^2} \quad (8)$$

for $-\pi/2 \leq \Theta+2m\pi \leq \pi/2$. The resultant maximum reflection amplitude may be evaluated by substituting Eq. (8) into Eq. (4):

$$|a_{1c}^-| = \frac{\alpha(1-\tau^2)}{1-\alpha^2\tau^2} \quad (9)$$

For constant values of $\alpha$ and $\tau$, a maximum reflectance $|a_{1c}^-|^2$ exists and is the same for continuous points in the $\Theta$-r plane. At resonance $\Theta=2m\pi$, Eq. (8) reduces to $$r_c(0) = \frac{1-\alpha^2\tau^2}{1+\alpha^2\tau^2} \quad (10)$$

which is the minimum field reflection amplitude necessary to produce a maximum reflectance from the microring. For $\alpha^2 \approx 1$ and $\kappa^2 \ll 1$, Eq. (10) reduces to $r_c(0) \approx \kappa^2/2$.

Note that the reflectance $|a_1^-|^2$ is proportional to the field buildup intensity of the − mode in the ring. A large value of $|a_1^-|^2$ is evidence that the mode is in resonance in the structure. Therefore, the branching off of the peak reflection condition $r_c(\Theta)$ in FIG. 9 for $r_c(\Theta) > r_c(0)$ corresponds to the resonance-splitting and the separation between resonant peaks can be obtained by calculating the corresponding $\theta$ from Eq. (8) provided that $\alpha$, r, and $\tau$ are known.

The reflectance amplification factor may be written as:

$$A = \frac{|a_{1c}^-|^2}{r_c^2(0)} = \frac{\alpha^2(1-\tau^2)^2(1+\alpha^2\tau^2)^2}{(1-\alpha^2\tau^2)^4} \quad (11)$$

which represents the maximum enhancement in the reflected power due to the field buildup in the ring. The factor A can be quite large for low loss devices and thus can be used for high sensitivity sensor applications.

As $\alpha$ or $\tau$ decreases, the full width half maximum of each individual peak increases (see FIG. 9).

FIG. 10A depicts contour lines of the minimum critical reflection $r_c(0)$ and the resultant reflectance from the ring $|a_{1c}^-|^2$ on the $\tau^2$-$\alpha^2$ plane. For example, if $\tau^2=0.9$ and $\alpha^2=1$, we obtain $r_c(0)=0.053$ and $|a_{1c}^-|^2=1$ from FIG. 10, which agrees with the values from FIG. 9A. Note that $r_c(0)$ increases as $\alpha$ or $\tau$ decreases, and $|a_{1c}^-|^2$ decreases as $\alpha$ decreases or $\tau$ increases. Thus, increasing $\alpha$ increases the amplification factor A whereas increasing $\tau$ can either increase or decrease A.

Further, for a given integrated reflective element, r and $\Theta$ are related to each other. One can construct $r(\Theta)$, the reflection profile of the integrated element, as a parametric function of the total detuned round-trip-phase from $|a_1^-(\Theta,r)|$ $\phi(\lambda)$, and $\theta(\lambda)$. By overlaying the $r(\Theta)$ profile on the contour plot of $|a_1^-(\Theta,r)|$ on the same $\Theta$-r plane, the effect of the reflective element on the reflectance of the integrated microring resonator may be visualized.

In additional examples, configurations of wavelength-selective devices obtained by designing $r(\Theta)$ of the reflective element using the graphical solutions are described. These examples use an integrated microring resonator with the parameters $L_t=100\lambda_{e,0}$ and $\tau^2=0.9$, where $\lambda_{e,0}=\lambda_0/n_e$ is the effective design wavelength in the waveguide. The selection of the parameters is for specificity in describing the examples, so as to improve understanding of the details, and is not meant as a limitation.

Figure 11A:
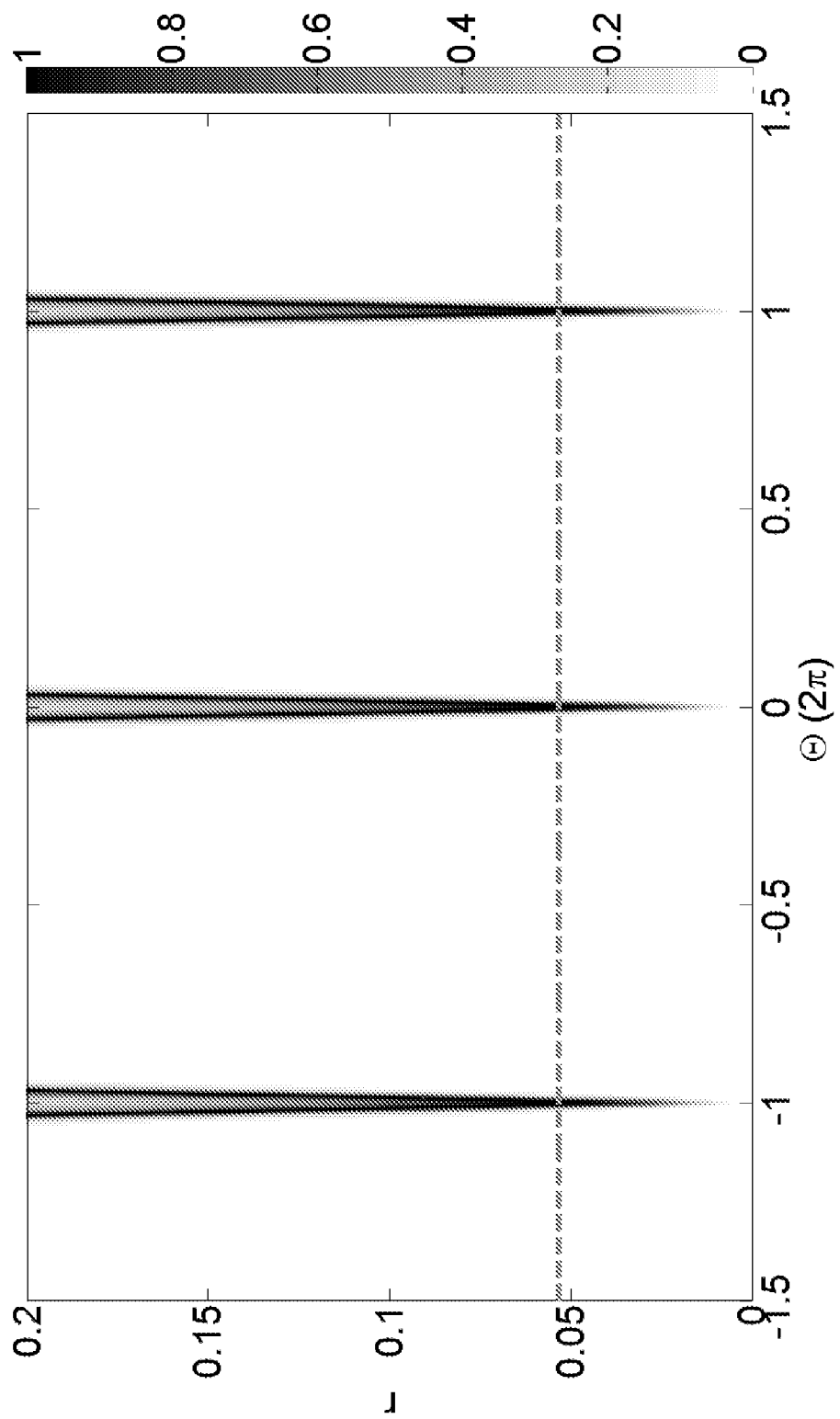

An ideal comb reflector has high reflectance peaks spaced periodically. From the periodicity of the $|a_1^-|^2$ contour plot, a comb reflector may be obtained by using a spectrally flat $r(\Theta)$. FIG. 11A shows this case. The dashed line represents the desired reflection profile of the reflective element $r(\Theta)$ overlaid on the contour plot, with a constant value of $r_c(0)=0.053$ for $\alpha^2=1$. The result is a periodic reflection spectrum from the microring with peaks at $\Theta=2m\pi$.

One of the physical candidates for the reflective element to achieve such a flat reflection profile is a low-reflectivity FP element. For a low-reflectivity FP element, the phase response is approximately a linear function of $\beta$ with the slope equal to its length d; by choosing L>>d, the reflection may be a constant value.

Consider a simple index-contrast FP element. The reflection from an index-constant FP element with length $L_s=d=\frac{1}{4}(\lambda_{e,0})$. is given by $$|S_{11}|^2 = \frac{4R_{int}\sin^2\beta d}{(1-R_{int})^2 + 4R_{int}\sin^2\beta d} \quad (12)$$

where $R_{int}=r_{int}^2$ is the reflection power from each interface. At the design wavelength, Eq. (12) can be expressed as:

$$r = \frac{2\sqrt{R_{int}}}{1+R_{int}} \quad (13)$$

The transmission coefficient of the FP element is given by:

$$S_{12} = \frac{(1-R_{int})e^{i\beta d}}{1-R_{int}e^{i2\beta d}} \quad (14)$$

From Eqs. (5) and (14), one may observe that $\phi(\beta)\approx\beta d$ for $R_{int}\ll 1$, which yields the partial derivative $$\frac{\partial\phi}{\partial\theta}\ll 1 \text{ since } d\ll L.$$

The reflection profile of the FP element may be modeled as a constant, $r(\Theta)\approx r_c(0)$, near the design wavelength. Since the phase response in the ring is approximately linear, one may choose $L_t$ to be an integer number of $\lambda_{e,0}$, which yields $\theta_0+\phi_0=200\pi$, in this example.

Figure 11B:
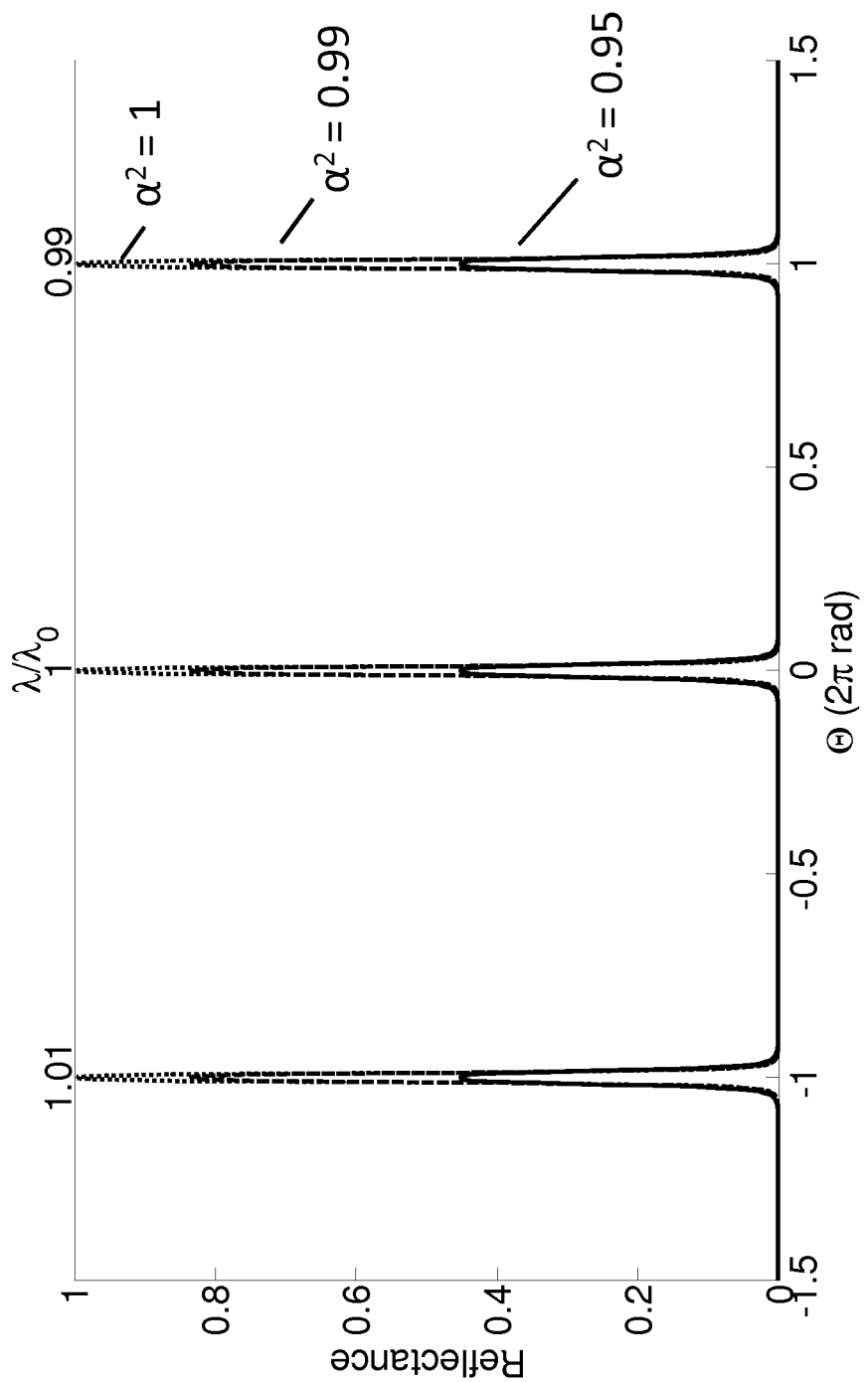

FIG. 11B shows the reflectance spectra of the FP-MRR for $\alpha^2=1$, 0.99, and 0.95. For each value of $\alpha^2$, the FP reflection is set to $r=r_c(0)=0.053$, 0.058, and 0.078 respectively. The peak reflection of each FP-MRR corresponds to $|a_{1c}^-|^2=1$, 0.83, and 0.45, respectively. Thus, the ring resonator amplifies the reflectance by A=360, 250, and 74, respectively.

For lossy cases, a decrease in $\tau$ results in an increase in the critical reflection coefficient $r_c(0)$ and the peak reflectance $|a_{1c}^-|^2$. However, the increase in $r_c(0)$ may require a higher value of $R_{int}$ from Eq. (13). A higher value of $R_{int}$ may cause deviation from the linear phase approximation of the FP element. The FWHM values of the reflection intensity of the FP-MRRs are obtained to be $(2.4\times10^{-4})\lambda_0$, $(2.6\times10^{-4})\lambda_0$, and $(3.2\times10^{-4})\lambda_0$ for $\alpha^2=1$, 0.99, and 0.95, respectively at the design wavelength. In comparison, the FWHM values of buildup field intensity of the identical microrings with no internal reflection, i.e., $r(\Theta)=0$, are calculated to be $(1.7\times10^{-4})\lambda_0$, $(1.8\times10^{-4})\lambda_0$, and $(2.5\times10^{-4})\lambda_0$ for the same set of $\alpha^2$ values.

The reflectance spectra of an FP-MRR resembles that of a SGDBR, but the FP-MRR may not exhibit side lobes. Furthermore, the FWHM may be determined by the micro-ring parameters $\alpha^2$ and $\tau^2$, allowing an additional degree of freedom in engineering the peak shape. Some of the performance differences with respect the SGDBR may be more compact dimensions, simpler architecture, faster filter roll-off and a reduced sensitivity to wafer scale variations due to reuse of the same FP reflector element.

A single-peak reflector element at the design wavelength may be designed by suppressing the reflection $r(\Theta)$ of the reflective element at the ring-resonant-wavelengths other than the design wavelength. That is, the reflective element whose reflection profile satisfies $$r(\Theta) = \begin{cases} 0 & \text{for } \Theta = 2m\pi, m\neq 0 \\ r_c(0) & \text{for } \Theta = 0. \end{cases} \quad (15)$$

In an index-contrast N-period Bragg grating as a reflective element, the total length of the grating is $L_s=L_g=N\Lambda\approx N\lambda_{e,0}/2$, where $\Lambda$ is the period of the grating. In the low reflectivity limit, $N\sqrt{R_{int}}<0.2$ and, neglecting multiple reflections in the grating, one may obtain the reflection coefficient $$|S_{11}| \approx 2N\sqrt{R_{int}}\left|\frac{\sin\Theta_g}{\Theta_g}\right| \quad (16)$$

where $\Theta_g=(\beta-\beta_0)L_g$ is the detuned phase shift in the grating. The transmission phase shift of the low-reflectivity grating is approximately a linear function $\phi(\beta)\approx\beta L_g$, from which one may obtain $\Theta\approx(\beta-\beta_0)L_t$. To satisfy Eq. (15), the grating contrast and the fraction of the ring occupied by the grating may be controlled.

$$p=\Theta_g/\Theta \quad (17)$$

is the ratio between the detuned phases of the grating to the entire microring. Then, $$0<p\approx\frac{L_g}{L+L_g}\leq 1. \quad (18)$$

Note that p is fixed for a given geometry of the structure. Eq. (16) may be written as $$r(\Theta) = 2N\sqrt{R_{int}}\left|\frac{\sin(p\Theta)}{p\Theta}\right| \quad (19)$$

And, imposing the first condition in Eq. (15) on Eq. (19) yields $\sin(p\Theta)=0$ for all $\Theta=2m\pi$, $m\neq 0$, so 2 mp$\pi$ should be an integer multiple of π. Therefore, from Eq. (18) possible choices for p in this example are p=½ or p=1. The corresponding grating lengths may be $$L_g = L = \frac{1}{2}L_t \text{ or } L_g = L_t, L = 0 \qquad (20)$$

Physically, the first case is where the grating occupies nominally half of the ring (FIG. 3A), and the second case is where the grating nominally occupies the entire ring (FIG. 3B). Exact values of p for a single wavelength reflector can be recalculated numerically if the assumptions above are not satisfied. Other values of p may be used in different applications.

Figure 12B:
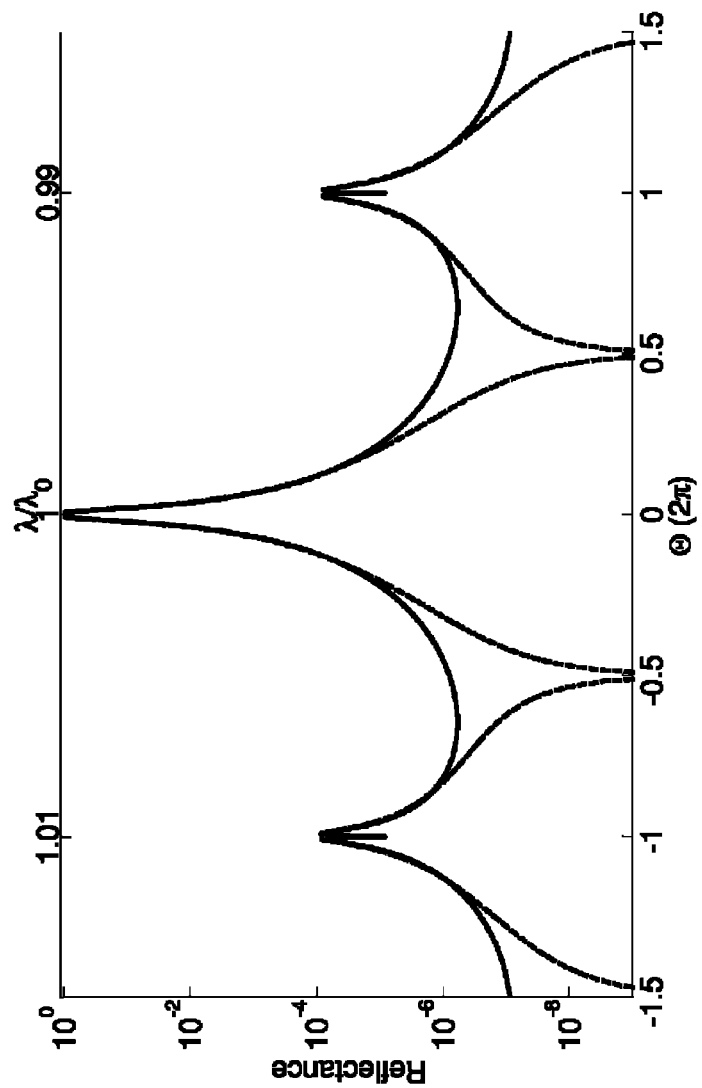

To meet the second condition in Eq. (15), the appropriate grating contrast to set $R_{int}$ and satisfy $2N\sqrt{R_{int}}=r_c(0)$ is chosen. The reflection profile for each case is overlaid on the contour plot in FIG. 12A. The full grating has nulls, i.e., r=0 at $\Theta=m\pi$ for all nonzero integers m where the half-ring has nulls at $\Theta=2$ mπ. FIG. 12(b) depicts the resultant reflectance spectra of the two DBR-MRRs for $\alpha^2=1$. It should be noted, however, that for the full DBR-MRR, the grating at the coupling region may cause some reflection and scattering.

There is competition between the field buildup due to resonance and decaying reflection from the grating near $\Theta=2m\pi$, m≠0. However, the overall microring reflection will approach zero as the grating reflection coefficient goes to zero, thus suppressing reflection at adjacent ring resonances. As a result, only a single peak at the design wavelength is observed.

The FWHM of the reflection intensity is $(2.4\times10^{-4})\lambda_0$ for both the half DBR-MRR and the full DBR-MRR at the design wavelength, for the lossless case. Compared to a continuous DBR, the DBR-MRR may possess advantages such as a more compact structure, suppression of side-mode ripples, the ability to design the FWHM from the microring parameters, faster filter roll-off and reduced sensitivity to wafer-scale variations.

If the interface reflectivities of the FP element are increased, it is possible to construct a narrow band-pass filter by employing a sharp phase change of the FP element near the resonance condition thereof. However, a highly reflective FP element with a single material interface may be somewhat difficult to fabricate; instead, one can employ high reflection DBRs to form a DBR etalon. A microring resonator integrated with a high reflection DBR etalon may be termed a DBR-E-MRR. In this regime, the phase response of the reflective element is no longer linear; that is, the approximation $\phi(\beta)\approx\beta L_s$ no longer holds.

Consider an integrated microring structure which includes two identical N-period DBRs on the left and right half of the ring and gaps of length d and L. Assume that d is an integer multiple of the grating period Λ. To make the analysis simpler, we re-define the DBR structure to be symmetric; that is, the last half-period portion at the bottom is excluded, as shown in FIG. 13.

The length of the new DBR is then $$\overline{L_g} = \left(N - \frac{1}{2}\right)\Lambda.$$

By doing so, an additional condition is imposed on $S_{11}=S_{22}$ in Eq. (2) and the grating scattering matrix is obtained.

$$S_g \begin{pmatrix} \pm r_g & it_g \\ it_g & \pm r_g \end{pmatrix} e^{i\phi_g} \qquad (21)$$

where $r_g$ and $t_g$ are the magnitude of reflection and transmission coefficients of the grating, and $\phi_g$ corresponds to the phase of the reflection coefficient. The + or − sign is taken when the last index of the DBR is high or low, respectively. Note that with the symmetric DBR definition, the length of the ring portion was $\overline{L}=L+\Lambda$ as shown in FIG. 13. We define $\theta=\beta\overline{L}$ and the transmission coefficient of the upper DBR-etalon structure of length $d+2\overline{L_g}$ becomes $$S_{12} = \frac{-t_g^2 e^{i2\phi_g} e^{i\beta d}}{1 - r_g^2 e^{i2\phi_g} e^{i2\beta d}} \qquad (22)$$

$$\angle S_{12} = \operatorname{atan}[\Gamma\tan(\beta d + \phi_g)] + \phi_g + \pi \qquad (23)$$

where $\Gamma = \frac{1 + r_g^2}{1 - r_g^2}$ and $r_g^2 + t_g^2 = 1$.

From Eq. (23), we obtain $$\beta d + \phi_g = \operatorname{atan}\left[\frac{1}{\Gamma}\tan(\phi - \phi_g)\right] \text{ where } \phi = \angle S_{12}.$$

The reflection power from the DBR-etalon is given by:

$$r(\phi - \phi_g) = \frac{2\sqrt{R_g}}{1 + R_g}|\sin(\phi - \phi_g)| \qquad (24)$$

which is the reflection profile of an integrated DBR-etalon structure.

The reflection profile is a function of the total detuned phase shift in the integrated ring $\Theta=(\theta-\theta_0)+(\phi-\phi_0)$ requires further analysis as the grating phase response $\phi_g$ is not linear. One may employ a numerical simulation such as the transfer matrix method to obtain the reflection profile r(Θ) of the DBR-etalon as a function of the total detuned phase.

FIG. 14 shows the response of a DBR-E-MRR under lossless conditions with $r_g^2=0.99$, d=L=0, and N=100 using a linear approximation.

FIG. 15 shows the transmission response of the device using the TMM. The FWHM of the isolated DBR etalon $\delta\Theta_{DBR-etalon}\approx 0.34\pi$ is reduced to $\delta\Theta_{DBR-E-R}\approx 0.016\pi$ by integrating the DBR etalon combination into a microring. To find the microring response as a function of λ, substitute $\Theta(\beta)=[(d+2L_e)\Gamma+2L_e+L+\Lambda)](\beta-\beta_0)$, and note that $\beta/\beta_0=\lambda_0/\lambda$, assuming dispersion is negligible, for simplicity. The slope $\partial\Theta/\partial\beta=4L_e/(1-R_g)+\Lambda$ can be large when the effective grating length $L_e$ is long or the reflection $R_g$ is large, and this yields a sharp response as a function of β or δΘ. For example, δΘ=0.016π corresponds $$\delta\lambda = \left|\frac{\partial\lambda}{\partial\beta}\frac{\partial\beta}{\partial\Theta}\delta\Theta\right| \approx \left(\frac{1-R_g}{4\beta_0 L_e}\right)\lambda_0 \approx (2.4\times10^{-6})\lambda_0$$

to in this particular case. The FWHM in wavelength decreases rapidly as $R_g \to >1$. The value of $R_g=0.99$ was chosen considering typical maximum reflectance values of planar DBRs.

When d=0, we get r=0 from Eq. (24) if $\phi_g=m\pi$ for any integer m. This corresponds to $\Theta=(\beta-\beta_0)\Lambda+2m\pi$ since $\phi_g(\beta_0)=0$. That is, for $$|(\beta-\beta_0)\Lambda| \ll \pi|, \text{ i.e., } \left|\frac{\beta}{\beta_0} - 1\right| \ll 1,$$

the first term in $\Theta$ becomes negligible, and therefore the DBR-etalon has a null at the adjacent ring resonances in addition to the null at $\lambda_0$.

If L is detuned to $L'=L+\Delta L$, we obtain $\theta'=\theta+\theta+(\beta-\beta_0)\Delta L$, which in turn shifts $\Theta'=\Theta+(\beta-\beta_0)\Delta L$; that is, increasing L shifts $r(\Theta)$ horizontally to the right and increases the slope $\partial\Theta'/\partial\beta=\partial\Theta/\partial\beta+\Delta L$ by a negligible amount. FIG. 16 depicts the spectral response of the micro-ring device under the lossless condition, $r_g^2=0.5$, and $\Delta L=0.011\lambda_{e,0}$. These values were chosen for the example so that the etalon reflection coefficient curve (dashed) is approximately tangent to the critical reflection curve $r_c$. This produces a spectrally wider high-reflectance band. Adjustments to the parameters can be made to reduce the ripple at the expense of a narrower high-reflectance band. Note that the null of the etalon reflection profile corresponds to the new "design" wavelength, which is at a different location than $\Theta=0$. By shifting the DBR-etalon reflection profile, a sharp transition mirror may be designed. In the lossless case, the reflectance varies from 100% to 0% over $\delta\lambda=(7.4\times10^{-5})\lambda_0$. A sharper transition can be obtained by increasing $|r_g|^2$ and decreasing $\Delta L$ at which may, however, result in a narrower high reflectance bandwidth, more ripple, and more stringent fabrication tolerances.

Among the properties of the disclosed DBR-MRR are: for fixed values of $\alpha$ and $\tau$, the maximum achievable reflectance is the same along a continuous curve in the $\Theta$-r plane; in the lossless case limit, 100% reflectance can be obtained with weak reflective elements; the FP-MRR can generate a periodic reflectance spectrum with peaks at the resonance wavelengths of the ring; the higher order grating DBR-MRR can generate a periodic reflectance spectrum with peaks at a select subset of the resonance wavelengths of the ring; the DBR-MRR with the grating occupying either half or all of the ring suppresses reflection at adjacent resonance wavelengths of the ring and thereby produces a single peak profile; and, the DBR-E-MRR reduces the FWHM of the DBR etalon and can be designed to function as either an narrow filter or a sharp transition mirror.

Integrating reflective elements into a ring resonator leads to structures that are generally more compact than their separate equivalents, have virtually no side mode ripple, and offer control of the reflection at adjacent resonance wavelengths of the ring and thereby produce a single peak profile. The DBR-E-MRR reduces the FWHM of the DBR etalon and can be designed to function as either a narrow filter or a sharp transition mirror.

Figure 3C:
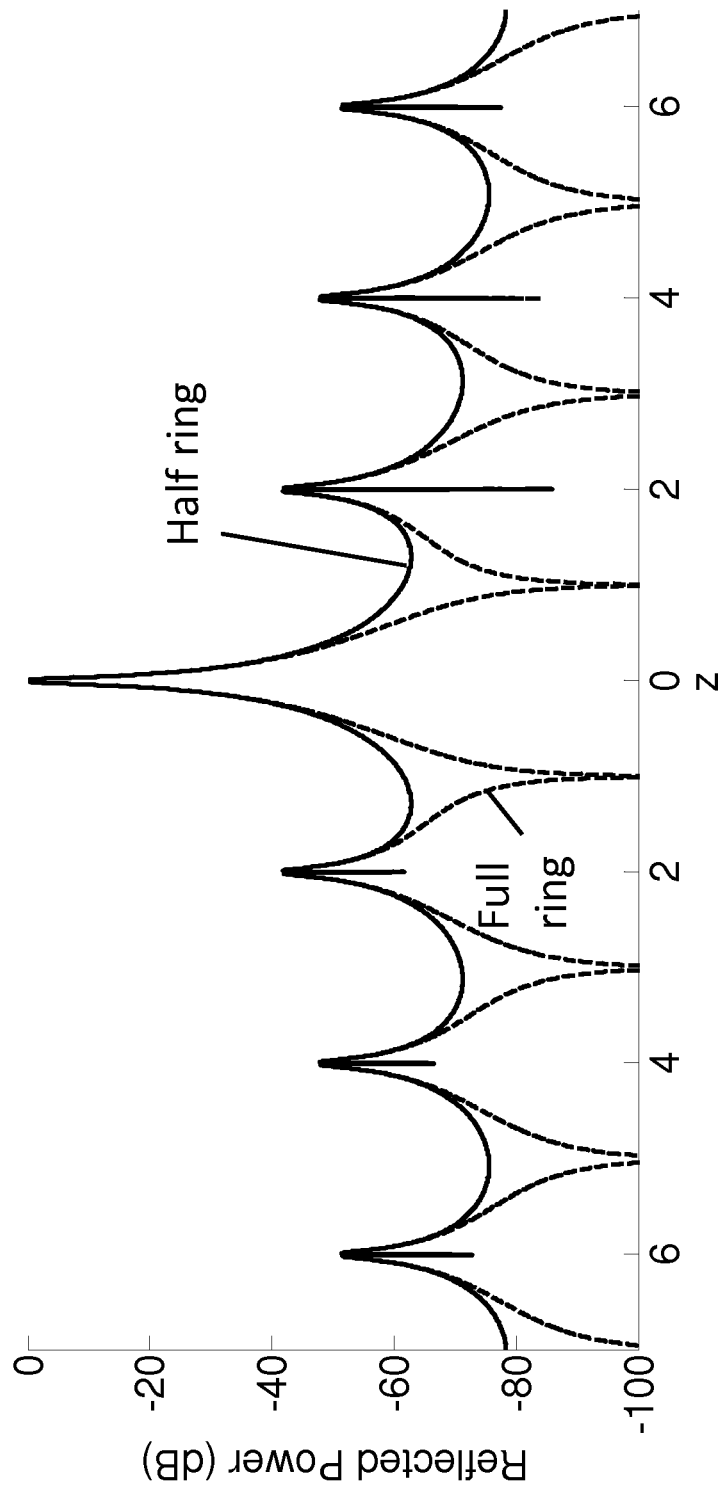

Achieving a high DBR-MRR reflectivity may need low propagation loss and control of dimensions during fabrication, in particular the waveguide width and the waveguide bus-to-ring gap. A multi-parameter sensitivity analysis of the half-ring DBR-MRR of FIG. 3 was performed using the graphical approach. To get $R_{max}>90\%$, the loss should be below 1.5 dB/cm. For a fixed loss of 1 dB/cm. and $R_{max}>90\%$, one can tolerate $0.87<\tau^2<0.92$: i.e., a gap of between about 34 and about 58 nm at 1550 nm. This tolerance can be achieved using E-beam or nano-imprint lithography (NIL). The structure maintains a nearly constant FWHM for parameters in this range.

A number of fabrication techniques may be considered. E-beam lithography is a low-throughput method, having high resolution and the flexibility to modify device dimensions each time the device is fabricated. Nano-imprint lithography is a higher-throughput method with sub-10 nm resolution and excellent large area uniformity. An instrument such as the Molecular Imprints (Austin, Tex.) Imprio 55 NIL may result in smooth sidewalls for high quality factor MRRs and accurate and repeatable $\tau$ and $\alpha$ values. During development, devices may be patterned so as to study the effect of design parameters on the performance DBR-MRRs. Once desirable layouts are produced, NIL masks may be produced so as to mass produce devices. Although NIL masks may not have the flexibility to modify the device dimensions without a new mask, the waveguide index or height may be modified instead.

Figure 17A:
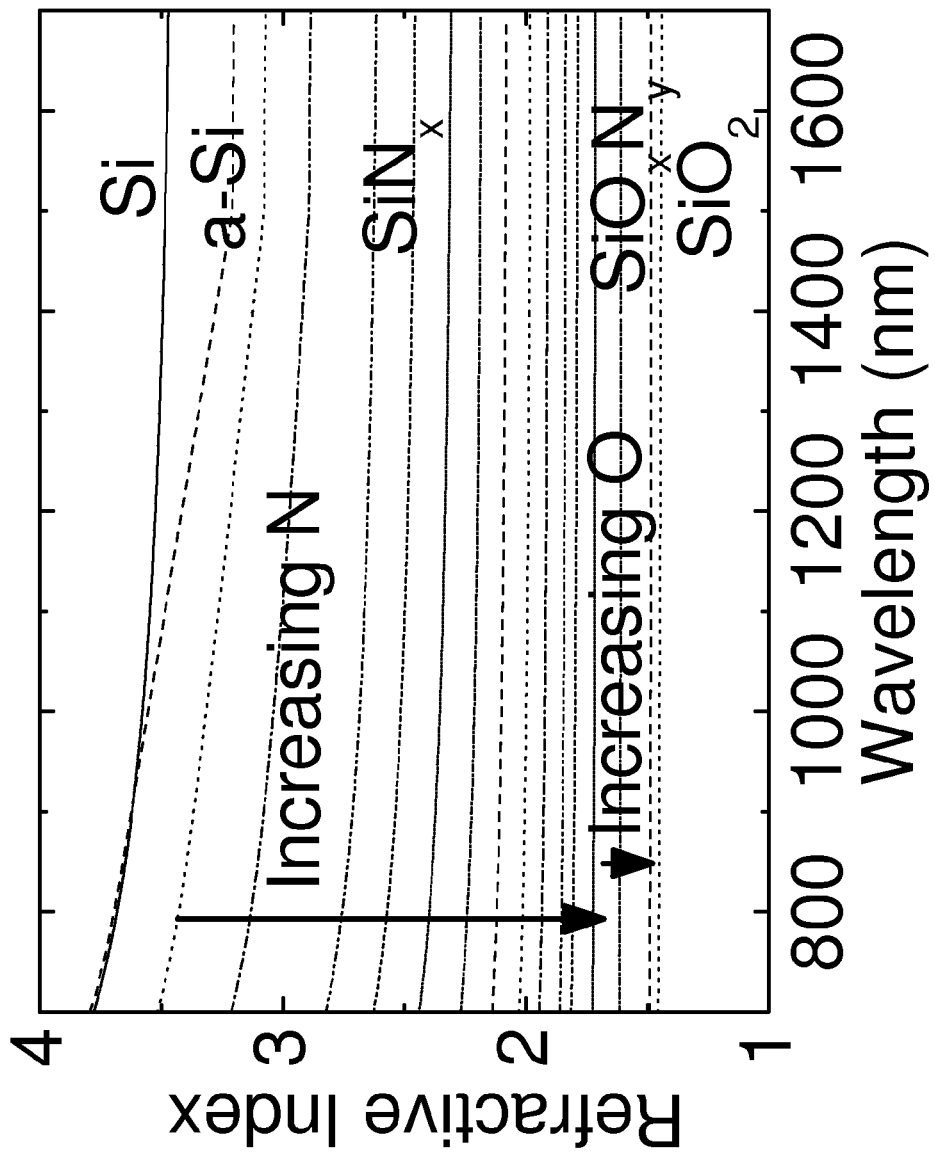
Figure 17B:
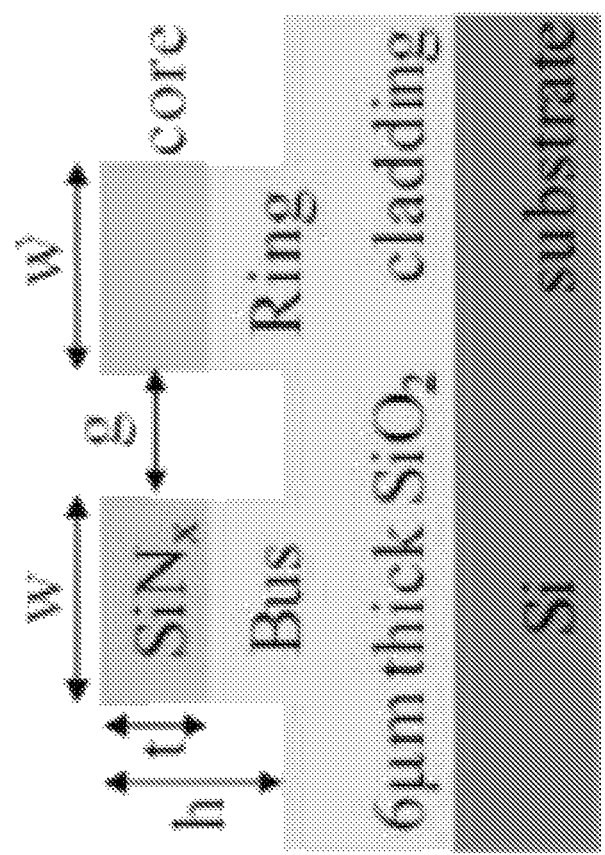

We have developed processes to deposit non-porous dielectric films of amorphous Si (a-Si), SiNx and SiOxNy with arbitrary refractive index from about 1.45 to about 3.3 and low loss at $\lambda_0=1550$ nm. The refractive index profile is shown in FIG. 17A. With the dimensions defined on the master NIL mask, one can control waveguide properties, e.g., $\beta$ and $\tau$, by adjusting the optical mode shape using the core material composition and height as control variables. The ability to control index permits achieving specific design wavelengths. Since the index may be continuously graded, post process trimming may be performed by depositing a thin (<50 nm) blanket cladding of arbitrary index to adjust $\beta$. FIG. 17B is a side view of a possible DBR-MRR structure. On Si wafers with a 6 µm thick thermal oxide layer (available from Rogue Valley Microdevices, Medford, Oreg.), a SiNx core with a constant or graded composition could be deposited using plasma enhanced chemical vapor deposition (PECVD). The ridge for the bus and ring and the apodized DBR could then be patterned with NIL and etched deep into the $SiO_2$ bottom cladding in a single self aligned processing step.

Table 1 shows nominal dimensions for a single-mode low-loss half-ring grating (N=M). The table includes results from full 3D mode calculations with PML in COMSOL (COMSOL Multiphysics, Burlington, Mass.), using measured ellipsometry data, which includes refractive index dispersion and absorption. The choice of SiNx rather than Si as the core reduces absorptive loss across the 900-1700 nm wavelength window. Note that Si and other semiconductor materials and various dielectric materials may serve as the core layer or the cladding and are not intended to be excluded by this specific example. Core thickness and index contrast to $SiO_2$ are parameters that may be controlled so as to keep the substrate leakage loss low.

TABLE 1

DBR-MRR parameters

| | $\lambda_0$ | $n_{core}$ | t | h |
|---|---|---|---|---|
| Ring/Bus Design | 1.55 µm | 2 | 400 nm | 1 µm |

| | N | w | $\Delta w$ (apodization) | |
|---|---|---|---|---|
| DBR Design | 200 | 1 µm | 50 nm | |

| | M | g | Avg. radius | |
|---|---|---|---|---|
| Ring Design | 200 | 125 nm | 30.6 µm | |

| | $n_{mode}$ | Loss | $Q_{ring\ only}$ | $\alpha_r$ |
|---|---|---|---|---|
| Calculated | 1.7 | 2 dB/cm | 150000 | ~1 |

| | $\kappa^2$ | $\Delta n$ | $|r_{DBR}|^2$ | $R(\lambda_0)$ |
|---|---|---|---|---|
| Calculated | 0.27 | $4\times10^{-3}$ | 2.10% | ~92% |

Passive DBR-MRRs may serve as laser cavity mirrors when coupled to, or integrated with, active devices. Two examples of such coupling are: quantum well intermixing (QWI) (FIG. 18A) and vertical coupling with a taper (see FIGS. 18B, C and D). QWI is a self aligned process so active-passive coupling loss is negligible; however, the propagation loss depends on the quality of intermixing. Horizontally tapering the waveguide to increase vertical mode size and achieve low-loss coupling to a purely passive waveguide may also be used.

Figure 18D:
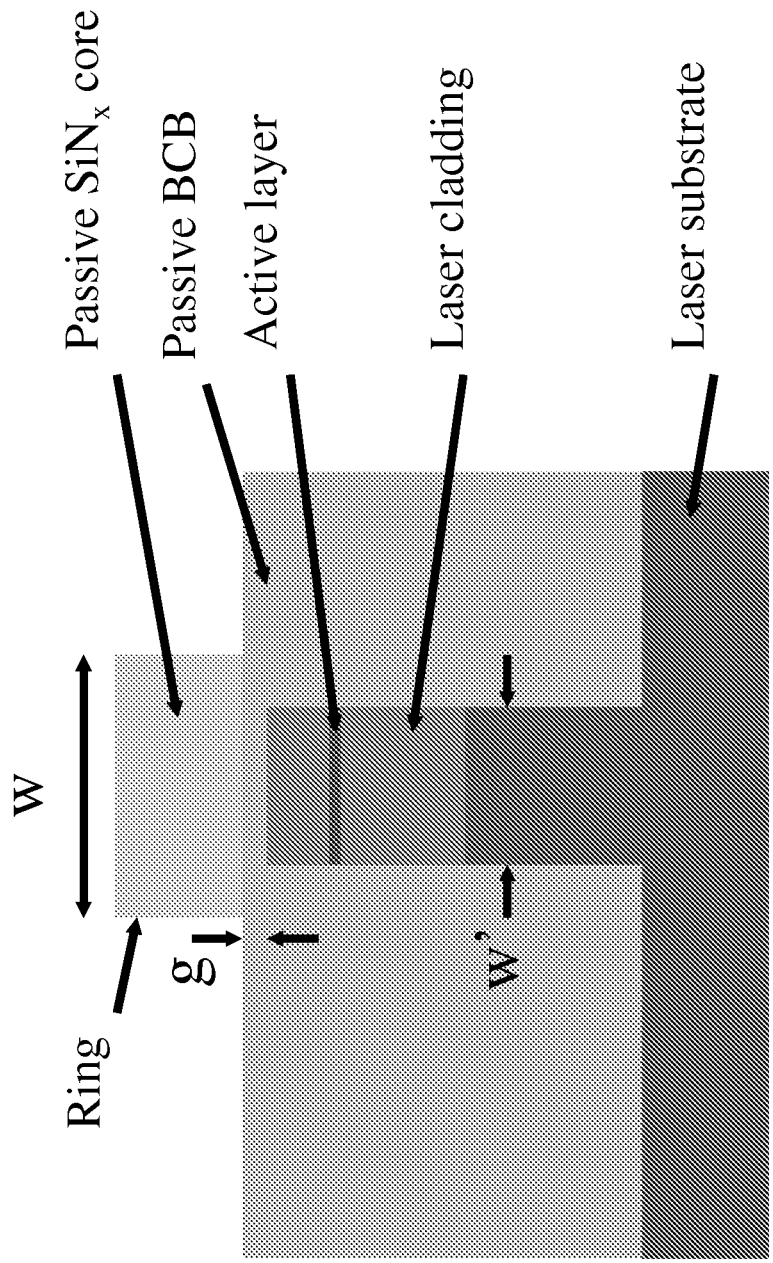

In FIGS. 18B and C, the active and passive waveguides are made of a semiconductor material and are grown on top of each other whereby the passive waveguide can be made to be passive by not including a quantum well in its layer structure. In FIG. 18D, the passive waveguide is made by depositing a dielectric material on top of the semiconductor gain region. A thick bottom cladding may be used to reduce substrate leakage loss. Additional active-passive integration schemes may include, for example, selective area regrowth or etching away the active region and depositing passive dielectric for butt-joint coupling. InGaAs QWs may be used at 980 nm for the active material. Operation at other wavelengths is also possible by using different semiconductor active region materials and suitable substrates. See "Method of plasma etching Ga-based compound semiconductors," (US PgPub 2010/0159706) which is incorporated herein by reference, which yields highly repeatable, very smooth, anisotropic etch processes for Gallium based semiconductors at high, low, and ultra-low etch rates (for example, 450, 17, and 2 nm/min). The sidewall verticality was 90°±2° and etched surface roughness was comparable to as-grown epi-wafers, e.g. <0.3 nm RMS over a 100 μm$^2$ area. The control of etched features is expected to be several nanometers in all 3 dimensions. FIG. 19 shows preliminary results for an apodized grating on a piece of GaAs.

In an aspect, these concepts may be embodied in fiber optic components and devices using such components. For example a fiber Bragg grating FBG 150 may be fusion spliced to a low loss 10%:90% optical coupler 110 with optical fiber connections 130, as shown in FIG. 20. The resulting device would be the fiber-based equivalent of the previously described DBR-MRR with κ$^2$=0.1. Although the figure shows the splice 120 being formed at a diameter of the loop and the loop being circular, these features are not be considered as limitations on the scope claimed herein.

Substituting a chirped FBG or long-period Bragg grating (LPG) or forming an etalon inside the fiber ring resonator would permit a variety of devices to be designed and constructed for purposes of, for example, chromatic dispersion compensation, pulse compression/stretching, or increasing the sensitivity of existing linear FBG based temperature or stress sensors. Typical fiber based devices may have lower losses than the semiconductor/dielectric planar devices, and fiber devices may have a larger diameter ring thereby resulting in a narrower FSR and narrower FWHM bandwidth. The half ring and full ring DBR-MRR configuration may select a single wavelength for reflection from the large number of resonant modes which are a result of the larger diameter fiber ring.

The DBR-MRR half and full ring designs select a single wavelength for reflection when the DBR is a first order grating (i.e. $\Lambda=\lambda_0/2n$) and the grating refractive index perturbation is sinusoidal. When the grating refractive index perturbation approximates a rectangular function, the grating contains higher order harmonic frequencies and $\lambda_0$, $\lambda_0/3$, $\lambda_0/5$, ... may also be reflected by the DBR-MRR; however, the higher order harmonics are often so far outside the bandwidth of interest that they can be ignored in a design, e.g. $\lambda_0/3$=500 nm for $\lambda_0$=1500 nm and most lasers would only tune for a 100 nm bandwidth or less and thus not encounter the other resonance reflection wavelengths (see FIG. 21).

When a higher-order grating with a rectangular refractive index perturbation is used, a comb of reflection peaks is obtained. In this circumstance, a subset of all of the microring resonances may experience high reflection. In an example, 210=2×3×5×7 may be chosen as the azimuthal order so that a wide variety of grating orders can be obtained, e.g. 1$^{st}$, 3$^{rd}$, 5$^{th}$, 7$^{th}$, 15$^{th}$, 21$^{st}$, 35$^{th}$, and 105$^{th}$, for both the full and half ring cases without changing the device dimensions. The free spectral range (FSR) of the microring without the grating is denoted as FSR$_0$. When the grating order is N, the comb has a reflection every at every 420/N resonance. That is, for the 105$^{th}$ order grating, the reflection peaks occur every 4$^{th}$ resonance (the comb has FSR=4 FSR$_0$); for the 35$^{th}$ order grating, the reflection peaks occur every 12$^{th}$ resonance (comb FSR=12 FSR$_0$), ... and for the 1$^{st}$ order rectangular grating, they occur every 420$^{th}$ resonance. Some examples are shown in FIG. 21. Other multiples of the comb FSR may be obtained with other choices of the azimuthal order and the grating order.

In yet another example, a DBR-MRR was, designed, fabricated and tested. A half-ring DBR was is created by modulating the width of the ring waveguide. The device was designed for a 400 nm thick Si$_3$N$_4$ waveguide core and SiO$_2$ bottom and top claddings. The bus and ring waveguide widths were chosen to be 1 μm to achieve a single mode waveguide. The ring radius was determined using 2D finite elements method simulation which uses rotationally symmetric geometry of the ring resonator. At a resonant wavelength of 1550 nm for a quasi-transverse-electric (TE) mode of azimuthal order 200 (a mode with 200 field oscillations along the circumference), the inner radius of the ring is set to 30.16 μm. The DBR was realized by removing 50 nm×50 nm pieces from the inward side of the ring waveguide, yielding a duty cycle of about 10%.

A small duty cycle was selected to get a low power reflectivity of R=1.9% from the 200 DBR periods that occupy the top half of the ring. The resultant angular period of the grating is $\Phi_0$=0.9°. Critical coupling requires bus to ring coupling coefficient of κ=0.5 which corresponds to a bus to ring gap of 125 nm.

To find the DBR reflectivity, a hybrid method that combines cylindrical coordinates coupled mode formulation and 2D FEM simulations was used. The small indentations of the waveguide are treated as a perturbation to the ring which couples the modes together. The electromagnetic fields inside the ring are approximated by a linear combination of the two unperturbed modes of the isolated ring with coefficients of the linear combination being functions of the azimuthal angle φ (in plane angle from the center of the ring). These coefficients satisfy a system of two coupled first order differential equations, which can be obtained using the fields of the resonance modes of the isolated ring and the geometrical parameters of the indentation. The two differential equations were solved to find the coefficients in the linear combination. Using these solutions and the coupling matrix of the bus coupler, the total reflectivity of the ring is obtained.

The device was fabricated on a silicon wafer with a 3 μm thick grown SiO$_2$ layer. A 400 nm thick low pressure chemical vapor deposition (LPCVD) stoichiometric Si$_3$N$_4$ core was deposited on the grown oxide. The device pattern was written using e-beam lithography and was transferred from the e-beam resist to the Si$_3$N$_4$ layer using reactive ion etching (RIE) with Freon gases. A 1.3 μm thick SiO$_2$ upper cladding was deposited using plasma enhanced chemical vapor deposition (PECVD). After cleaving the device, a 300 nm thick PECVD $SiO_2$ layer was deposited on the waveguide facets as anti-reflection coating. FIG. 22B shows a scanning electron microscope (SEM) image of the fabricated device prior to top cladding deposition. A close up view of the portion inside the small rectangle shown in FIG. 22B is presented in FIG. 22C. The small indentations on the inside of the ring waveguide can be seen in this figure and in FIG. 22D which is an angled view of the same structure.

Testing was performed by coupling polarized light from a tunable laser into and out of the bus waveguide using optical tapered fibers. The bus waveguide width was tapered from 1 μm to 3 μm near the facet to increase the fiber coupling efficiency. The reflected light was measured using a fiber circulator.

Ring resonators with and without the DBR were tested. Plain rings had an unloaded Q of $1.56 \times 10^5$. The reflection and transmission spectra of a reflective ring are illustrated in FIG. 23. A reflection peak of −9 dB accompanied by a transmission dip of −24.5 dB can be observed around 1549.9 nm. This reflection peak is about 7.8 dB larger than the peaks at adjacent ring resonances. The reflectivity is suppressed at nearby resonances because the DBR length is half the ring circumference, and as mentioned before, the nulls are located at the other ring resonance wavelengths. There is, however, some reflection due to ring waveguide sidewall roughness which causes smaller reflection peaks at these ring resonances.

Figure 23B:
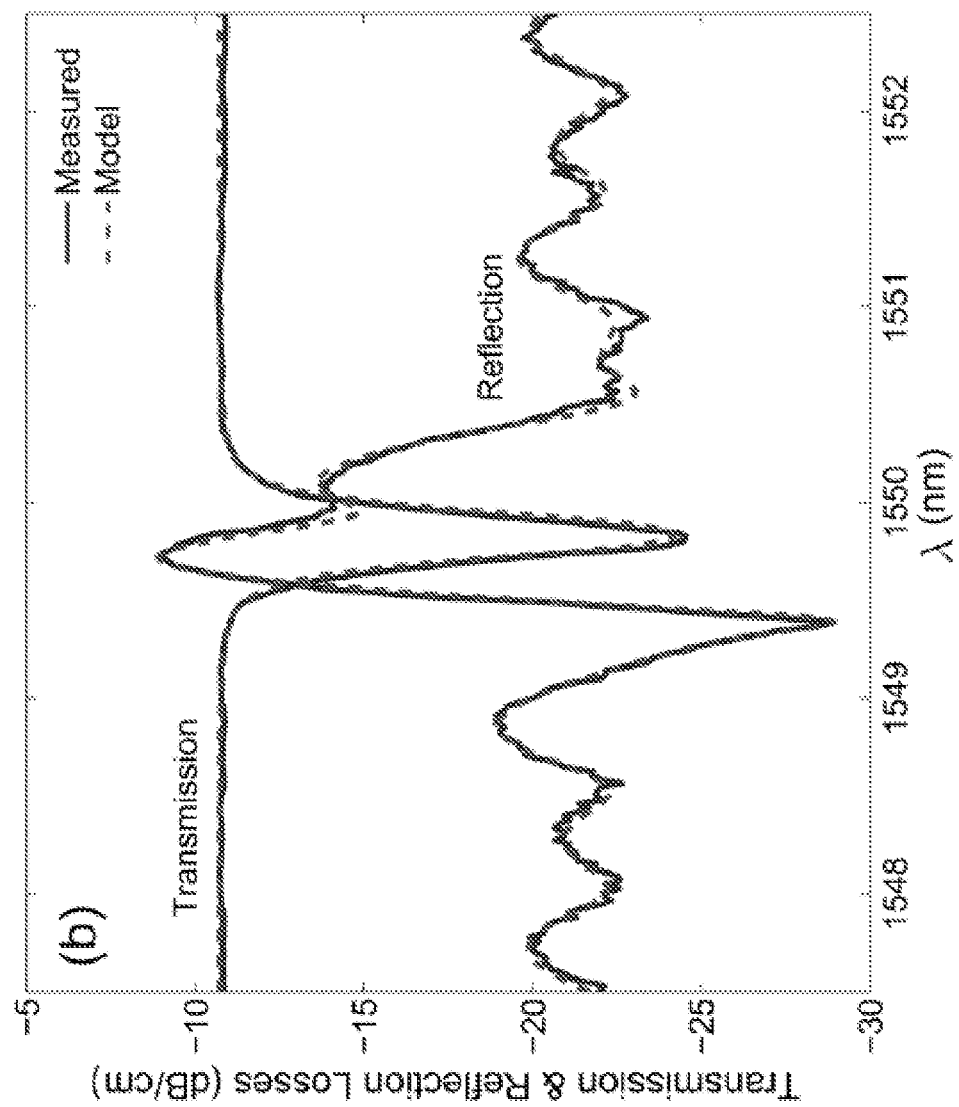

FIG. 23B shows a zoomed in view of the transmission and reflection spectra of the main resonance. In general, coupling of the modes causes separation of the two transmission dips (resonance splitting). When the coupling coefficient κ is greater than or equal to a critical coupling value, the splitting may be small enough that the overall transmission/reflection spectrum shows a single dip/peak. The deep single transmission dip shown in FIG. 23B signifies the critical coupling of the ring. The observed asymmetry in the reflection peak spectrum is believed to be caused by interference of the light reflected by the ring and by the first waveguide facet. The measured reflection loss of −9 dB is believed to be mainly due to the fiber coupling and decoupling losses. To account for the effects of reflection from the facets and fiber coupling losses, simulated reflection and transmission spectra of a model were fit to the measured data. The model includes the reflective ring and bus waveguide segments on each side of the ring. Coupling to the fibers is modeled by two two-port scattering matrices. The reflection and transmission spectra of the reflective ring were calculated using a model which has been previously described.

The parameters of the ring resonator, DBR, facet reflectivities, and waveguides propagation loss and lengths were chosen such that the simulated reflection and transmission spectra both fit to those of the measured device. The fitted results of the model were overlaid on the measured results in FIG. 23B. The model response is in good agreement with the measured results, allowing extraction of device performance parameters. The bus waveguide to ring coupling coefficient of κ=0.52, waveguide loss of 2.3 dB/cm, and DBR peak power reflectivity of R=2.1% were found in this way. The DBR reflectivity is in good agreement with the cylindrical coordinate coupled mode theory result which predicts R=1.9%. The slight difference is probably due to fabrication error. The reflection and transmission spectra of the ring are also found using this method and are shown in FIG. 24. The device shows a maximum reflectivity of −0.34 dB corresponding to 92.3% power reflectivity. The FWHM of the reflection peak is 0.4 nm. The simulated reflection and transmission spectra of a conventional linear DBR with the same peak reflectivity and FWHM are also shown in FIG. 24.

The equivalent DBR length was 4.3 mm. The same waveguide propagation loss of 2.3 dB/cm was assumed in the linear DBR simulation. The about 1 dB out of band transmission loss of the linear DBR is a result of the substantially greater length of the linear DBR.

The half-ring DBR-MRR is 70 times smaller in length, has a faster amplitude roll-off with wavelength, and no side modes when compared to the conventional DBR. The smooth narrow band high reflectivity peak at a single wavelength and small device size make the half ring DBR attractive as an in-line mirror for low threshold narrow linewidth laser diodes. The smaller footprint saves real estate and reduces tuning power compared to the conventional DBRs. The methods disclosed herein may be provided, at least in part, as a computer program product that may be embodied on a machine-readable medium having stored thereon instructions which may be used to cause a computer (or other electronic device) to perform the methods. For the purposes of this specification, the terms "machine-readable medium" shall be taken to include any medium that is capable of storing or encoding a sequence of instructions or data for execution by a computing machine or special-purpose hardware and that cause the machine or special purpose hardware to perform any one of the methodologies or functions described. The term "machine-readable medium" shall accordingly be taken include, but not be limited to, solid-state memories, optical and magnetic disks, magnetic memories, and optical memories. Machine readable media are understood to be non-transient storage devices.

Although the present invention has been explained by way of the embodiments described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A device, comprising:
   an optical ring waveguide having a grating along at least a portion thereof, and
   an optical waveguide coupled to the optical ring waveguide,
   wherein at least one of a reflection spectrum or a transmission spectrum of the device is determined by a circumference of the optical ring waveguide and at least one of a reflection spectrum or a transmission spectrum of the grating.

2. The device of claim 1, wherein the optical ring waveguide has an optically active portion.

3. The device of claim 1, wherein the optical ring waveguide is coupled to an active optical device.

4. The device of claim 1, further comprising an active optical device inserted in the optical ring waveguide.

5. The device of claim 4, wherein the active optical device is a semiconductor device.

6. The device of claim 3, wherein the active optical device is coupled to the optical ring waveguide by insertion in the optical waveguide.

7. The device of claim 1, wherein the circumference of the ring is an integral multiple of a refractive index periodicity of the grating.

8. The device of claim 1, further comprising an etalon inserted in the ring.

9. The device of claim 8, wherein the etalon is a Fabry-Perot interferometer.

10. The device of claim 1, wherein the grating is formed by a plurality of spaced regions having at least one of a higher or a lower refractive index when compared with the refractive index of the optical ring waveguide.

11. The device of claim 1, wherein the grating is formed by a plurality of perturbations spaced apart along a circumference of optical ring waveguide.

12. The device of claim 11, where the spacing between the perturbations is uniform.

13. The device of claim 11, wherein the spacing between the perturbations is selected to result in a Bragg grating.

14. The device of claim 11, wherein the spacing between the perturbations is selected to result in a chirped grating.

15. The device of claim 1, wherein the optical ring waveguide is a circle shape.

16. The device of claim 1, wherein the optical ring waveguide is a racetrack shape.

17. The device of claim 1, wherein a radius of curvature of the optical ring waveguide is large with respect to a design wavelength.

18. The device of claim 1, wherein the optical ring waveguide has a transverse dimension suitable for single-mode optical transmission at a design wavelength.

19. The device of claim 1, wherein the grating extends over half of the circumference of the optical ring waveguide.

20. The device of claim 1, wherein the grating extends over the circumference of the optical ring waveguide.

21. An add-drop multiplexer, comprising:
   an optical ring waveguide having a grating along at least a portion thereof;
   a first optical waveguide coupled to the optical ring waveguide; and
   a second optical waveguide coupled to the optical ring waveguide,
   wherein an add-drop wavelength is determined by a diameter of the optical ring waveguide and a period of the grating.

22. The add-drop multiplexer of claim 21, wherein an etalon is formed in the optical ring waveguide.

23. The add-drop multiplexer of claim 21, wherein the grating has a length equal to one of half of or the full length of the optical ring waveguide.

* * * * *